(12) United States Patent
Hill

(10) Patent No.: US 6,512,588 B1
(45) Date of Patent: Jan. 28, 2003

(54) METHOD AND SYSTEM FOR CORRECTING AN INTERFEROMETRIC ANGLE MEASUREMENT FOR THE EFFECTS OF DISPERSION

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 10/101,232

(22) Filed: Mar. 19, 2002

Related U.S. Application Data

(62) Division of application No. 10/009,012, filed as application No. PCT/US00/12097 on May 5, 2000.

(51) Int. Cl.[7] .................................................. G01B 9/02
(52) U.S. Cl. ..................... 356/510; 356/485; 356/486; 356/517
(58) Field of Search ................................. 356/485, 486, 356/487, 496, 498, 500, 508, 510, 517

(56) References Cited

U.S. PATENT DOCUMENTS

| | | | |
|---|---|---|---|
| 4,662,750 A | 5/1987 | Barger | |
| 4,711,573 A | 12/1987 | Wijntjes et al. | |
| 4,714,339 A | 12/1987 | Lau et al. | |
| 4,790,651 A | 12/1988 | Brown et al. | |
| 4,802,765 A | 2/1989 | Young et al. | |
| 5,404,222 A | * 4/1995 | Lis | 356/517 |
| 5,408,318 A | 4/1995 | Slater | |
| 5,491,550 A | 2/1996 | Dabbs | |
| 5,757,160 A | 5/1998 | Kreuzer | |
| 5,781,277 A | 7/1998 | Iwamoto | |
| 5,838,485 A | * 11/1998 | de Groot et al. | 356/517 |
| 6,040,096 A | 3/2000 | Kakizaki et al. | |
| 6,271,923 B1 | 8/2001 | Hill | |
| 6,330,105 B1 | 12/2001 | Rozelle et al. | |

OTHER PUBLICATIONS

Bennett, S.J., "A Double–passed Michelson Interferometer," *Optics Communicaitons*, 4:428–430, Feb./Mar. 1972.

* cited by examiner

*Primary Examiner*—Samuel A. Turner
(74) *Attorney, Agent, or Firm*—Fish & Richardson P.C.

(57) ABSTRACT

A method and system for correcting an angle $\theta_l$ indicative of a relative angular orientation of a measurement object for the effects of dispersion caused by gas along a measurement path contacting the measurement object, wherein the angle $\theta_l$ is measured interferometrically at a wavelength $\lambda_l$, the method and system including: (i) interferometrically measuring the angular orientation at a first wavelength $\lambda_q$ to give a first angle $\theta_q$ indicative of the angular orientation (ii) interferometrically measuring the angular orientation at a second wavelength $\lambda_u$ not equal to the first wavelength $\lambda_q$ to give a second angle $\theta_u$ indicative of the angular orientation; and (iii) correcting the angle $\theta_l$ by an additive factor $\Delta\theta_l = -\Gamma(\theta_q - \theta_u)$, wherein $\Gamma = (n_l - 1)/(n_q - n_u)$ is the reciprocal dispersive power of the gas and $n_l$, $n_q$, and $n_u$ are the indices of refraction of the gas at wavelengths $\lambda_l$, $\lambda_q$, and $\lambda_u$, respectively.

11 Claims, 28 Drawing Sheets

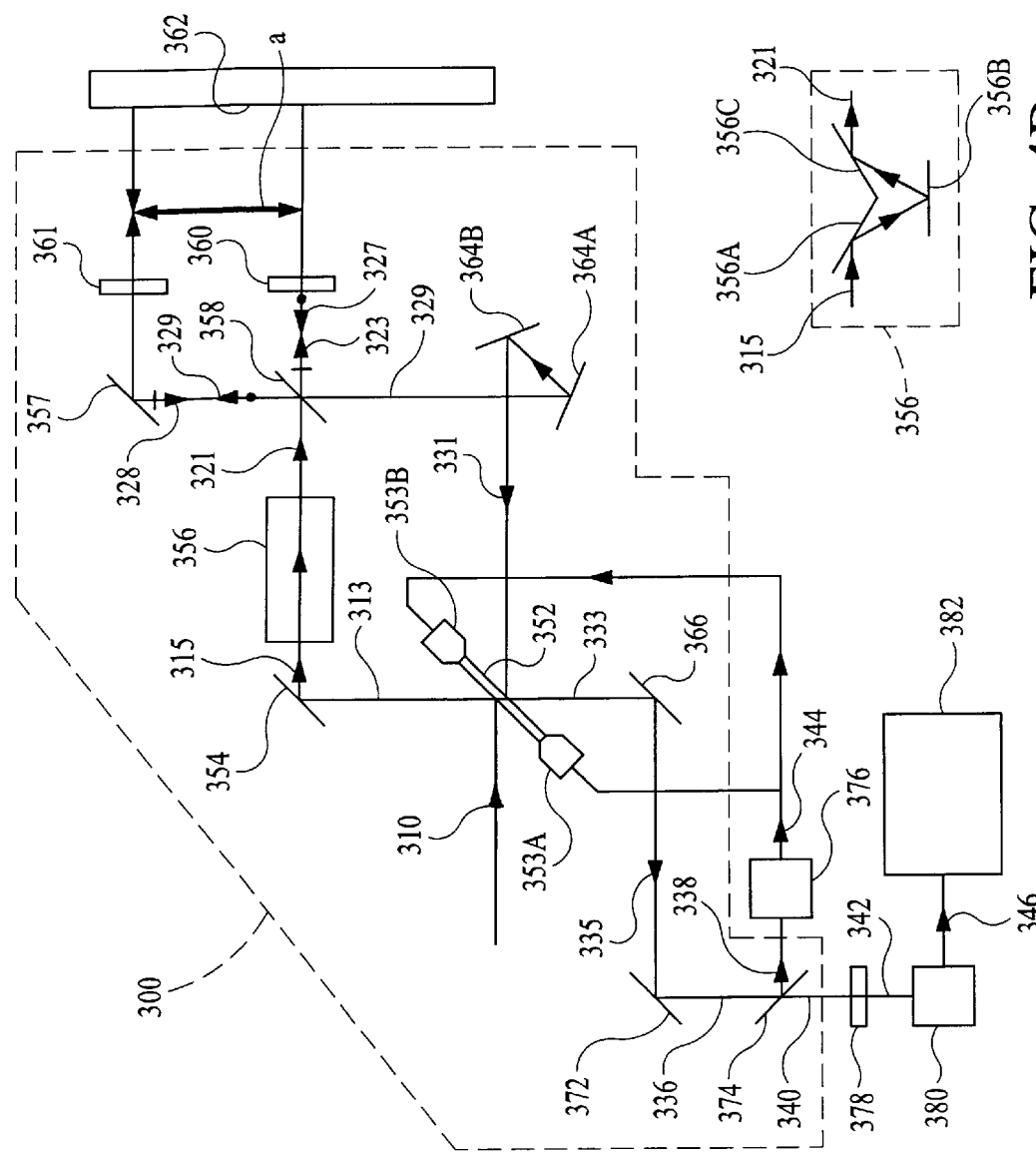

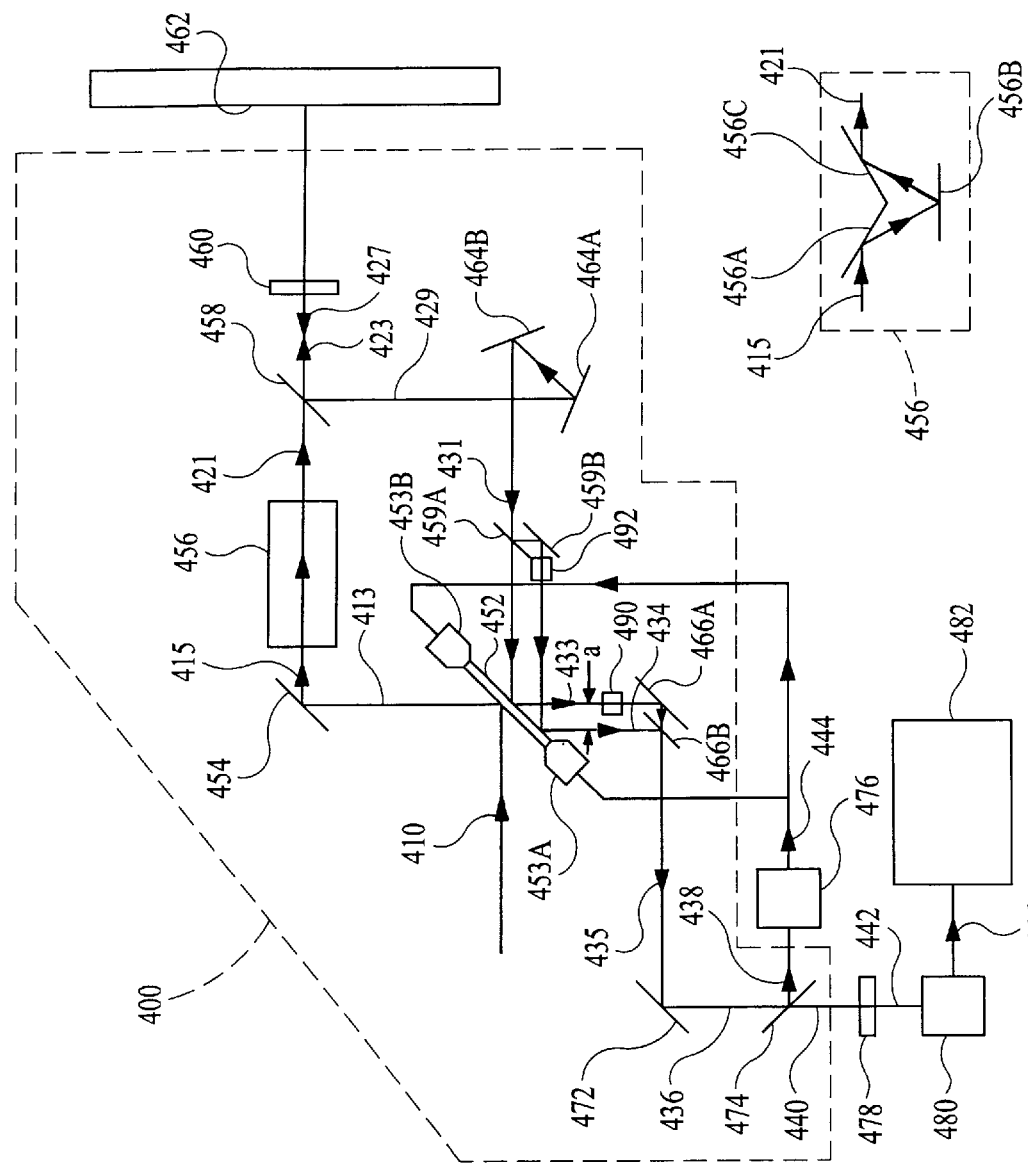

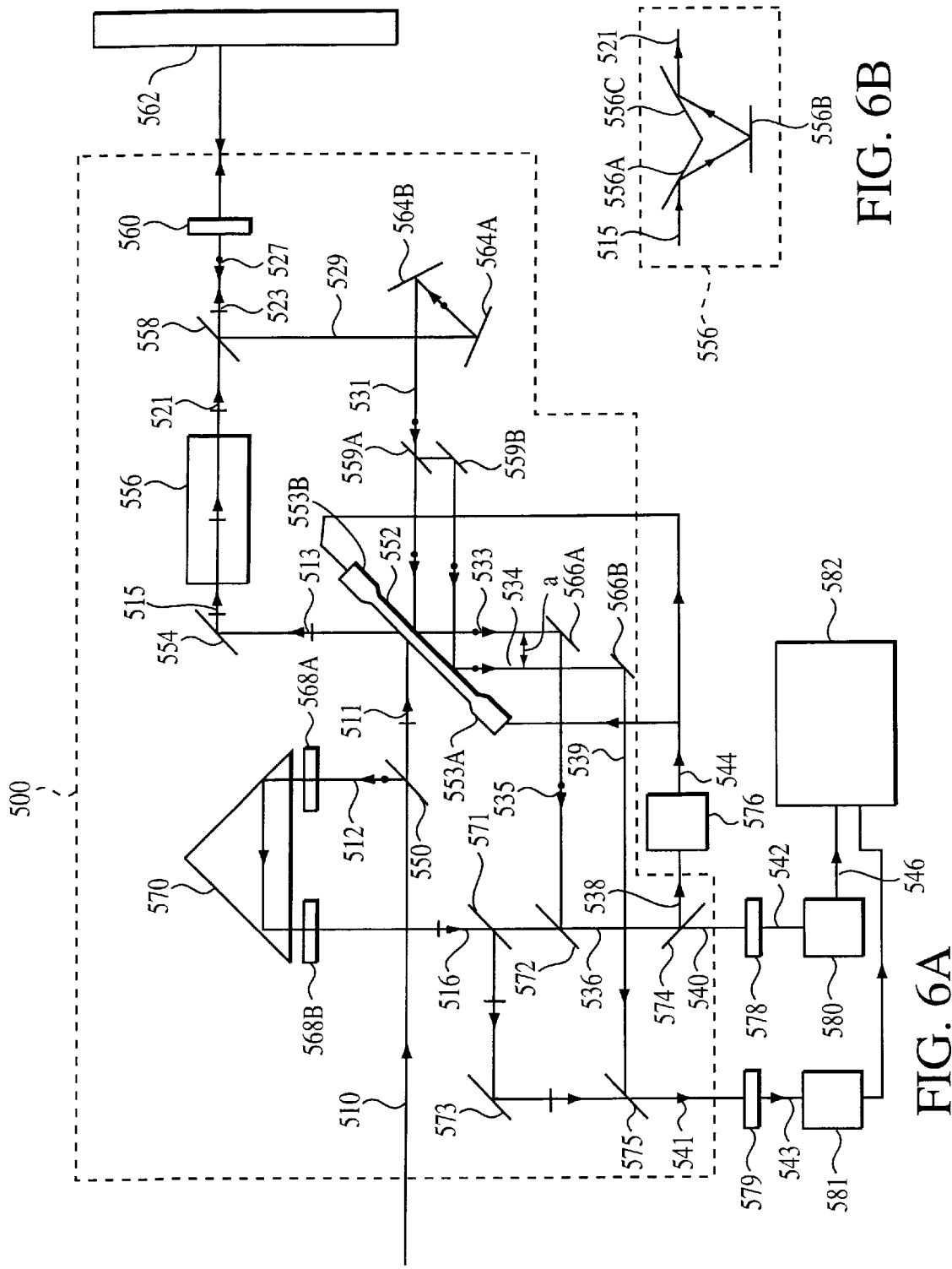

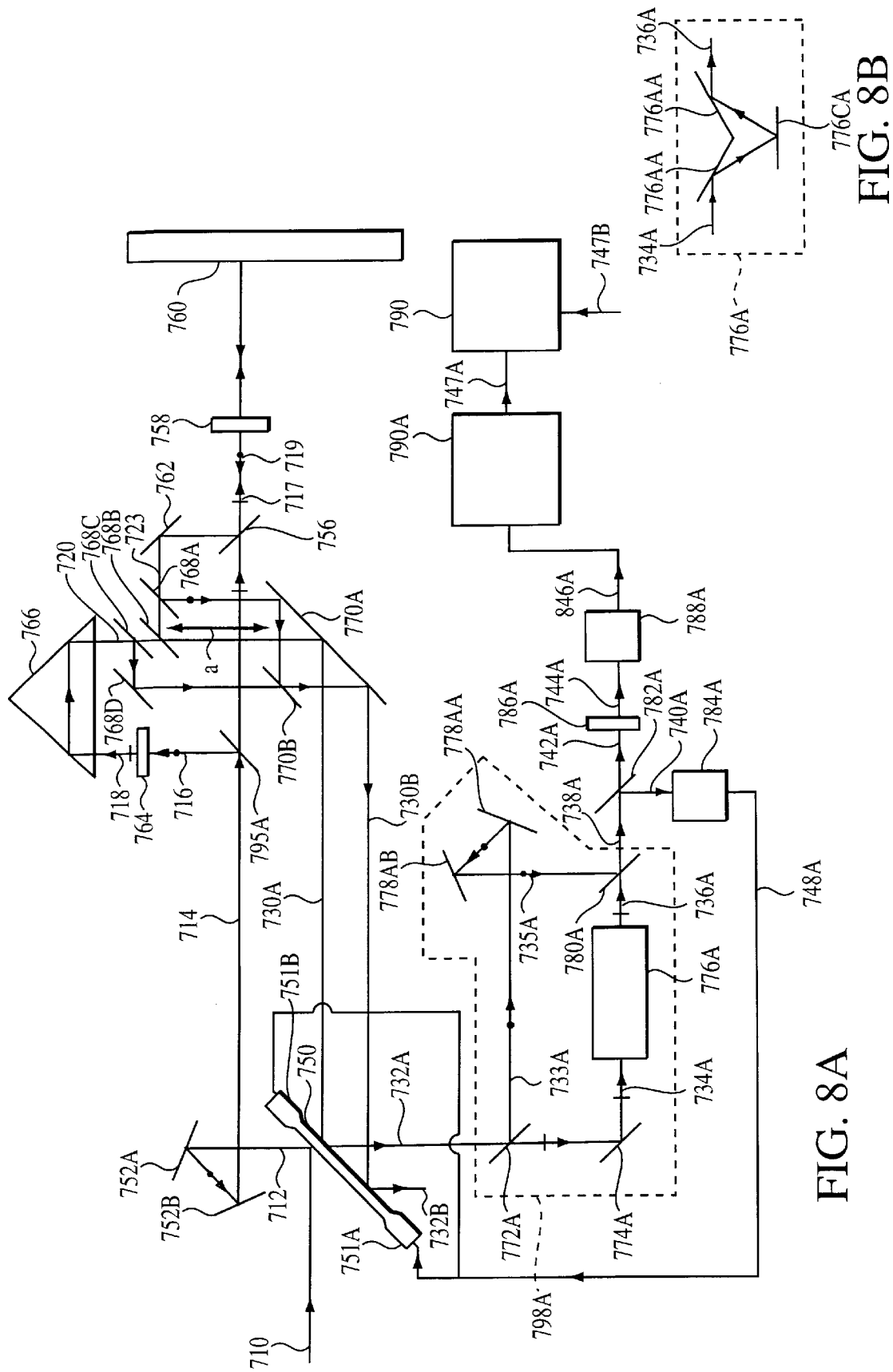

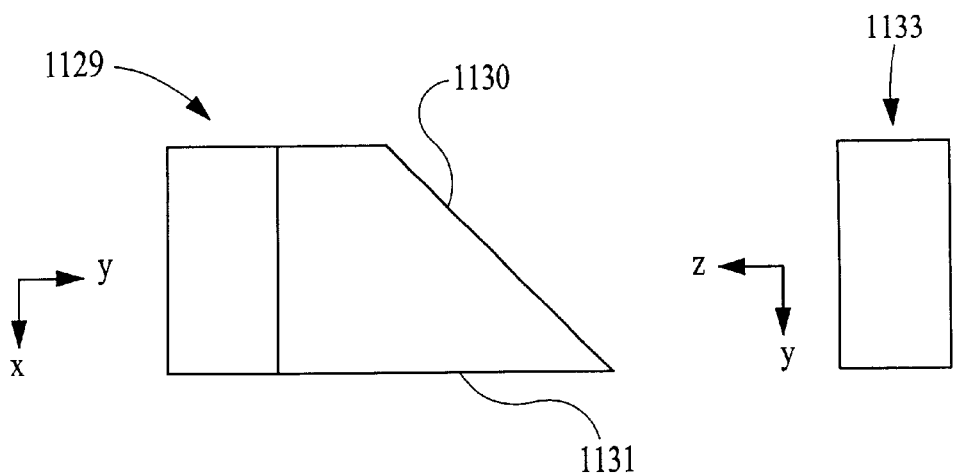
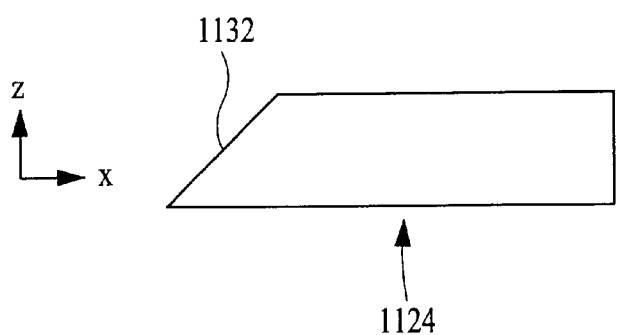
FIG. 11D
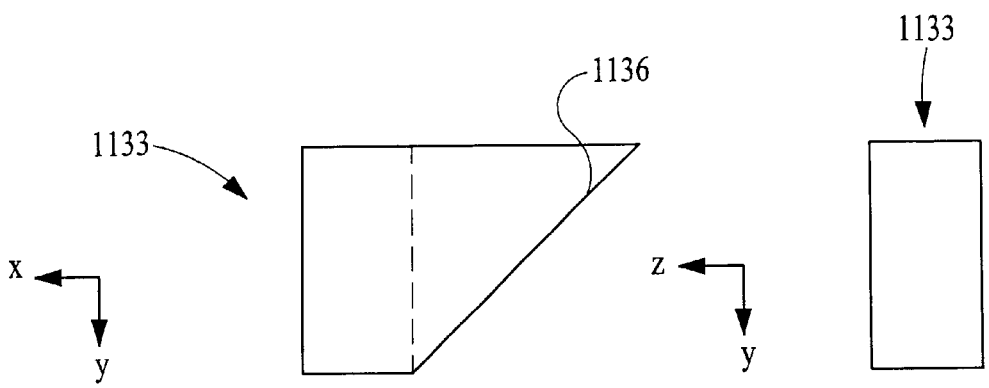
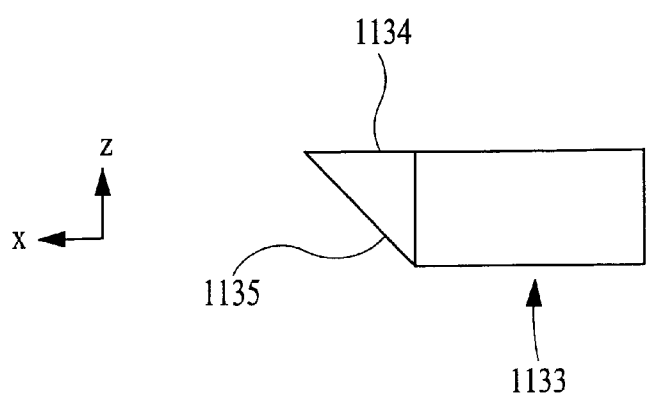
FIG. 11E

METHOD AND SYSTEM FOR CORRECTING AN INTERFEROMETRIC ANGLE MEASUREMENT FOR THE EFFECTS OF DISPERSION

CROSS REFERENCE TO RELATED APPLICATIONS

This application is a divisional application of U.S. Ser. No. 10/009,012, filed Mar. 19, 2002, which is a national phase application of U.S. Ser. No. PCT/US00/12097, filed May 5, 2000, which claims priority from U.S. Ser. No. 09/305,828, filed May 5, 1999 and U.S. Ser. No. 09/384,851, filed Aug. 27, 1999, now U.S. Pat. No. 6,271,923.

BACKGROUND OF THE INVENTION

This invention relates to interferometers, e.g., interferometers for measuring the position and orientation of a measurement object such as a mask stage or a wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beam components that enter the interferometer have orthogonal polarizations and frequencies separated by a heterodyne, split-frequency. The split-frequency can be produced, e.g., by Zeeman splitting, by acousto-optical modulation, or by positioning a birefrigent element internal to the laser. A polarizing beam splitter directs the measurement beam along a measurement path contacting a reflective measurement object (e.g., a stage mirror), directs the reference beam along a reference path, and thereafter recombines the beams to form overlapping exit measurement and reference beams. The overlapping exit beams form an output beam that passes through a polarizer that mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal at a split-frequency. When the measurement object is moving, e.g., by translating a reflective stage, the heterodyne signal is at a frequency equal to the split frequency plus a Doppler shift. The Doppler shift equals $2vp/\lambda$, where v is the relative velocity of the measurement and reference objects, $\lambda$ is the wavelength of the measurement and reference beams, and p is the number of passes to the reference and measurement objects.

Changes in the optical path length to the measurement object correspond to changes in the phase of the measured interference signal at the split-frequency of the measurement and reference beam components that enter the interferometer, with a $2\pi$ phase change substantially equal to an optical path length change nL of $\lambda/p$, where n is the average refractive index of the medium through which the light beams travel, e.g., air or vacuum, and where L is a round-trip distance change, e.g., the change in distance to and from a stage that includes the measurement object. Similarly, multiple interferometers can be used to measure changes in distance to multiple points on the measurement object from which changes in the angular orientation of the measurement object can be determined.

Such interferometers are often crucial components of scanner systems and stepper systems used in lithography to produce integrated circuits on semiconductor wafers. The lithography systems typically include: at least one movable stage to support, orient, and fix the wafer; focusing optics used to direct a radiation beam onto the wafer; a scanner or stepper system for translating the stage relative to the exposure beam; and one or more interferometers to accurately measure changes in the position of the stage relative to the radiation beam. The interferometers enable the lithography system to precisely control which regions of the wafer are exposed to the radiation beam.

SUMMARY OF THE INVENTION

The invention features an interferometry system that measures changes in the angular orientation of a measurement object and that also includes at least one dynamic beam-steering assembly. The dynamic beam-steering assembly redirects one or more beams within the interferometry system in response to a change in the angular orientation of the measurement object. In many embodiments, the presence of the dynamic beam-steering assembly permits the interferometry system to measure the angular orientation of the measurement object using only a single measurement beam to contact the measurement object.

Furthermore, in many embodiments, a control signal derived from the measurement beam contacting the measurement object causes the beam-steering assembly to redirect a measurement beam to contact the measurement object at normal incidence. When at such normal incidence, the interferometry system can calculate the angular orientation of the measurement object based on one or more interferometric signals derived from the measurement beam or based on the orientation of the beam-steering assembly itself. In addition, many of the embodiments involve optical configurations that preserve the linear polarizations of beams incident on the optics, e.g., the use of corner cube retroreflectors are minimized.

In general, in one aspect, the invention features an interferometry system including an interferometer, a control circuit, and an angle measurement system. During operation the interferometer directs a measurement beam along a measurement path contacting a measurement object and combines each of at least two portions of the measurement beam with a corresponding reference beam to form at least two overlapping pairs of exit beams. The interferometer includes a beam-steering assembly having a beam-steering element and a positioning system to orient the beam-steering element, the beam-steering element positioned to direct the measurement beam to the measurement object and the measurement beam contacting the beam-steering element. During operation the control circuit causes the positioning system to reorient the beam-steering element in response to a change in angular orientation of the measurement object and the angle measurement system which calculates the change in angular orientation of the measurement object based on at least one of interferometric signals derived from the overlapping pairs of exit beams and the reorientation of the beam-setting element.

In some embodiments the interferometer directs the at least two portions of the measurement beam to contact the beam-steering element before combining each of them with the corresponding reference beam. In other embodiments, the interferometer directs the measurement beam to contact the beam-steering element a second time, after which the interferometer separates the measurement beam into the at least two portions.

In further embodiments, the interferometer further includes a plurality of reflective surfaces oriented to direct the measurement beam, the portions of the measurement beam, a progenitor beam for the reference beams, and the reference beams. For initial linear polarizations and propagation directions for the measurement beam and the progenitor beam, the plurality of reflective surfaces can be oriented to preserve a linear polarization for the measurement beam, the portions of the measurement beam, a progenitor beam for the reference beams, and the reference beams upon their successive reflections.

In general, in another aspect, the invention features an interferometry system including an interferometer, a control circuit, and an angle measurement system. During operation the interferometer directs a measurement beam along a measurement path contacting a measurement object, separates the measurement beam into m portions, e.g., where m is one of 2 and 3, and recombines at least a part of one of the portions with each of the remaining m−1 portions to form m−1 overlapping pairs of exit beams. The interferometer includes a beam-steering assembly having a beam-steering element and a positioning system to orient the beam-steering element. The beam-steering element is positioned to direct the measurement beam to the measurement object and receive the m separated portions, the measurement beam and each of the m separated portions contacting the beam-steering element. During operation the control circuit causes the positioning system to reorient the beam-steering element in response to a change in angular orientation of the measurement object, and the angle measurement system calculates the change in angular orientation of the measurement object based on at least one of interferometric signals derived from the m−1 overlapping pairs of exit beams and the reorientation of the beam-steering element.

In some embodiments, the interferometer further includes a plurality of reflective surfaces oriented to direct the measurement beam and the portions of the measurement beam. For an initial linear polarization and propagation direction for the measurement beam, the plurality of reflective surfaces can be oriented to preserve a linear polarization for the measurement beam and the portions of the measurement beam upon their successive reflections.

In general, in an another aspect, the invention features an interferometry system including an interferometer, a control circuit, and an angle measurement system. During operation the interferometer directs two measurement beams along corresponding measurement paths contacting a measurement object and combines the measurement beam to form an overlapping pair of exit beams. The interferometer includes a beam-steering assembly having a beam-steering element and a positioning system to orient the beam-steering element. The beam-steering element is positioned to direct the two measurement beams to the measurement object, the two measurement beams contacting the beam-steering element. During operation the control circuit causes the positioning system to reorient the beam-steering element in response to a change in angular orientation of the measurement object and the angle measurement system calculates the change in angular orientation of the measurement object based on at least one of an interferometer signal derived from the overlapping pair of exit beams and the reorientation of the beam-steering element. In some embodiments, the two measurement beams contact the measurement object at substantially the same location.

In some embodiments, the interferometer further includes a plurality of reflective surfaces oriented to direct the measurement beams. For an initial linear polarization and propagation direction for a progenitor beam for the measurement beams, the plurality of reflective surfaces can be oriented to preserve a linear polarization for the measurement beams upon their successive reflections.

In general, in another aspect, the invention features an interferometry system including an interferometer, a beam-steering assembly, a control circuit, and an angle measurement system. During operation the interferometer receives an input beam, splits the input beam into a measurement beam and m reference beams, where m is an integer greater than 1, directs the measurement beam along a measurement path contacting a measurement object, and combines each of m portions of the measurement beam with a corresponding one of the m reference beams to form m overlapping pairs of exit beams. The beam-steering assembly has a beam-steering element and a positioning system to orient the beam-steering element. The beam-steering element is positioned to direct the input beam and the m overlapping pairs of exit beams, the input beam and the m overlapping pairs of exit beams contacting the beam-steering element. During operation, the control circuit causes the positioning system to reorient the beam-steering element in response to a change in angular orientation of the measurement object and the angle measurement system calculates the change in angular orientation of the measurement object based on at least one of interferometric signals derived from the m overlapping pairs of exit beams and the reorientation of the beam-steering element.

In some embodiments, the interferometer further includes a plurality of reflective surfaces oriented to direct the measurement beam and the reference beams. For an initial linear polarization and propagation direction for the input beam, the plurality of reflective surfaces can be oriented to preserve a linear polarization for the measurement beam and the reference beams upon their successive reflections.

In general, in another aspect, the invention features an interferometry system including an interferometer, a beam-steering assembly, a control circuit, and an angle measurement system. During operation the interferometer receives an input beam, splits the input beam into two measurement beams, directs the measurement beams along respective measurement paths contacting the measurement object, and combines the measurement beams to form an overlapping pair of exit beams. The beam-steering assembly has a beam-steering element and a positioning system to orient the beam-steering element. The beam-steering element is positioned to direct the input beam and the overlapping pair of exit beams, the input beam and the overlapping pair of exit beams contacting the beam-steering element. During operation, the control circuit causes the positioning system to reorient the beam-steering element in response to a change in angular orientation of the measurement object and the angle measurement system calculates the change in angular orientation of the measurement object based on at least one of an interferometric signal derived from the overlapping pair of exit beams and the reorientation of the beam-steering element.

In some embodiments, the interferometer further includes a plurality of reflective surfaces oriented to direct the measurement beams. For an initial linear polarization and propagation direction for the input beam, the plurality of reflective surfaces can be oriented to preserve a linear polarization for the measurement beams upon their successive reflections.

In general, in another aspect, the invention features an interferometry system including an interferometer, a control circuit, and an angle measurement system. During operation, the interferometer directs a measurement beam along a measurement path contacting a measurement object, separates the measurement beam into first and second portions, directs the first and second portions along separate paths, and subsequently recombines the first and second portions with each other to form at least one overlapping pair of exit beams. The interferometer includes a beam-steering assembly having a beam-steering element and a positioning system to orient the beam-steering element, the beam-steering element being positioned to direct the measurement beam to the measurement object and subsequently receive the measurement beam from the measurement object. The measurement beam thereby twice contacts the beam-steering element, after which the interferometer separates the measurement beam into the first and second portions. During operation, the control circuit causes the positioning system to reorient the beam-steering element in response to a change in angular orientation of the measurement object based on at least one interferometric signal derived from the at least one overlapping pair of exit beams. During operation, the angle measurement system calculates the change in angular orientation of the measurement object based on the reorientation of the beam-steering element.

In some embodiments, the interferometer recombines the first and second portions into two overlapping pairs of exit beams, and the at least one interferometric signal is at least two interferometric signals derived from the two overlapping pairs of exit beams. The control circuit includes two detection channels which during operation measure the at least two interferometric signals, one of the detection channels including a quarter wave plate oriented to cause the two interferometric signals to be in quadrature with one another.

Also, in some embodiments, the interferometer separates the measurement beam into third and fourth portions after the measurement beam twice contacts the beam-steering element, directs the third and fourth portions along separate paths, and recombines the third and fourth portions to form a second at least one pair of overlapping exit beams. During operation the control circuit causes the positioning system to reorient the beam-splitting element along two dimensions based on the at least one interferometric signal and a second at least one interferometric signal derived from the second at least pair of overlapping exit beams.

Furthermore, in some embodiments, the interferometer can further separate the measurement beam into an additional portion after the measurement beam twice contains the beam-steering element and combines the additional portion with a reference beam to form an additional pair of overlapping exit beams. The interferometry system further includes a distance measurement system, which during operation measures changes in distance to the measurement object based on an interferometric signal derived from the additional pair of overlapping exit beams.

Also, in some embodiments, the interferometer further includes a plurality of reflective surfaces oriented to direct the measurement beam and the portions of the measurement beam. For an initial linear polarization and propagation direction for the measurement beam, the plurality of reflective surfaces can be oriented to preserve a linear polarization for the measurement beam and the portions of the measurement beam upon their successive reflections.

In general, in another aspect, the invention features an interferometry system comprising an interferometer and a control circuit. During operation the interferometer directs a reference beam along a reference path and a measurement beam along a measurement path contacting a measurement object and combines the reference and measurement beams to produce overlapping exit reference and measurement beams. The overlapping exit reference and measurement beams are indicative of changes in a relative optical path length between the reference and measurement paths. The interferometer includes a beam steering assembly having a beam steering element and a positioning system to orient the beam steering element. The beam steering element has at least two faces positioned to direct the measurement beam after it contacts the measurement object, and the measurement beam contacts the measurement object and subsequently contacts each of the two faces during propagation within the interferometer. During operation, the control circuit causes the positioning system to reorient the beam steering element in response to changes in at least one of angular orientation and position of the measurement object. In further embodiments, the system can include an angle measurement system for determining changes in the angular orientation of the measurement object.

Embodiments of any of the interferometry systems described above can include any of the following features.

The angle measurement system can calculate the change in angular orientation of the measurement object based on the reorientation of the beam-steering element or it can calculate the change in angular orientation of the measurement object based on the interferometric signal(s) derived from the overlapping pair(s) of exit beams. The angle measurement system can calculate the change in angular orientation of the measurement object along two dimensions. The distance measurement system can further calculate changes in distance to the measurement object based on at least one of the interferometric signal(s) derived from the overlapping pair(s) of exit beams. The control circuit can cause the measurement beam to contact the measurement object at substantially normal incidence over a range of angular orientations of the measurement object. The control circuit can generate a servo signal based on the interferometric signal(s) derived from the overlapping pair(s) of exit beams and can cause the positioning system to reorient the beam-steering element (e.g., along one or two dimensions) in response to the change in angular orientation of the measurement object based on the servo signal.

Alternatively, the control circuit can include a detector having spatially resolved detector elements operative to measure the position and/or direction of at least a portion of the overlapping pair(s) of exit beams. The control signal generates a servo signal based on the measured position and/or direction and causes the positioning system to reorient the beam-steering element (e.g., along one or two dimensions) in response to the change in angular orientation of the measurement object based on the servo signal. The detector can be operative to measure the difference in position and/or direction between the exit beams of at least one of the overlapping pair(s) of exit beams. Alternatively, the detector can be operative to measure the position and/or direction of the measurement beam component of at least one of the overlapping pair(s) of exit beams relative to a reference position and/or direction.

The invention also features a lithography system for fabricating integrated circuits including first and second components, which are movable relative to one another. One of interferometry systems described above is secured to the second component and the measurement object is a mirror rigidly secured to the first component. During operation the interferometry system measures the position of the first component relative to the second component. In some embodiments, the second component is a movable stage used to support a wafer and during operation the beam-steering element causes the measurement beam to contact the mirror at substantially normal incidence over a range of angular orientations of the measurement object.

In another aspect, the invention also features a lithography system for use in fabricating integrated circuits on a wafer. The lithography system includes: a stage for supporting the wafer; an illumination system for imaging spatially patterned radiation onto the wafer; a positioning system for adjusting the position of the stage relative to the imaged radiation; and at least one of any of the interferometry systems described above. The interferometry system(s) measures the position of the wafer relative to the imaged radiation.

In another aspect, the invention features a lithography system for use in fabricating integrated circuits on a wafer. The lithography system includes a stage for supporting the wafer and an illumination system. The illumination system includes a radiation source, a mask, a positioning system, a lens assembly, and at least one of any of the interferometry systems described above. During operation the source directs radiation through the mask to produce spatially patterned radiation. The positioning system adjusts the position of the mask relative to the radiation from the source. The lens assembly images the spatially patterned radiation onto the wafer. The interferometry system(s) measures the position of the mask relative to the radiation from the source.

In another aspect, the invention features a lithography system for fabricating integrated circuits. The lithography system includes first and second components, the first and second components being movable relative to each other. The lithography system also includes at least one of any of the interferometry systems described above, wherein the first component includes the measurement object and the interferometry system(s) monitors the position of the first component relative to the second component.

In another aspect, the invention features a beam writing system for use in fabricating a lithography mask. The beam writing system includes: a source providing a write beam to pattern a substrate; a stage supporting the substrate; a beam directing assembly for delivering the write beam to the substrate; a positioning system for positioning the stage and beam directing assembly relative one another; and at least one of any of the interferometry systems described above for measuring the position of the stage relative to the beam directing assembly.

In general, in another aspect, the invention features an interferometry method including: directing a measurement beam along a measurement path contacting a measurement object; combining at least a portion of the measurement beam with another beam to form an overlapping pair of exit beams; using an electronic control system to redirect the measurement beam in response to a change in the angular orientation of the measurement object based on a servo signal derived from at least a portion of the overlapping pair of exit beams; and calculating the change in angular orientation based on an interferometric signal derived from the overlapping pair of exit beams and the redirection of the measurement object. In some embodiments, using the electronic control system includes redirecting the measurement beam to contact the measurement object at substantially normal incidence over a range of angular orientations of the measurement object.

In another object, the invention features a lithography method for use in fabricating integrated circuits. The lithography method includes: imaging spatially patterned radiation onto a wafer; positioning the wafer relative to the imaged radiation; and measuring the position of the wafer relative to the imaged radiation using at least one of the interferometry methods described above.

In another aspect, the invention features a lithography method for use in the fabrication of integrated circuits. The lithography method includes: directing input radiation through a mask to produce spatially patterned radiation; positioning the mask relative to the input radiation; measuring the position of the mask relative to the input radiation using at least one of the interferometry methods described above; and imaging the spatially patterned radiation onto a wafer.

In another aspect, the invention features a lithography method for use in fabricating integrated chips. The lithography method includes: positioning a first component of a lithography system relative to a second component of a lithography system to expose a wafer to spatially patterned radiation; and measuring the position of the first component relative to the second component using any of the interferometry methods described above.

In another aspect, the invention features a beam writing method for use in fabricating a lithography mask. The method includes: directing a write beam to a substrate to pattern the substrate; positioning the substrate relative to the write beam; and measuring the position of the substrate relative to the write beam using any of the interferometry methods described above.

In another aspect, the invention features a method for correcting an angle $\theta_l$ indicative of a relative angular orientation of a measurement object for the effects of dispersion caused by gas along a measurement path having a substantially uniform composition, wherein the angle $\theta_l$ is measured interferometrically at a wavelength $\lambda_l$. The method includes: i) interferometrically measuring the angular orientation at a first wavelength $\lambda_q$ to give a first angle $\theta_q$ indicative of the angular orientation; ii) interferometrically measuring the angular orientation at a second wavelength $\lambda_u$ not equal to the first wavelength $\lambda_q$ to give a second angle $\theta_u$ indicative of the angular orientation; and iii) correcting the angle $\theta_l$ by an additive factor $\Delta\theta_l=(-\Gamma(\theta_q-\theta_u))$, where $\Gamma=(n_1-1)/(n_q-n_u)$ is the reciprocal dispersive power of the gas and $n_l$, $n_q$, and $n_u$ are the indices of refraction of the gas at wavelengths $\lambda_l$, $\lambda_q$, and $\lambda_u$, respectively. Depending on the embodiment, the angle $\theta_l$ is the first measured angle $\theta_q$ and $\lambda_l=\lambda_q$, the angle $\theta_l$ is the second measured angle $\theta_u$ and $\lambda_l=\lambda_u$, or the angle $\theta_l$ is different from either the first measured angle $\theta_q$ or the second measured angle $\theta_u$, with $\lambda_l\neq\lambda_q$ and $\lambda_l\neq\lambda_u$.

Embodiments of the interferometry systems and methods described above include many advantages.

The interferometry systems can measure changes in the angular orientation of a measurement object. Furthermore, some embodiments can measure changes in the angular orientation along two dimensions and/or can also measure changes in distance to the measurement object. In addition, many embodiments measure the changes in angular orientation with only a single beam contacting the measurement object or with multiple beams contacting the measurement object at a single location. Thus, the reflective surface of the measurement object can be relatively small. In particular, some of interferometry systems can measure changes in displacement, pitch, and yaw of a stage mirror with a footprint on the stage mirror of only a single beam spot. Moreover, when the measurement beam includes multiple wavelengths, the effects of dispersion along the single beam path to the measurement object can be measured and used to calculate values for displacement, pitch, and/or yaw that are corrected for air-turbulence.

Also, for each of the overlapping pairs of exit beams the interferometry system maintains the overlap of the respective exit beams substantially parallel to one another over a range of orientations of the measurement object, and can do so with only a single pass of the measurement beam to the measurement object. The single-pass embodiments reduce the bandwidth of electronics needed to process electrical interference signals having Doppler shifts, relative to those of a double-pass interferometer. Furthermore, the single-pass embodiments reduce the likelihood of depolarization, scattering, and undesired spurious reflections from transmissive optics within the interferometer, relative to those for a double-pass interferometer. Such effects can introduce errors, e.g., cyclic errors, in the measured phase of the electrical interference signal.

Moreover, the system can minimize the transverse displacement between the exit beams of each overlapping pair of exit beams or the transverse displacement of components of such exit beams within the interferometer, caused by changes in the angular orientation of the measurement object. As a result, the average amplitude of the electrical interference signal derived from optically mixed exit beams can be substantially independent of changes in the angular orientation and position of the measurement object. In addition, the system reduces changes of the paths of the beams through transmissive optics of the interferometer, e.g., polarizing beam splitters and quarter wave plates, caused by changes in the angular orientation or position of the measurement object. Such transmissive optics can have imperfections in their surface figures and local variations in refractive index. Thus, changes in the paths of the beams through such optics can change the optical path length measured by the interferometer even though the distance between the measurement object and the interferometer has not changed. Such negative effects can be compounded if a transmissive optic has dispersive properties, such as those produced by a wedge. Finally, some embodiments of the invention can be made in compact configurations and include optical configurations that minimize the introduction of ellipticity into the linear polarization of beams directed by the optical configuration.

Other features, aspects, and advantages will be clear from the following detailed description and from the claims.

BRIEF DESCRIPTION OF THE DRAWINGS

FIGS. 4a–b are schematic drawings of a fourth embodiment of the interferometry system.

FIGS. 5a–b are schematic drawings of a fifth embodiment of the interferometry system and FIGS. 5c–g are schematic drawings of a variant of the fifth embodiment.

FIGS. 6a–b are schematic drawings of a sixth embodiment of the interferometry system and FIGS. 6c–g are schematic drawings of a variant of the sixth embodiment.

FIGS. 8a–c are schematic drawings of an eighth embodiment of the interferometry system.

FIG. 9a is a schematic drawing of a lithography exposure system employing the interferometry system. FIGS. 9b and 9c are flow charts describing steps in manufacturing integrated circuits.

FIGS. 11a–e are schematic drawings of a ninth embodiment of the interferometry system.

DETAILED DESCRIPTION

The present invention relates to apparatus and methods by which an angular displacement of a measurement object or angular and linear displacements of the object may be quickly measured for subsequent use in a contemporaneous downstream application. An example of an application is in an interferometric angular displacement and linear displacement-measuring instrument to measure and monitor the orientation and position of a mask stage or a wafer stage in a lithographic scanner or stepper system.

A first set of embodiments of the invention feature an angular displacement interferometer system including an interferometer and at least one beam-steering assembly controlled by a control circuit. The angle displacement interferometer may comprise a single interferometer, an interferometer system comprising two or more linear displacement interferometers in an integrated "non-stacked" configuration. Certain of the angle displacement interferometers operate in a "null" or differential mode and certain other of the angle displacement interferometers operate in a displacement or non-differential mode.

A second set of embodiments of the invention features an angular displacement and linear displacement interferometry system including at least one angular displacement interferometer such as comparing the first set of embodiments, at least one linear displacement interferometer, and at least one beam-steering assembly controlled by a control circuit. In some embodiments from the first set and in some embodiments from the second set, the beam-steering assembly is a component of the interferometer or interferometers, directing at least one of the reference and measurement beams within the interferometer or interferometers. In other embodiments from the first set and in other embodiments from the second set, the beam-steering assembly is separate from the interferometer or interferometers, the beam-steering assembly directing an input beam to and an output beam from the interferometer or interferometers. The beam-steering assembly redirects one or more of the input, output, reference, and measurement beams to minimize undesired consequences of changes in the angular orientation or position of the measurement object.

Beam-steering assemblies, control circuits, and their uses in displacement measuring interferometry and described in copending, commonly owned U.S. patent application having Ser. No. 09/157,131, filed Oct. 18, 1998, and entitled "Interferometer Having A Dynamic Beam-steering Assembly" by H. A. Hill and P. de Groot, the contents of which are incorporated herein by reference.

Figure 1:
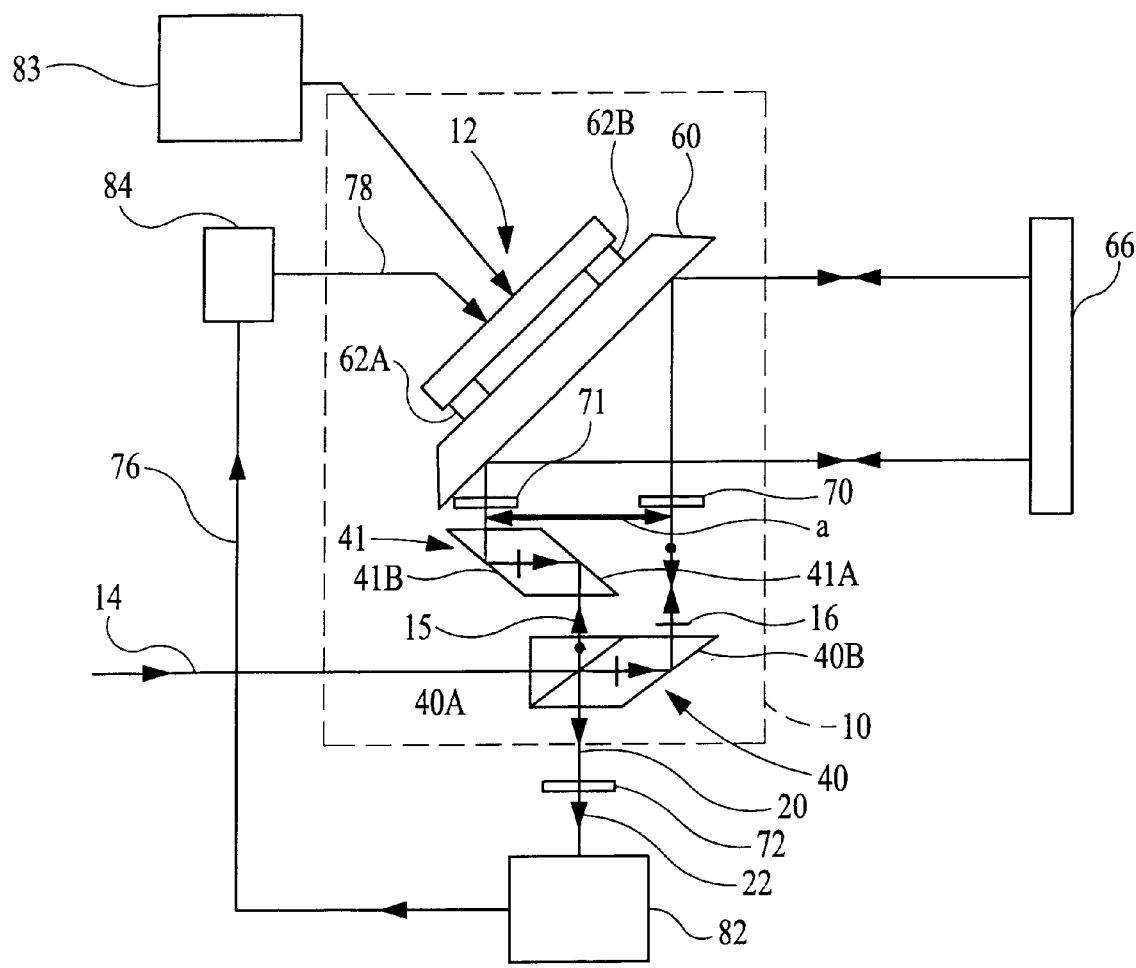
FIG. 1 is a schematic drawing of a first embodiment of the interferometry system.

A schematic of a first embodiment of the invention is shown in FIG. 1. The first embodiment is from the first set of embodiments comprising a single interferometer operating in a null or differential mode with the beam-steering assembly redirecting both the reference and measurement beams of the interferometer. A polarizing beam-splitter assembly 40 with polarizing interface 40A and reflecting surface 40B in an interferometer 10 receives an input beam 14 from a laser source (not shown) and separates input beam 14 into a reference beam 15 and a measurement beam which is reflected by surface 40B as measurement beam 16. Reference beam 15 and measurement beam 16 have orthogonal linear polarizations. Polarizing beam-splitting interface 40A reflects beams having a polarization orthogonal to the plane of FIG. 1 and transmits beams having a polarization parallel to the plane of FIG. 1.

In the described embodiment, the orthogonally polarized reference and measurement beams are frequency-shifted with respect one another, e.g., by Zeeman splitting, acousto-optic modulation, or by use of birefringent elements internal to the laser, prior to entering interferometer 10 as components of input beam 14. The different frequencies enable the interferometry system to generate a heterodyne interference signal. Although the descried embodiment is a heterodyne system, the instant invention is readily adapted for use in a homodyne system in which the reference and measurement beams have the same frequencies.

The source such as a laser can be any of a variety of frequency modulation apparatus and/or lasers. For example, the laser can be a gas laser, e.g., a HeNe laser, stabilized in any of a variety of conventional techniques known to those skilled in the art, see for example, T. Baer et al., "Frequency Stabilization of a 0.633 $\mu$m He-Ne-longitudinal Zeeman Laser," Applied Optics, 19, 3173–3177 (1980); Bergwald et al., U.S. Pat. No. 3,889,207, issued Jun. 10, 1975; and Sandstorm et al., U.S. Pat. No. 3,662,279, issued May 9, 1972. Alternatively, the laser can be a diode laser frequency stabilized in one of a variety of conventional techniques known to those skilled in the art, see for example, T. Okoshi and K. Kikuchi, "Frequency Stabilization of Semiconductor Lasers for Heterodyne-type Optical Communication Systems," Electronic letters, 16, 179–181 (1980) and S. Yamagguchi and M. Suzuki, "Simultaneous Stabilization of the Frequency and Power of an AlGaAs Semiconductor Laser by Use of the Optogalvanic Effect of Krypton," IEEE J. Quantum Electronics, QE-19, 1514–1519 (1983).

Two optical frequencies may be produced by one of the following techniques: (1) use of a Zeeman split laser, see for example, Bagley et al., U.S. Pat. No. 3,458,259, issued Jul. 29, 1969; G. Bouwhuis, "Interferometrie Mit Gaslasers," Ned. T. Natuurk, 34, 225–232 (August 1968); Bagley et al., U.S. Pat. No. 3,656,853, issued Apr. 18, 1972; and H. Matsumoto, "Recent interforometric measurements using stabilized lasers," Precision Engineering, 6(2), 87–94 (1984); (2) use of a pair of acousto-optical Bragg cells, see for example, Y. Ohtsuka and K. Itoh, "Two-frequency Laser Interferometer for Small Displacement Measurements in a Low Frequency Range," Applied Optics, 18(2), 219–224 (1979); N. Massie et al., "Measuring Laser Flow Fields With a 64-Channel Heterodyne Interferometer," Applied Optics, 22(14), 2141–2151 (1983); Y. Ohtuska and M. Tsubokawa, "Dynamic Two-frequency Interferometry for Small Displacement Measurements", Optics and Laser Technology, 16, 25–29 (1984); H. Matsumoto, ibid.; P. Dirksen, et al., U.S. Pat. No. 5,485,272, issued Jan. 16, 1996; N. A. Riza and M. M. K. Howlader, "Acousto-optic system for the generation and control of tunable low-frequency signals," Opt. Eng., 35(4), 920–925 (1996); (3) use of a single acousto-optic Bragg cell, see for example, G. E. Sommargren, commonly owned U.S. Pat. No. 4,684,828, issued Aug. 4, 1987; G. E. Sommargren, commonly owned U.S. Pat. No. 4,667,958; issued Aug. 18, 1987; P. Dirksen, et al., ibid.; (4) use of two longitudinal modes of a randomly polarized HeNe laser, see for example, J. B. Ferguson and R. H. Morris, "Single Mode Collapse in 6328 Å HeNe Lasers, " Applied Optics, 17(18), 2924–2929 (1978); (5) use of birefringent elements or the like internal to the laser, see for example, V. Evtuhov and A. E. Siegman, "A "Twisted-Mode" Technique for Obtaining Axially Uniform Energy Density in a Laser Cavity," Applied Optics, 4(1), 142–143 (1965); or the use of the systems described in U.S. patent application with Ser. No. 09/061,928 filed Apr. 17, 1998 entitled "Apparatus to Transform Two Non-Parallel Propagating Optical Beam components into Two Orthogonally Polarized Beam Components"by H. A. Hill, the contents of which are incorporated herein by reference.

The specific device used for the source of beam 14 will determined the diameter and divergence of beam 14. For some sources, e.g., a diode laser, it will likely by necessary to use conventional beam shaping optics, e.g., a conventional microscope objective, to provide beam 14 with a suitable diameter and divergence for elements that follow. When the source is a HeNe laser, for example, beam-shaping optics may not be required.

Reflecting surface 40B of beam-splitting assembly 40 directs measurement beam 16 to a beam-steering assembly 12 which includes a beam-steering mirror 60 and a pair of piezoelectric transducers 62A and 62B. The transducers are coupled to beam-steering mirror 60 by flexures to orient beam-steering mirror 60 in response to a signal 78 from a servo controller 84. Beam-steering assembly 12 includes capacitance gauges, interferometers or the like to measure changes in orientation and/or position of beam-steering mirror 60. The capacitance gauges or interferometers may also be used to measure and/or monitor the properties of piezoelectric transducers 62A and 62B.

Beam-steering assembly 12 directs measurement beam 16 to contact a measurement object mirror 66 at substantially normal incidence. Measurement object mirror 66 then reflects the measurement beam back to retrace its path to beam-steering assembly 12 and polarizing beam-splitter assembly 40. The measurement beam double passes a quarter wave plate 70, which is positioned between beam-steering assembly 12 and polarizing beam-splitter assembly 40 and which rotates the linear polarization of the measurement beam by 90°.

Rhomb 41 comprising reflecting surfaces 41A and 41B directs reference beam 15 to the beam-steering assembly 12, which in turn directs the reference beam to contact measurement object mirror 66. Measurement object mirror 66 then reflects the reference beam back to retrace its path to beam-steering assembly 12, through rhomb 41, and to polarizing beam-splitter assembly 40. The reference beam also double passes a quarter wave plate 71 that rotates the linear polarization of the reference beam by 90°.

Polarizing beam-splitter assembly 40 then recombines the polarization-rotated reference and measurement beams to form overlapping output reference and measurement beams that together form an output beam 20. Output beam 20 passes through a polarizer 72 which mixes polarizations of the output reference and measurement beams to form a mixed output beam 22. Interferometer system 10 and measurement object mirror 66 introduce a relative phase shift $\phi_1$ between the measurement and reference beam components of mixed output beam 22. A signal detection and processing system 82 measures the intensity of mixed output beam 22, e.g., preferably by photoelectric detection, to produce an electrical interference signal or electrical heterodyne signal $s_1$, extracts phase $\phi_1$ of $s_1$, and determines from phase $\phi_1$ an error related to relative orientations of measurement object mirror 66 and steering mirror 60.

Signal $s_1$ has the form $$s_1 = A_1(t)\cos[\alpha_1(t)] \tag{1}$$

The phase $\alpha_1$ may be extracted by either digital or analog signal processes, preferably digital processes, using time-based phase detection such as a digital Hilbert transform phase detector [see "Phase-locked loops: theory, design, and applications" 2nd ed. (McGraw-Hill, New York) 1993, by R. E. Best], a phase-locked loop [see R. E. Best, ibid.], a sliding window FFT [see *Digital Techniques for Wideband Receivers*, (Artech House, Boston) 1995, by J. Tsui], or the like and a reference phase. In applications where an acousto-optical modulator is used to generate the frequency splitting of the input beam, the reference phase may be obtained from an electronic driver of an acousto-optical modulator. Alternatively, the reference phase may be generated by an optical pick-off means and detector (not shown in figure) by splitting off a portion of beam 14 with a non-polarizing beam splitter, mixing the split-off portion of the beam 14, and detecting the mixed portion to produce an alternative heterodyne reference signal and associated reference phase.

A determination of phase $\alpha_1$ is described further in terms of a digital Hilbert transform phase detector. Signal $s_1$ is the real part, $\hat{s}_{1,R}$, of a complex number $\hat{s}_1$ where $s_1$ comprises a causal, stable, i.e., absolutely summable, real sequence. Thus, the Fourier transform $S_{1,R}(j\omega)$ of $s_1$ completely defines $S_1(j\omega)$ [see Chapter 10 "Discrete Hilbert Transforms" in *Discrete-Time Signal Processing*, (Prentice Hall, 1989) by A. V. Oppenheim and R. W. Schafer] where $$S_1(j\omega) = S_{1,R}(j\omega) + jS_{1,I}(j\omega) \tag{2}$$

$S_{1,I}(j\omega)$ is the imaginary component of $S_1(j\omega)$, $\omega$ is an angular frequency, and j is the imaginary number $\sqrt{-1}$.

The imaginary component $\hat{s}_{1,I}$ of $\hat{s}_1$ is obtained from the inverse Fourier transform of $S_{1,I}(j\omega)$ with $$s_{1,I} = A_1(t)\sin[\alpha_1(t)] \tag{3}$$

The phase $\alpha_1(t)$ can be obtained from $\hat{s}_{1,R}$ and $\hat{s}_{1,I}$ according to the formula $$\alpha_1(t) = \arctan\left(\frac{s_{2,I}}{s_{2,R}}\right). \tag{4}$$

The time-dependent argument $\alpha_1(t)$ is expressed in terms of other quantities according to the formula $$\alpha_1(t) = 2\pi f_1 t + \phi_i + \zeta_i + \Lambda_i \tag{5}$$

where i is an index denoting reference to a particular embodiment, and where $\Lambda_i$ comprises the nonlinear errors including in particular cyclic error terms and phase offset $\zeta_i$ comprises all contributions to phase $\phi_i$ that are not related or associated with the optical path of the measurement and reference paths and not related to the nonlinear errors. Phase offset $\zeta_1$ is generally considered a constant in the first embodiment of the invention and is measured and/or monitored as required by an end use application using known techniques.

Phase $\phi_1$ is given by the formula $$\varphi_1 = k\left[\int_M n ds - \int_R n ds\right] \tag{6}$$

where the integrals are line integrals with respect to the infinitesimal optical path length nds along the measurement and reference paths indicated by M and R, respectively, and n is the refractive index of the infinitesimal physical path length ds at the wavelength $\lambda$ of input beam 14. Phase $\phi_1$ is also related to the deviation from normal incidence $\delta\theta_1$ of the reference and measurement beams on stage mirror 66 in the plane of FIG. 1 according to the expression $$\varphi_1 = 2ka\tan\frac{\delta\theta_1}{1+\tan\delta\theta_1} \tag{7}$$

where k is the wavenumber $2\pi/\lambda$ and a is the separation of reference and measurement beams 15 and 16 (see FIG. 1).

Signal detector and processor system 82 determines error $\delta\theta_1$ from the measured value of $\phi_1$ using Eq. (7) and sends an error signal 76 based on error $\delta\theta_1$, indicative of any error in the orientation of stage mirror 66 relative to beam-steering mirror 60, to servo controller 84. Servo controller 84 sends signal 78 to beam-steering assembly 12 in response to error signal 76. Beam-steering assembly 12 changes, in response to signal 78, the orientation of beam-steering mirror 60 preferably about a point on the reflecting surface of beam-steering mirror 60 midway between the locations where reference and measurement beams are reflected thereon. Changes in orientation of beam-steering mirror 60 about the point on beam-steering mirror 60 rather than some other point generally produces substantially reduced lateral shear effects experienced by the reference and measurement beams at and post beam-steering mirror 60.

A change in the angular orientation of measurement object mirror 66 without a compensating change in the orientation of beam-steering mirror 60 changes the directions of propagation of the reference and measurement beams and the direction of propagation of subsequent output beam 20 although the reference and measurement beam components of beam 20 remain parallel. The changes in direction of the reference and measurement beam causes the optical path lengths of the reference and measurement beams to change, one relative to the other, and causes detector and processor system 82 to generate error signal 76. Servo-controller 84 responds to the error signal by directing beam-steering assembly 12 to reorient beam-steering mirror 60 so as to minimize the error signal, e.g., by directing the reference and measurement beams to measurement object mirror 66 at normal incidence.

The classification of the first embodiment as comprising an interferometer operating in a null or differential mode is in recognition that only an error in the orientation of the measurement object mirror relative to the beam-steering mirror is measured by the processor system 82.

The angular change in the orientation of beam-steering mirror 60 is equal to one half of the corresponding change in the orientation of measurement object mirror 66 when the servo control signal is zero. In addition to the exit reference and measurement beam components of beam 20 remaining substantially parallel to one another, the position of output beam 20 remains substantially constant over a range of angular orientations of measurement object mirror 66. Furthermore, because the angles of incidence of reference and measurement beams on beam-steering mirror 60 are substantially equal, a translation of beam-steering mirror 60 in a direction normal to the reflecting surface of beam-steering mirror 60 does not introduce a change in the relative optical path length between the reference and measurement beams to first and higher orders in the translation.

The relative orientation of measurement object mirror 66 in the plane of FIG. 1 can be measured and monitored by measuring and monitoring the relative orientation of beam-steering mirror 60. This option is available as a direct consequence of a system property wherein an angular change in the orientation of beam-steering mirror 60 is equal to one half of the corresponding change in the orientation of measurement object mirror 66. Thus, an angle measuring system 83 (not shown in FIG. 1) calculates the change in angular orientation of measurement object mirror 66 based on the change in angular orientation of beam-steering mirror 60. In the presently described embodiment, angle measuring system 83 directly measures the change in orientation of beam-steering mirror 60 by using, for example, calibrated capacitance gauges incorporated into beam-steering assembly 12. Alternatively, in other embodiments, angle measurement system 83 includes calibration data for beam-steering assembly 12 that correlates the servo signal 76 to transducers 62A and 62B with the change in angular orientation of the beam-steering mirror 60, which is directly related to the change in angular orientation of measurement object mirror 66 as described above. In such embodiments the angle measurement system calculates the angular orientation of the measurement object based on the servo signal.

Angle measuring system 83 can be calibrated interferometrically by operating the interferometer system of the first embodiment in an offset mode. In the offset mode of operation, an offset in orientation of measurement object mirror 66 relative to beam-steering mirror 60 is introduced and Eq. (7) used to convert, with a measurement of a, the corresponding measured change in phase $\phi_1$ to a change in angular orientation of beam-steering mirror 60. The offset in orientation can be introduced in one of several different ways. One example is the introduction of an offset, in either digital or analog format, to error signal 76 by additional electronic means (not shown in FIG. 1) with the servo control of beam-steering mirror 60 operational.

Cyclic error contributions to $\Lambda_1$ can be reduced and/or measured and compensated in part or whole, as required by an end use application, with the incorporation into the first embodiment methods and apparatus such as described in G. Wilkening and W. Hou, U.S. Pat. No. 5,331,400 entitled "Heterodyne Interferometer Arrangement" issued Jul. 19, 1994; in copending, commonly owned U.S. patent application with Ser. No. 09/168,200 by S. R. Paterson, V. G. Bagdami, and C. A. Zanoni entitled "Interferometry System Having Reduced Cyclic Errors" filed Oct. 6, 1998; and in copending, commonly owned U.S. patent application with Ser. No. 09/268,619 by H. A. Hill entitled "Systems and Methods For Characterizing Cyclic Errors in Distance Measuring and Dispersion Interferometry" filed Mar. 15, 1999. The contents of the two copending applications are incorporated herein by reference.

Gas in a reference path and/or measurement path can introduce an error in the angular orientation of measurement object mirror 66 inferred from the angular orientation of beam-steering mirror 60 due to the effects of density gradients in the gas. Density gradients in the gas alter the directions of propagation of reference and/or measurement beams propagating through the gas. For further description of the error in angular orientation, see the description of corresponding effects of gas given for the second embodiment of the present invention.

A variant of the first embodiment is described in which an angular displacement of an object in two orthogonal planes is measured and monitored. The variant of the first embodiment comprises the same input beam 14 and interferometer system 10 plus an additional set of optical elements, detector and signal processor system, and beam-steering assembly transducers. The additional set of optical elements comprise elements the same as elements 40, 41, 70, and 71 whose plane is rotated to be orthogonal to the plane of FIG. 1 about a line approximately parallel to the vertical direction in FIG. 1. A portion of input beam 14 is split off by a non-polarizing beam splitter (not shown) and used as an input beam to the additional set of optical elements. The additional reference and measurement beams generated by the additional set of optical elements are incident on beam-steering assembly 12 and measurement object mirror 66 and generate an additional output beam. The description of the propagation of the additional reference and measurement beams and the generation of the additional output beam is the same as corresponding portions of the description given for the reference, measurement, and output beams of the first embodiment.

The polarization components of the additional output beam are mixed by a polarizer (not shown), the same as polarizer 72, and the additional mixed beam is detected by the additional detector and processor system (not shown) functionally the same as detector and processor system 82. The additional detector and processor system generates an additional error signal that is sent to an additional servo controller (not shown) functionally the same as servo controller 84. The additional servo controller generates an additional signal that is transmitted to beam-steering assembly 12 for control of angular orientations of beam-steering mirror 60 by additional transducers (not shown) in a plane orthogonal to the plane of FIG. 1 and orthogonal to the reflecting surface of beam-steering mirror 60. The description of the additional transducers is the same as the corresponding portions of the description given for transducers 62A and 62B.

The remaining description of the variant of the first embodiment is the same as corresponding portions of the description given for the first embodiment.

Figure 2:
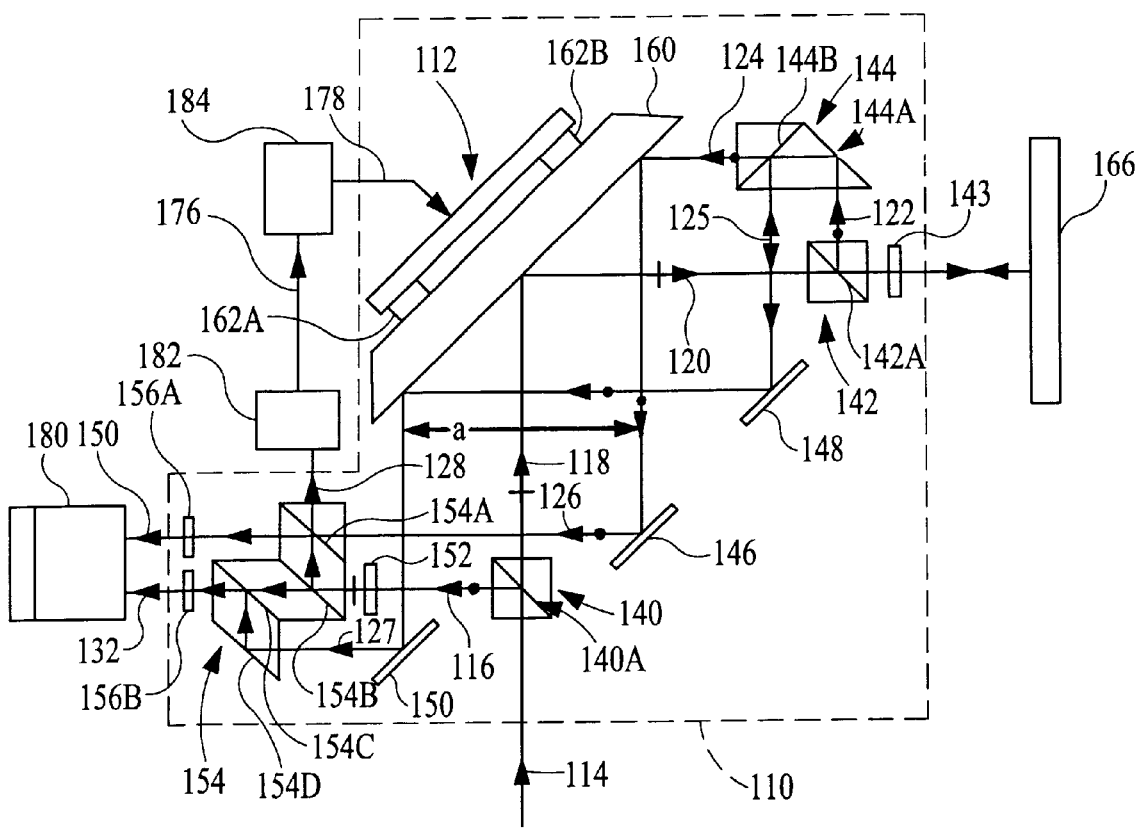
FIG. 2 is a schematic drawing of a second embodiment of the interferometry system.

A schematic of a second embodiment of the present invention is shown schematically FIG. 2. The second embodiment is from the first set of embodiments comprising two linear displacement interferometers in a non-stacked configuration and operating in non-null or displacement modes. In addition, a beam-steering assembly redirects the measurement beams of the two linear displacement interferometers by beam-redirecting element an even number of times in a manner such that the difference in respective optical paths is not sensitive in first order to a displacement of the beam-redirecting element. The second embodiment further comprises reflection of the measurement beams by the stage mirror where, at the measurement object mirror, the measurement beams are coextensive having orthogonal states of polarization. The redirecting properties and coextensive properties will hereinafter be referenced as the second system type.

A polarizing beam splitter 140 in interferometer 110 receives an input beam 114 from a laser source (not shown) and separates input beam 114 into reference beam 116 and measurement beam 118. The description of the source of input beam 114, reference beam 116, and measurement beam 118 is the same as corresponding portions of descriptions given for the source of input beam 14, reference beam 16, and measurement beam 18, respectively, of the first embodiment.

Measurement beam 118 is incident on the beam-steering assembly 112 and reflected by beam-steering mirror 160 as measurement beam 120. The description of beam-steering assembly 112 comprising beam-steering mirror 160 and transducers 162A and 162B is the same as corresponding portions of the description given for beam-steering assembly 12 comprising beam-steering mirror 60 and transducers 62A and 62B of the first embodiment.

Measurement beam 120 is incident on beam-splitter assembly 142 and transmitted by polarizing interface 142A, transmitted by quarter-wave phase retardation plate 143, and incident on measurement object mirror 166 at substantially normal incidence. Measurement object mirror 166 then reflects the measurement beam back to retrace its path to beam-splitter assembly 142 where it is reflected by polarizing interface 140A as measurement beam 122. The measurement beam double passes quarter-wave phase retardation plate 143 which is positioned between measurement object mirror 166 and beam-splitter assembly 142 and which rotates the linear polarization of the measurement beam by 90°.

Measurement beam 122 is incident on beam-splitter assembly 144, reflected by surface 144A, and a portion thereof transmitted by non-polarizing interface 144B as a first measurement beam 124. A second portion of measurement beam 122 reflected by surface 144A is reflected by non-polarizing interface 144B as a second measurement beam 125. First and second measurement beams 124 and 125 are linearly polarized perpendicular to the plane of FIG. 2. First measurement beam 124 is reflected by beam-steering mirror 160 and by mirror 146 as a first measurement beam 126. Second measurement beam 125 is first reflected by mirror 148, reflected by beam-steering mirror 160, and then reflected by mirror 150 as a second measurement beam 127. As shown in FIG. 2, the spatial separation of the first and second measurement beam following reflection by beam-steering mirror 160 is a.

Reference beam 116 is incident on half-wave phase retardation plate 152 and transmitted as a reference beam with its plane of polarization rotated by 90°. The polarization rotated reference beam is incident on beam-splitter assembly 154, a first portion thereof reflected by non-polarizing interface 154B, and a portion of the first portion reflected by non-polarizing interface 154B then transmitted by non-polarizing interface 154A as a reference beam component of a first output beam 128. A second portion of the first portion of the polarization rotated reference beam reflected by non-polarizing interface 154B is reflected by non-polarizing interface 154A and then transmitted by quarter-wave phase retardation plate 156A as a reference beam component of a second output beam 130. A second portion of polarization rotated reference beam is transmitted by non-polarizing interface 154B, subsequently transmitted by polarizing interface 154C, and then transmitted by quarter-wave phase retardation plate 156A is a reference beam component of a third output beam 132.

First measurement beam 126 is incident on beam-splitter assembly 154 and a first portion thereof is reflected by non-polarizing interface 154A as a measurement beam component of the first output beam 128. A second portion of the first measurement beam 126 is transmitted by non-polarizing interface 154A and then transmitted by quarter-wave phase retardation plate 156A as a measurement beam component of the second output beam 130. Second measurement beam 127 is incident on beam-splitter assembly 154, reflected by surface 154D, reflected by polarizing interface 154C, and then transmitted by quarter-wave phase retardation plate 156B as a measurement beam component of the third output beam 132. The first and second output beams are mixed optical beams with respect to respective reference and measurement beam components by way of the quarter-wave phase retardation plates 156A and 156B.

First output beam 128 is incident on a detector system 182 which measures the difference in directions of propagation of the reference and measurement components of the first output beam 128. The difference in directions of propagation can be detected using well known techniques comprising combinations of imaging optics, multiple detectors, multi-element detectors, phase-shifting arrays to alter properties of images formed by the imaging optics, and interferometric imaging and signal processing techniques. Detector system 182 sends an error signal 176 indicative of any such difference to servo controller 184 which in turn sends signal 178 to beam-steering assembly 112 in response to error signal 176. Beam-steering assembly 112 changes, in response to signal 178, the orientation of beam-steering mirror 160 preferably about a point on the reflecting surface of beam-steering mirror 160 midway between the locations where first and second measurement beams contact beam-steering mirror 160. Changes in orientation about the point rather than some other point generally produces substantially reduced lateral shear effects experienced by the first and second measurement beams on beam-steering mirror 160.

Alternatively when the direction of the input beam 114 is constant, detector system 182 can measure a change in direction of propagation of the measurement beam component of first output beam 128 with respect to a reference direction in detector system 182 and generate error signal 178 indicative of that change in direction. In another alternative, detector system 182 comprises angular displacement interferometers to measure changes in directions of propagation of the reference and measurement beam components of first output beam 128. Each of the angular displacement interferometers is based on one of the angular displacement interferometers subsequently described herein.

A change in the angular orientation of measurement object mirror 166 changes the direction of the first measurement beam and the direction of subsequent measurement beam component of first output beam 128. This causes detector system 182 to generate error signal 176. Servo-controller 184 responds to error signal 176 by directing beam-steering assembly 112 to reorient beam-steering mirror 160 so as to minimize error signal 176, e.g., by directing the measurement beam to measurement object mirror 166 at normal incidence.

As a result of the servo control operation to minimize error signal 176, the respective reference and measurement beam components of output beams 128, 130 and 132 remain substantially parallel, respectively, and the location of the paths of first, second, and third output beams 128, 130, and 132 remain substantially constant over a range of angular orientations of stage-mirror 166. Furthermore, since the angle of incidence of the first and second measurement beams on beam-steering mirror 160 are substantially equal, there is no first order effect of a translation of beam-steering mirror 160, particularly in a direction normal to the reflecting surface of beam-steering mirror 160, on the relative optical path length between the first and second measurement beams. These properties will be referenced hereinafter as properties of a second system type.

Interferometer system 110 and measurement object mirror 166 introduce phase shifts $\phi_2$ and $\phi_3$ between the measurement beam and reference beam components of second and third output beams 130 and 132, respectively. Detector and signal processor system 180 measures the intensity of mixed beams 130 and 132, e.g., by photoelectric detection, to produce electrical interference signals or electrical heterodyne signals $s_2$ and $s_3$, respectively, extracts the phases $\phi_2$ and $\phi_3$ of the electrical heterodyne signals, $s_2$ and $s_3$, respectively, and determines from the phase difference $\phi_3-\phi_2$ the angle $\theta_2$ of measurement object mirror 166. Angle $\theta_2$ is a relative orientation of a normal to the reflecting surface of measurement object mirror 166 in the plane of FIG. 2 and is computed using the formula $$\theta_2 = 2\arctan\left[\frac{\eta_2}{1+\eta_2}\right] - \int\left(\frac{\partial n_M}{\partial r}\right)ds \qquad (8)$$

where $$\eta_2 = \left[\frac{(\varphi_3-\varphi_2)}{2n_M ka}\right], \qquad (9)$$

the integration is along the optical path of the measurement beam components comprising a gas, and $(\partial n_M/\partial s)$ is the partial derivative of the refractive index of the optical path of the measurement beam comprising the gas at a respective point along the measurement path with respect to a vector orthogonal to the optical path of the measurement beam and parallel to the plane of FIG. 2. The effects of gradients in the refractive index on the direction of propagation of a beam are described for example in an article entitled "Compensation for the Lateral Color Aberration Produced by the Atmosphere" by H. A. Hill and C. A. Zanoni, *JOSA* 56, 1655–1659 (1966). In the second embodiment, detector and signal processor system 180 form an angle detection system that directly calculates the relative angular orientation of measurement object mirror 166. Similar angle detection systems are also formed in subsequent embodiments unless otherwise specified. In embodiments where the interferometric measurement is made at only one wavelength, such as in the presently described embodiment, the integral term in Eq. 2 can be ignored, and an approximate value for $\theta_2$ is measured by the system based only on the first term in Eq. 2. A method for correcting the measured angle $\theta_2$ for the integral term in Eq. 2 is described further below and involves measuring the angle at multiple wavelengths.

The classification of the second embodiment as two linear displacement interferometers operating in an angular displacement mode, a non-null mode, is a result of the procedure wherein the difference in phase $\phi_3-\phi_2$ is not servoed to a zero value and is a direct measure within a factor of two of the relative orientation of the measurement object mirror as a function of time.

Turbulent effects of the gas are not present in the phase difference $\phi_3-\phi_2$ and therefore not present in $\eta_2$ since the measurement beams have substantially identical paths in the gas. Environmental and turbulent effects of the gas in the measurement path effect the measurement of the orientation of measurement object mirror 166 substantially only through environmental and turbulent effects on the gradient of the refractive index of the gas along the measurement path [see Eq. (8)].

Cyclic error contributions to $\Lambda_3-\Lambda_2$ can be reduced and/or measured and compensated in part or whole the same as described for the first embodiment. The description of the phase-offset difference $\zeta_3-\zeta_2$ is the same with respect to general properties and to measurement and monitoring s corresponding portions of the description given for phase offset in the first embodiment.

The phase difference $\phi_3-\phi_2$ may alternatively be obtained from the phase of a superheterodyne signal generated by mixing of electrical heterodyne signals $s_2$ and $s_3$. The Doppler shift contributions to $\phi_2$ and $\phi_3$, arising from motion of measurement object mirror 166, are substantially the same. Thus, Doppler shift effects are compensated in a superheterodyne phase $\phi_3-\phi_2$. A significant consequence is that the superheterodyne $\phi_3-\phi_2$ comprises substantially lower frequency components than do both $\phi_2$ and $\phi_3$. Thus, the acquisition of a measurement of phase difference $\phi_3-\phi_2$ to a given accuracy is generally a less demanding task when measuring phase $\phi_3-\phi_2$ directly as a superheterodyne phase in comparison to first making measurements of phases $\phi_2$ and $\phi_3$ individually and than computing the phase difference $\phi_3-\phi_2$.

The description of the advantage of the second embodiment vis-à-vis Doppler shift compensation is the same as corresponding portions of description given for the advantages of Doppler shift compensation in superheterodyne methods and apparatus in copending, commonly owned U.S. patent application with Ser. No. 09/252/266 filed Feb. 18, 1999 entitled "Interferometer And Method For Measuring The Refractive Index And Optical Path Length Effects of Air" by P. De Groot, H. A. Hill, and F. C. Demarest and U.S. patent application with Ser. No. 09/252,440 filed Feb. 18, 1999 entitled "Apparatus And Method For Measuring The Refractive Index And Optical Path Length Effects Of Air Using Multiple-Pass Interferometry" by H. A. Hill, P. de Groot, and F. C. Demarest. The contents of both copending applications are incorporated herein by reference.

Note that $\theta_1$ of the first embodiment and $\theta_2$ of the second embodiment exhibit the same sensitivity to gradients in the refractive index of gas in respective measuring paths.

A variant of the second embodiment is described in which the angular displacement of an object in two orthogonal planes is measured and monitored. The description of the variant of the second embodiment in relation to the second embodiment is substantially the same as the description of the variant of the fifth embodiment in relation to the fifth embodiment of the present invention, which will be described further below.

Figure 3:
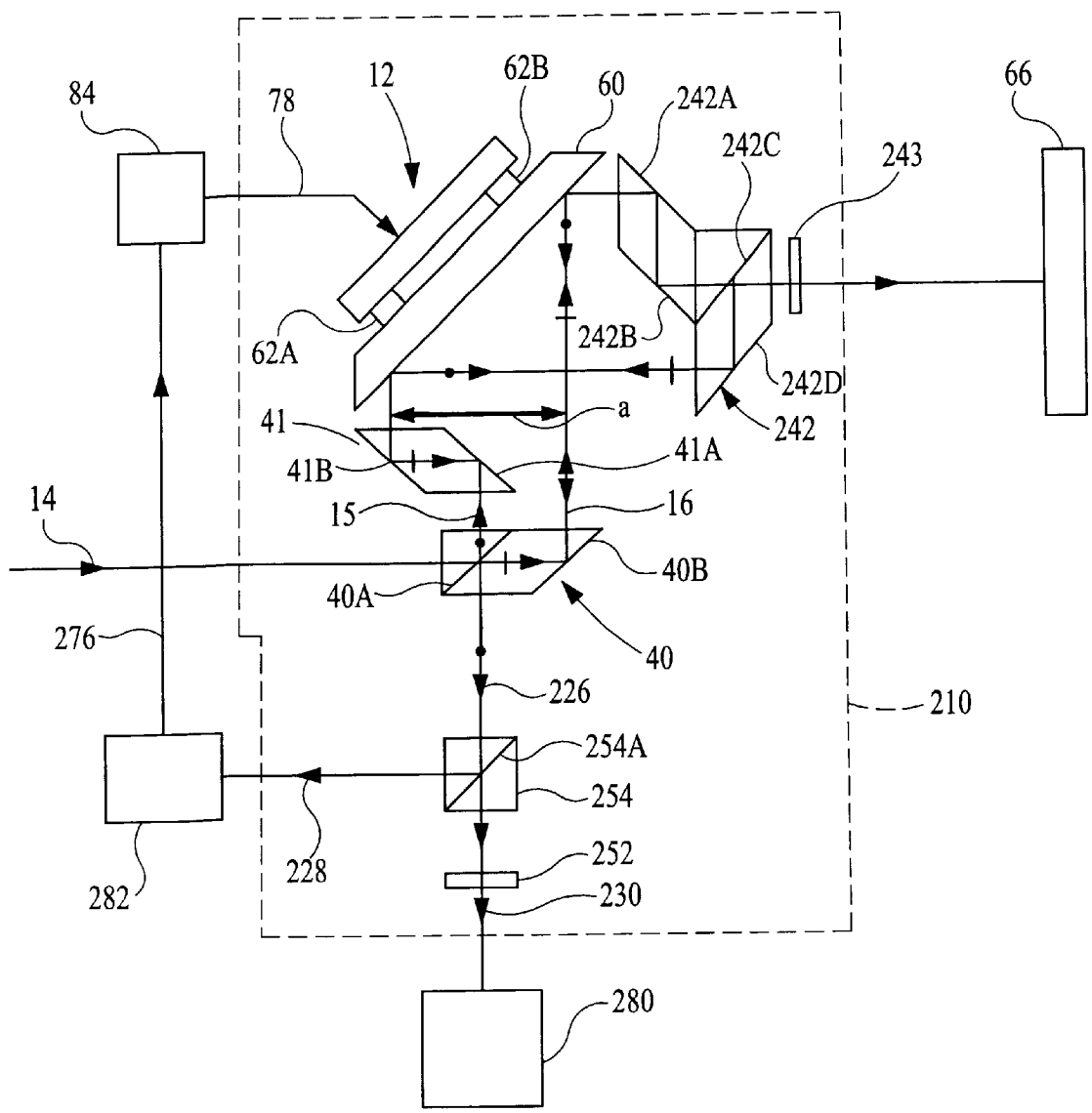
FIG. 3 is a schematic drawing of a third embodiment of the interferometry system.

FIG. 3 shows a schematic of a third embodiment of the present invention. The third embodiment is from the first set of embodiments comprising a single interferometer operating in a non-null or angular displacement mode. In addition, a beam-steering assembly redirects both the reference and measurement beams of the angular displacement interferometer by a beam-redirecting element an even number of times in a manner to not be sensitive in first order to a displacement of the beam-redirecting element. The third embodiment further comprises reflection of the reference beam and measurement beam by the stage mirror where, at the measurement object mirror, the reference and measurement beams are coextensive having orthogonal stages of polarization. The redirecting properties and coextensive properties will hereinafter be referenced as the third system type.

Certain of the elements and assemblies of the third embodiment perform like functions as like numbered elements and assemblies of the first embodiment shown in FIG. 1. The description of the certain of the elements and assemblies are the same as the description given for corresponding elements and assemblies of the first embodiment. Beam-splitting assembly 242 and quarter-wave phase retardation plate 243 are arranged so that the reference and measurement beams in a region between quarter-wave phase retardation plate 243 and measurement object mirror 66 are coextensive beams and thus propagate as coextensive beams in a gas in the region.

As shown in FIG. 3, beam-splitter assembly 40 directs reference beam 15 to rhomb 41. Rhomb 41 directs the reference beam to beam-steering assembly 12 that directs the reference beam to beam-splitter assembly 242. The reference beam is reflected by reflecting surface 242D, reflected by polarizing interface 242C, and directed to contact measurement object mirror 66 at substantially normal incidence. Measurement object mirror 66 then reflects the reference beam back to retrace its path to beam-splitter assembly 242. The reference beam double passes quarter-wave phase retardation plate 243 which rotates the linear polarization of the reference beam by 90°.

The polarization rotated reference beam is then transmitted by polarizing interface 242C, reflected by reflecting surfaces 242B and 242A, and directed to beam-steering mirror 60. The polarization rotated reference beam is reflected by beam-steering mirror 60 and directed to beam-splitter assembly 40. The polarization rotated reference beam is reflected by reflecting surface 40B and then reflected by polarizing interface 40A as a reference beam component of output beam 226.

As also shown in FIG. 3, beam-splitter assembly 40 directs measurement beam 16 to beam-steering assembly 12 which in turn directs the measurement beam to beam-splitter assembly 242. The measurement beam is reflected by reflecting surfaces 242A and 242B, transmitted by polarizing interface 242C, and directed to contact measurement object mirror 66 at substantially normal incidence. Measurement object mirror 66 then reflects the measurement beam back to retrace its path to beam-splitter assembly 242. The measurement beam double passes quarter-wave phase retardation plate 243 which rotates the linear polarization of the measurement beam by 90°.

The polarization rotated measurement beam is then reflected by polarizing interface 242C, reflected by reflecting surface 242D, and directed to beam-steering mirror 60. The polarization rotated measurement beam is reflected by beam-steering mirror 60 and directed to rhomb 41. The polarization rotated measurement beam is reflected by reflecting surfaces 41B and 41A and then transmitted by polarizing interface 40A as a measurement beam component of output beam 226.

Output beam 226 is incident on beam-splitter assembly 254 and a first portion thereof reflected by non-polarizing interface 254A as s first output beam 228. A second portion of the measurement beam 226 is transmitted by non-polarizing interface 254A and then transmitted by quarter-wave phase retardation plate 252 as second output beam 230. Second output beam 230 is a mixed optical beam with respect to respective reference and measurement beam components by way of the quarter-wave phase retardation plate 252.

The first output beam 228 is incident on a detector system 282 that generates error signal 276. The description of detector system 282 and error signal 276 is the same as corresponding portions of the description given for detector system 182 and error signal 176 of the second embodiment. Servo controller 84 receives error signal 276 and generates signal 278.

Interferometer system 210 and measurement object mirror 66 introduce a phase shift $\phi_4$ between the measurement and reference components of mixed output beam 230 and detector and signal processor system 280 measures the intensity of mixed output beam 230, e.g., preferably by photoelectric detection, to produce electrical interference signal or electrical heterodyne signal $s_4$. Detector and signal processor system 280 extracts the phase of the electrical heterodyne signal $s_4$, determines phase $\phi_4$ from the extracted phase, and determines the angle $\theta_4$ of stage mirror 66 from $\phi_4$. The angle $\theta_4$ is a relative orientation of a normal to the reflecting surface of stage mirror 66 in the plane of FIG. 3 and computed using the formula $$\theta_4 = 4\arctan\left[\frac{\eta_4}{1+\eta_4}\right] - \int\left(\frac{\partial n}{\partial r}\right) ds \qquad (10)$$

where $$\eta_4 = \left[\frac{\varphi_4}{2n_M ka}\right], \qquad (11)$$

the integration is along the optical path of the reference and measurement beams comprising a gas, and $(\partial n/\partial s)$ is the partial derivative of the refractive index of the gas with respect to a vector orthogonal to the optical path of the reference and measurement beams and parallel to the plane of FIG. 3. As shown in FIG. 3, parameter a is the separation of measurement beam 16 and the reference beam generated by the redirection of reference beam 15 by rhomb 41. In embodiments where the interferometric measurement is made at only one wavelength, such as in the presently described embodiment, the integral term in Eq. 10 can be ignored, and an approximate value for $\theta_4$ is measured by the system based only on the first term in Eq. 10. A method for correcting the measured angle $\theta_4$ for the integral term in Eq. 10 is described further below and involves measuring the angle at multiple wavelengths.

Cyclic error contributions to $\Lambda_4$ can be reduced and/or measured and compensated in part or whole the same as described for the first embodiment. The description of the properties of the phase-offset difference $\zeta_4$ and the measurement and monitoring thereof is the same as corresponding portions of the description given for phase offset of the first embodiment.

The description of the Eqs. (10) and (11), the relationship between the orientations of the beam-steering mirror and the measurement object mirror, and measured phases of the third embodiment are the same as corresponding portions of description given for the second embodiment, in particular the description given with respect to the superheterodyne mode of operation. The remaining description of the third embodiment is same as corresponding portions of descriptions given for the first and second embodiments.

A variant of the third embodiment is described in which the angular orientation of an object in two orthogonal planes is measured and monitored. The description of the variant of the third embodiment in terms of the third embodiment is substantially the same as the corresponding portion of the description given for the variant of the fifth embodiment in terms of the fifth embodiment, which will be described below.

A fourth embodiment of the present invention is described comprising an interferometer system and a dynamic-beam-steering assembly for a measurement of the orientation of an object, e.g., a stage mirror. The fourth embodiment is from the first set of embodiments comprising a single angular displacement interferometer and operating in non-null or displacement mode. In addition, a beam-steering assembly redirects the reference and measurement beams of the angular displacement interferometer. The fourth embodiment is shown schematically in FIGS. 4a and 4b. The fourth embodiment comprises an interferometer with a beam-steering assembly redirecting both reference and measurement beams by a beam-redirecting element an even number of times in a manner to not be sensitive in first order to a linear displacement of the beam-redirecting element. The redirection of both reference and measurement beams of an interferometer by a beam-redirecting element an even number of times is feature of the first system type the same as employed in the first embodiment of the present invention. The first system type further comprises the reflection of both the reference beam and the measurement beam by the measurement object mirror where, at the measurement object mirror, the reference and measurement beams are substantially parallel and spatially separated.

The description of input beam 310 in FIG. 4a is the same as the description of input beam 14 of the first embodiment of the present invention. Beams 313, 315, 321, 329, 331, 333, 335, and 336 comprise reference and measurement beam components with corresponding reference and measurement beam components being orthogonally polarized. Beam 310 is reflected by a first surface of beam steering mirror 352 as beam 313. Beam steering mirror 352 and orientation transducers 353A and 353B comprise a beam steering assembly that redirects beam 313. Beam 313 is reflected by mirror 354 and enters mirror assembly 356 as beam 315. As shown in FIG. 4b, mirror assembly 656 is comprised of three mirrors 356A, 356B, and 356C. The plane of FIG. 4b is orthogonal to the plane of FIG. 4a. Beam 315 is reflected by each of the three mirrors 356A, 356B, and 356C and exits mirror assembly 356 as beam 321. Mirror assembly 356 is an image inverter about an axis in the plane of FIG. 4a and orthogonal to the direction of propagation of beam 315. However, the primary function of mirror assembly 356 is to transform a change in the direction of propagation of beam 315 in the plane of FIG. 4b to a change in the opposite direction of propagation of beam 321 in the plane of FIG. 4b and to translate a change in direction of beam 315 in the plane of FIG. 4a to the same change in direction of propagation of beam 321 in the plane of FIG. 4a.

The measurement beam component of beam 321, being polarized in the plane of FIG. 4a, is transmitted by polarizing beam splitter 358 as beam 323. Beam 323, polarized in the plane of FIG. 4a, is transmitted by a quarter wave phase retardation plate 360 as a circularly polarized beam, reflected by measurement object mirror 362 as a beam with opposite-handed circular polarization, and subsequently transmitted by quarter wave phase retardation plate 360 as beam 327 linearly polarized perpendicular to the plane of FIG. 4a. Beam 327 is reflected by beam splitter 358 as the measurement beam component of beam 329.

As shown in FIG. 4a, the reference beam component of beam 321 is reflected by polarizing beam splitter 358 as reference beam 324. Mirror 357 directs reference beam 324 to contact measurement object mirror 362. Measurement object mirror 362 then reflects the reference beam back to retrace its path to polarizing beam splitter 358 as reference beam 328. The reference beam also double passes a quarter-wave phase retardation plate 361 that rotates the linear polarization of the reference beam by 90°. The polarization-rotated reference beam is transmitted by polarizing beam splitter 358 as the reference beam component of beam 329.

Beam 329 is reflected by mirrors 364A and 364B to form beam 331. Mirrors 364A and 364B together produce a constant deviation between beams 329 and 331 in the plane of FIG. 4a, the same as a penta prism. Beam 331 is reflected from a second surface of beam steering mirror 352 as beam 333. A change in the orientation of measurement object mirror 362 will effect a change in direction of propagation and lateral shear of beam 333 at beam steering mirror 352. It is possible to compensate for both of the effects on beam 333 by an appropriate change in the orientation of beam steering mirror 352 in conjunction with image inverter 356, beam splitter 358, constant deviation mirror assembly comprising mirrors 364A and 364B, and measurement object mirror 362 located in the path of the measurement beam between the first and second reflections from beam steering mirror 352. Then, beam 333 is reflected by mirror 366 as beam 335, which is reflected by mirror 372 as beam 336.

Beam 336 comprises orthogonally polarized reference and measurement beam components. A portion of beam 336 is reflected by non-polarizing beam splitter 374 as first output beam 338. Beam 338 impinges on detector 376 to produce an electrical signal 344 related to any difference in the directions of propagation of measurement and reference beam components in beam 338. Alternatively, detector 376 may comprise angular displacement interferometer(s) to measure changes in directions of propagation of the reference and/or measurement beam components of first output beam 338. Each of the angular displacement interferometers is based on one of the angular displacement interferometers subsequently described herein. Electrical signal 344 is transmitted to orientation transducers 353A and 353B. Information contained in signal 344 is used as the error signal in a servo system to alter the orientation of beam steering mirror 352 by orientation transducers 353A and 353B so as to maintain the direction of propagation of beam 333 substantially constant independent of changes of orientation of measurement object mirror 362.

A second portion of 336 is transmitted by non-polarizing beam splitter 374 as a second output beam 340. Second output beam 340 is transmitted by polarizer 378 as a mixed output beam 342.

Interferometer system 300 and measurement object mirror 362 introduces a phase shift $\phi_5$ between the measurement and reference beam components of mixed output beam 342. A detector 380 measures the intensity of mixed output beam 342, e.g., preferably by photoelectric detection, to produce electrical interference signal or electrical heterodyne signal $s_5$. Heterodyne signal $s_5$ is transmitted to electronic processor and computer 382 in either digital or analog format, preferably in digital format. Electronic processor and computer 382 extracts the phase of heterodyne signal $s_5$, determines phase $\phi_5$ from the phase, and determines an orientation angle $\theta_5$ of measurement object mirror 362 from phase $\phi_5$. Angle $\theta_5$ is an orientation of a normal to the reflecting surface of measurement object mirror 362 relative to a selected reference line, the normal and the reference line lying in the plane of FIG. 4a in the plane of FIG. 4a and is computed using the formula $$\theta_5 = 4\arctan\left[\frac{\eta_5}{1-\eta_5}\right] \quad (12)$$

where $$\eta_5 = \left[\frac{\varphi_5}{2n_M k a}\right] \quad (13)$$

$$\varphi_5 = k\left[\int_M n ds - \int_R n ds\right], \quad (14)$$

the integrations in Eq. (14) are along the respective measurement and reference optical paths portions of which include the gas, and parameters a is the separation of reference and measurement beams as shown in FIG. 4a.

The remaining description of the fourth embodiment is the same as corresponding portions of descriptions given for the first embodiment of the present invention.

A variant of the fourth embodiment of the present invention is described comprising two interferometers and a dynamic beam-steering assembly for a measurement of the orientation of an object, e.g., a stage mirror, in two orthogonal planes. The description of the variant of the fourth embodiment in terms of the fourth embodiment is substantially the same as the subsequently presented description of the variant of the fifth embodiment in terms of the fifth embodiment of the present invention, which will be described below.

A fifth embodiment of the present invention is described comprising an interferometer and a dynamic beam-steering assembly for a measurement of an orientation of an object, e.g., a stage mirror. The fifth embodiment is from the first set of embodiments comprising a single interferometer operating in a non-null or angular displacement mode. In addition, a beam-steering assembly redirects both the reference and measurement beams of the angular displacement interferometer. The fifth embodiment is shown schematically in FIGS. 5a and 5b.

The fifth embodiment is of the third system type, the same as that employed in the third embodiment of the present invention, and comprises an interferometer with a dynamic beam-steering assembly redirecting both the reference and measurement beams of the interferometer by a beam-redirecting element an even number of times in a manner to not be sensitive in first order to a displacement of the beam-redirecting element. The third system type further comprises the reflection of a reference beam and measurement beam by a measurement object mirror where, at the measurement object mirror, the reference and measurement beams are coextensive having orthogonal states of polarization.

A number of the elements of the fifth embodiment perform like functions as elements of the fourth embodiment described herein. The element numbers of elements in FIGS. 5a and 5b performing like functions in the fifth embodiment of the present invention are 100 more than the element numbers of the corresponding elements of the fourth embodiment.

Figures 5A, 5B:
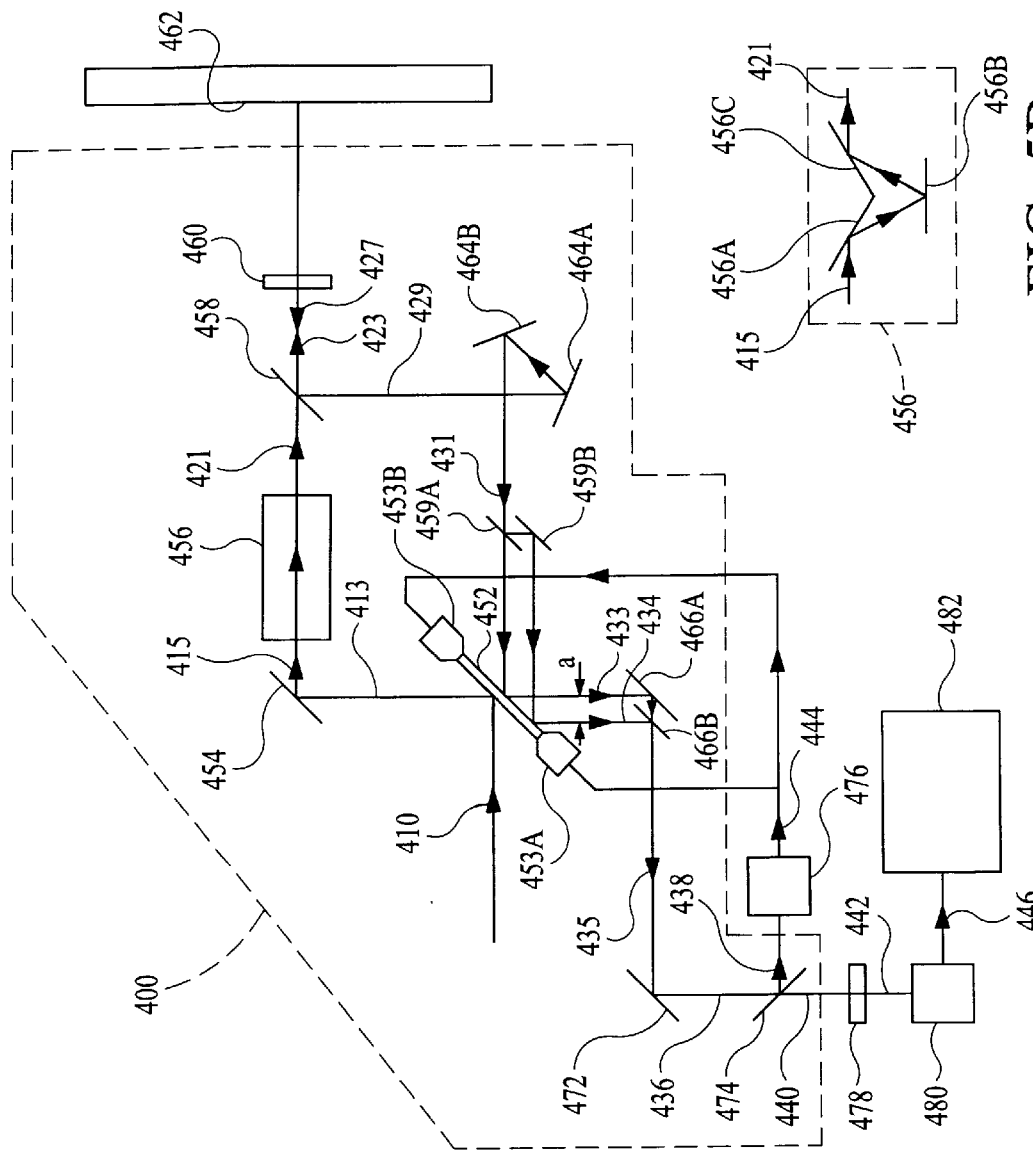

The description of input beam 410 in FIG. 5a is the same as the description given of input beam 14 of the first embodiment of the present invention. Beams 413, 415, 421, 423, 427, 429, 431, 435, and 436 comprise reference and measurement beam components with corresponding reference and measurement beam components having orthogonal states of polarization. The description of beams 413, 415, 421, 423, 427, 429, 431, 435, and 436 are the same as corresponding portions of the description given for beams 313, 315, 321, 323, 327, 329, 331, 335, and 336 of the fourth embodiment.

In FIG. 5a, measurement beam component of beam 431 is transmitted by polarizing beam splitter 459A and reflected by beam-steering mirror 452 as measurement beam 433. Measurement beam 433 is reflected by mirror 466A and transmitted by polarizing beam splitter 466B as the measurement beam component of beam 435. Reference beam component of beam 431 is reflected by polarizing beam splitter 459A, reflected by mirror 459B, and then reflected by beam-steering mirror 452 as reference beam 434. Reference beam 434 is reflected by polarizing beam splitter 466B as the reference beam component of beam 435.

The description first output beam 438, detector 476, and signal 444 is the same as corresponding portions of the description given of beam 338, detector 376, and signal 344 of the fourth embodiment. Alternatively, detector 476 may comprise angular displacement interferometer(s) to measure changes in directions of propagation of the reference and/or measurement beam components of first output beam 438. Each of the angular displacement interferometers is based on one of the angular displacement interferometers subsequently described herein.

Interferometer system 400 and stage mirror 462 introduce a phase shift $\phi_6$ between the measurement and reference beam components of the second output beam 440 and mixed output beam 442. A detector 480 measures the intensity of mixed output beam 442, e.g., preferably by photoelectric detection, to produce electrical interference signal or electrical heterodyne signal $s_6$. Heterodyne signal $s_6$ is transmitted to electronic processor and computer 482 in either digital or analog format, preferably in digital format. Electronic processor and computer 482 extracts the phase of heterodyne signal $s_6$, determines phase $\phi_6$ from the phase, and determines from phase $\phi_6$ an orientation angle $\theta_6$ of measurement object mirror 462. Angle $\theta_6$ is an orientation of a normal to the reflecting surface of measurement object mirror 462 relative to a selected reference line in the plane of FIG. 5a and is computed using the formula $$\theta_6 = 2\arctan\left[\frac{\eta_6}{1+\eta_6}\right] - \int\left(\frac{\partial n}{\partial r}\right)ds \quad (15)$$

where $$\eta_6 = \left[\frac{\varphi_5}{2n_M ka}\right], \quad (16)$$

the integration is along the coextensive optical paths of the reference and measurement beams comprising a gas, and (∂n/∂s) is the partial derivative of the refractive index of the optical path at a respective point along the coextensive reference and measurement beam paths with respect to a vector orthogonal to the optical path of the measurement and reference beams and parallel to the plane of FIG. 5c. In embodiments where the interferometric measurement is made at only one wavelength, such as in the presently described embodiment, the integral term in Eq. 15 can be ignored, and an approximate value for $\theta_6$ is measured by the system based only on the first term in Eq. 15. A method for correcting the measured angle $\theta_6$ for the integral term in Eq. 15 is described further below and involves measuring the angle at multiple wavelengths.

The classification of the fifth embodiment as comprising an angular displacement interferometer operating in an angular displacement mode, a non-null mode, is a result of the procedure wherein the phase $\phi_6$ is not servoed to a zero value and is a direct measure within a factor of two of the relative orientation of the measurement object mirror as a function of time.

The remaining description of the fifth embodiment is the same as corresponding portions of the description given for the second and fourth embodiments of the present invention.

A variant of the fifth embodiment of the present invention from the first set of embodiments is shown schematically in FIGS. 5c–5g comprising two interferometers and a dynamic beam-steering assembly for a measurement of an orientation of an object, e.g., a stage mirror, in two orthogonal planes. A first interferometer measures changes in the orientation of measurement object mirror 462 in the plane of FIG. 5c and a second interferometer measures changes in the orientation of measurement object mirror 462 in a plane parallel to beam 431 and orthogonal to the plane of FIG. 5c. The beam-steering assembly is configured with transducers and a support structure for the associated beam-steering mirror appropriate for control the angular orientation of the beam-steering mirror in two orthogonal planes. Detector 476 in the variant of the fifth embodiment is configured to measure in the two orthogonal planes changes in directions of propagation of the reference and/or measurement beam components of first output beam 438. Information contained in signal 444 in the variant of the fifth embodiment is used as the error signal in a servo control system to alter the orientation of the beam-steering mirror in the two orthogonal planes by the transducers.

Figure 5E:
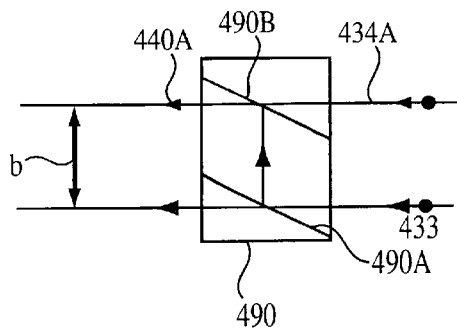
Figure 5F:
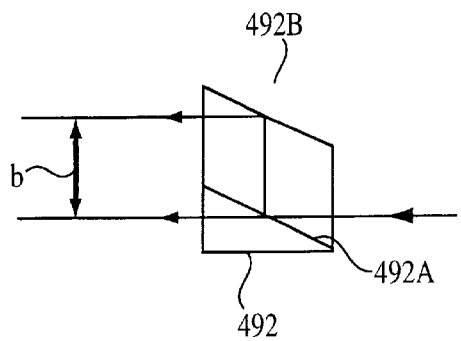

The first interferometer comprises the interferometer of the fifth embodiment of the present invention and beam splitter assemblies 490 and 492 shown in FIGS. 5c, 5e, and 5f. The planes of FIGS. 5e and 5f are orthogonal to the plane of FIG. 5c. A portion of measurement beam 433 is transmitted by polarizing interface 490A (see FIG. 5e). A portion of the reference beam reflected by mirror 459B is transmitted by non-polarizing interface 492A as reference beam 434 (see FIG. 5f). The net effect of beam splitter assemblies 490 and 492 on the first interferometer is to decrease the magnitude of the measurement and reference beam components of beam 435 preferably by approximately the same factor. The remaining description of the first interferometer is the same as corresponding portions of the description given for the fourth embodiment.

Figure 5G:
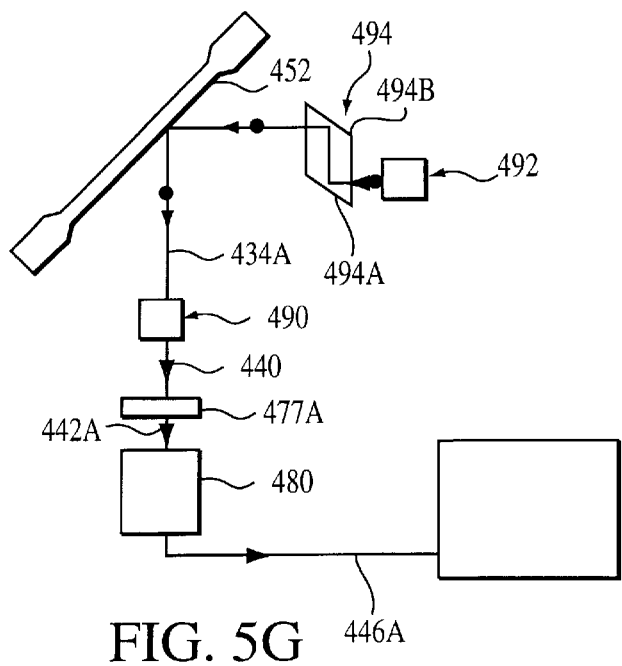

The second interferometer comprises elements of the first interferometer up through beam-steering mirror for the measurement beam, up through mirror 459B for the reference beam, and elements shown in FIG. 5g. A second portion of the measurement beam 433 is reflected by non-polarizing interface 490A and then reflected by polarizing interface 490B as a measurement beam component of a third output beam 440A. (see FIGS. 5e and 5g) The planes of FIGS. 5c and 5g are separated by a distance b as shown in FIGS. 5e and 5f. A second portion of the reference beam incident on beam-splitter assembly 492 is reflected by non-polarizing interface 492A as a second reference beam and then reflected by surface 492B (see FIG. 5f). The second reference beam exiting beam-splitter assembly 492 is incident on rhomb 494 and after two internal reflections by surfaces 494A and 494B, is reflected by beam-steering mirror 452 as reference beam 434A. Reference beam 434A and measurement beam 433 lie in the plane of FIG. 5e that is preferably orthogonal to the planes of FIGS. 5c and 5g. Reference beam 434A is incident on beam-splitter assembly 490 and transmitted by polarizing interface 490B as the reference beam component of the third output beam 440A.

Third output beam 440A is transmitted by a polarizer 478A as a mixed output beam 442A (see FIG. 5g). The second interferometer and measurement object mirror 462 introduce a phase shift $\phi_{6A}$ between the measurement and reference beam components of the third output beam 440A and mixed output beam 442A. A detector 480A measures the intensity of mixed output beam 442A, e.g., preferably by photoelectric detection, to produce electrical interference signal or electrical heterodyne signal $s_{6A}$. Heterodyne signal $s_{6A}$ is transmitted as electronic signal 446A, preferably in digital format, to electronic processor and computer 482A. Electronic processor and computer 482A extracts the phase from heterodyne signal $s_{6A}$, determines phase $\phi_{6A}$ from the phase, and determines the orientation angle $\theta_{6A}$ from phase $\phi_{6A}$ by the same procedures and corresponding equations as used by electronic processor and computer 482, with parameter a replaced by parameter b, to extract the phase of heterodyne signal $s_6$ and determines the orientation angle $\theta_6$. The orientation angle $\theta_{6A}$ indicates the orientation of normal to the surface of measurement object mirror 462 relative to a selected reference line, both the normal and the reference line lying in a plane defined by the plane of the second measurement and reference beams.

The remaining description of the variant of the fifth embodiment is the same as corresponding portions of the description given for the fifth embodiment of the present invention.

A sixth embodiment of the present invention is shown schematically in FIGS. 6a and 6b comprising an interferometer system and a dynamic beam-steering assembly for an orientation measurement of an object, e.g., a stage mirror. The sixth embodiment is from the first set of embodiments comprising two linear displacement interferometers arranged to make angular displacements operating in non-null or displacement mode. The sixth embodiment is further of the second system type, the same system type as the second embodiment of the present invention, wherein a beam-steering assembly redirects the measurement beams of the linear displacement interferometer.

A number of the elements of the sixth embodiment perform like functions as elements of the fourth embodiment described herein. The element numbers of elements in FIGS. 6a and 6b performing like functions in the fourth embodiment are 200 more than the element numbers of the corresponding elements of the fourth embodiment.

The description of input beam 510 in FIG. 6a is the same as the description of input beam 14 of the first embodiment of the present invention. The description of measurement beams 511 through measurement beam 531 is the same as corresponding portions of the description given for measurement beams 311 through measurement beam 331 of the fourth embodiment. A portion of measurement beam 531 is transmitted by non-polarizing beam splitter 559A and reflected by beam-steering mirror 552 as a first measurement beam 533. First measurement beam 533 is reflected by mirror 566A as first measurement beam 535. First measurement beam 535 is reflected by polarizing beam splitter 572 as a measurement beam component of beam 536. A second portion of measurement beam 531 is reflected by non-polarizing beam splitter 559A, reflected by mirror 559B, and then reflected by beam-steering mirror 552 as a second measurement beam 534. As shown in FIG. 6a, first and second measurement beams 533 and 534 are separated by a distance a. Second measurement beam 534 is reflected by mirror 566B as second measurement beam 539. Second measurement beam 539 is reflected by polarizing beam splitter 575 as a measurement beam component of a third output beam 541.

A portion of reference beam 516, as shown in FIG. 6a, is first transmitted by non-polarizing beam splitter 571 and then transmitted by polarizing beam splitter 572 as a reference beam component of beam 536. A second portion of reference beam 516 is reflected by non-polarizing beam splitter 571, reflected by mirror 573, and then transmitted by polarizing beam splitter 575 as a reference beam component of the third output beam 541.

A portion of beam 536 is reflected by non-polarizing beam splitter 574 as a first output beam 538. The description first output beam 538, detector 576, and signal 544 is the same as corresponding portions of the description given of beam 438, detector 476, and signal 444 of the fifth embodiment of the present invention.

A second portion of beam 536 is transmitted by non-polarizing beam splitter 574 as a second output beam 540. Second output beam 540 is transmitter by analyzer 578 as mixed second output beam 542, the polarization states of the reference beam component and the measurement beam component of the mixed second output beam being the same. Third output beam 541 is transmitted by analyzer 579 as mixed third output beam 543, the polarization states of the reference beam component and the measurement beam component of the mixed third output beam being the same.

Interferometer system 500 and measurement object mirror 562 introduce phase shifts $\phi_7$ and $\phi_8$ between the measurement and reference beam components of mixed second and third output beams 542 and 543, respectively. Detectors 580 and 581 measure the intensities of mixed second and third output beams 542 and 543, respectively, e.g., preferably by photoelectric detection, to produce electrical interference signals or electrical heterodyne signals $s_7$ and $s_8$, respectively. Heterodyne signals $s_7$ and $s_8$ are transmitted to electronic processor and computer 582 as signals 546 and 547, respectively, in either digital or analog format, preferably in digital format. Electronic processor and computer 582 extracts the phases of heterodyne signals $s_7$ and $s_8$, determines phases $\phi_7$ and $\phi_8$ from the extracted phases, and determines from the phase difference $\phi_8-\phi_7$ an orientation angle $\theta_7$ of measurement object mirror 562. Angle $\theta_7$ is an orientation of a normal to the reflecting surface of measurement object mirror 462 relative to a selected reference line in the plane of FIG. 6a and is computed using the formula $$\theta_7 = 2\arctan\left[\frac{\eta_7}{1+\eta_7}\right] - \int\left(\frac{\partial n_M}{\partial r}\right)ds \quad (17)$$

where $$\eta_7 = \left[\frac{(\varphi_3 - \varphi_7)}{2n_M ka}\right] \quad (18)$$

the integration is along the optical path of the measurement beam comprising the gas, and $(\partial n_M/\partial s)$ is the partial derivative of the refractive index of the optical path comprising the gas at a respective point along the measurement path with respect to a vector orthogonal to the optical path of the measurement beam and parallel to the plane of FIG. 6a. In embodiments where the interferometric measurement is made at only one wavelength, such as in the presently described embodiment, the integral term in Eq. 17 can be ignored, and an approximate value for $\theta_7$ is measured by the system based only on the first term in Eq. 17. A method for correcting the measured angle $\theta_7$ for the integral term in Eq. 17 is described further below and involves measuring the angle at multiple wavelengths.

The classification of the sixth embodiment as two linear displacement interferometers operating in an angular displacement mode, a non-null mode, is a result of the procedure wherein the difference in phase $\phi_8-\phi_7$ is not servoed to a zero value and is a direct measure of the relative orientation of the measurement object mirror as a function of time.

The remaining description of the sixth embodiment is the same as corresponding portions of description given for the second, fourth, and fifth embodiments of the present invention.

A variant of the sixth embodiment of the present invention is shown schematically in FIGS. 6c–6g comprising three interferometers and a dynamic beam-steering assembly for a measurement of the orientation of an object, e.g., a stage mirror in two orthogonal planes. A combination of two of the three interferometers measures changes in orientation of measurement object mirror 562 in the plane of FIG. 6c and a second combination of two of the three interferometers measures changes in orientation of measurement object mirror 562 in a plane parallel to beam 531 and orthogonal to the plane of FIG. 6c.

Figures 6C, 6D:
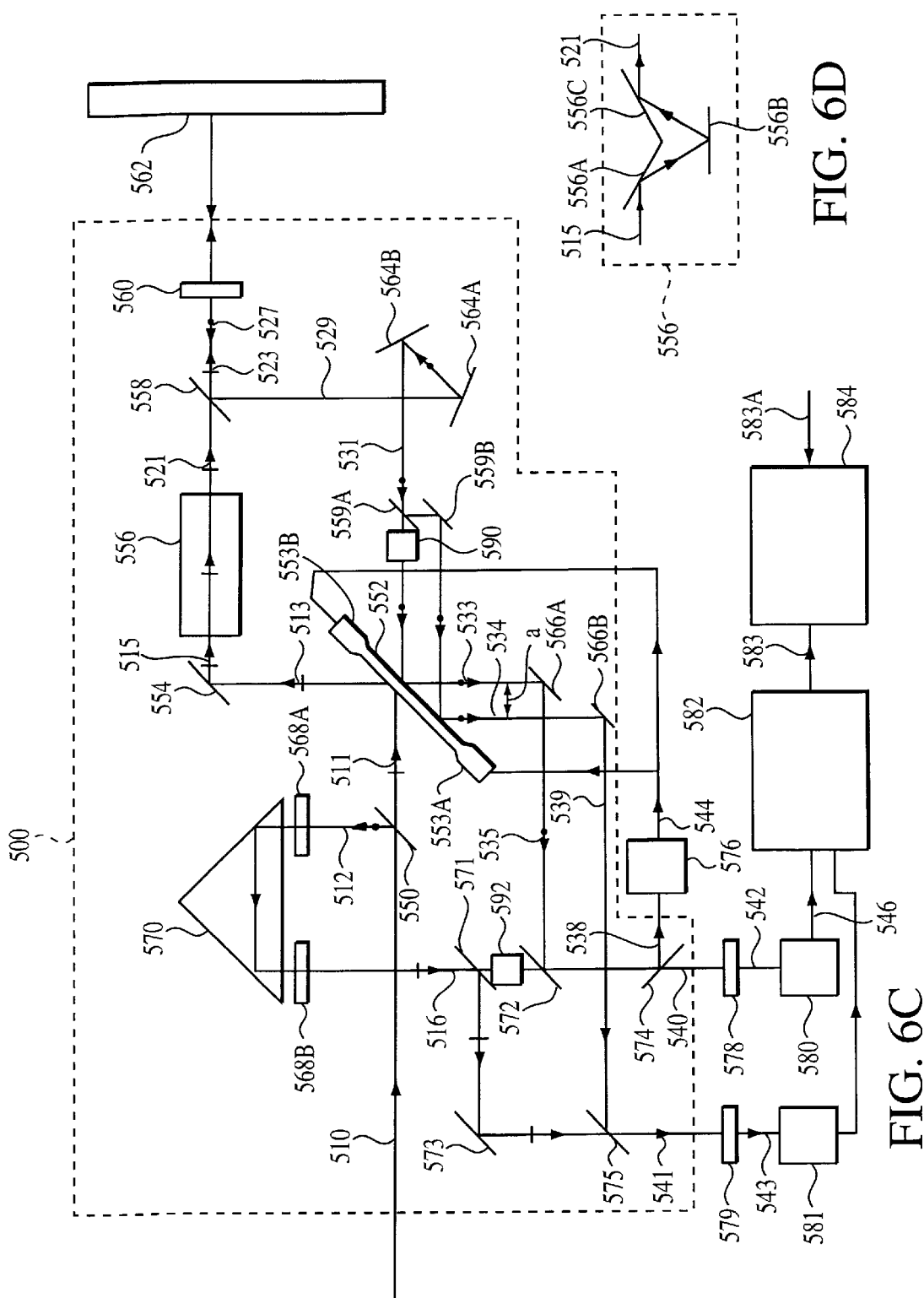
Figure 6E:
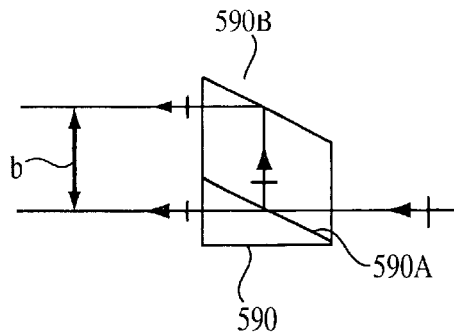
Figure 6F:
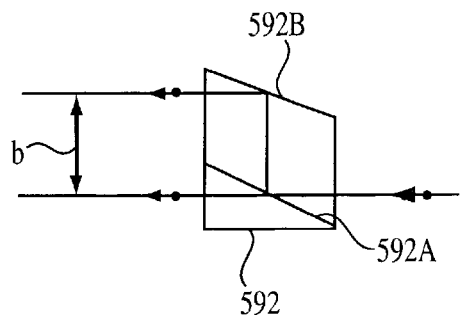

The first combination of interferometers comprises the two interferometers of the sixth embodiment of the present invention and beam splitter assemblies 590 and 592 shown in FIGS. 6c, 6e, and 6f. The plane of FIGS. 6e and 6f are orthogonal to the plane of FIG. 6c. A portion of the portion of measurement beam 531 transmitted by non-polarizing beam splitter 559A is transmitted by non-polarizing interface 590A (see FIG. 6e). A portion of the portion of reference beam 516 transmitted by non-polarizing beam splitter 571 is transmitted by non-polarizing interface 592A as a reference beam (see FIG. 6f). The net effect of beam splitter assemblies 590 and 592 on the first combination of two interferometers is to decrease the magnitude of the measurement and reference beam components of beam 536 preferably by approximately the same factor. The remaining description of the first combination of two interferometers is the same as corresponding portions of the description given for the two interferometers of the fifth embodiment of the present invention.

The second combination of two interferometers comprises one of the interferometers of the first combination of two interferometers and a second interferometer. The second interferometer of the second combination of two interferometers comprises elements of the first combination of two interferometers up through non-polarizing beam-steering 559A for the measurement beam, up through non-polarizing beam splitter 571 for the reference beam, and elements shown in FIG. 6g. A second portion of the portion of measurement beam 531 transmitted by non-polarizing beam splitter 559A is reflected by non-polarizing interface 590A, reflected by reflecting surface 590B, and then reflected by beam-steering mirror 552 as a measurement beam 533A (see FIG. 6g). Beam 533A is reflected by mirror 566C and then reflected by polarizing beam-splitter 572A as a measurement beam component of third output beam 540A (see FIG. 6g). A second portion of the portion of reference beam 516 transmitted by non-polarizing beam-splitter 571 is reflected by non-polarizing interface 592A, reflected by reflecting surface 592B, and then transmitted polarizing beam splitter 572A as a reference beam component of third output beam 540A (see FIG. 6g). Measurement beam 533A and measurement beam 533 lie in the plane that is preferably orthogonal to the planes of FIGS. 6c and 6g and separated by a distance b (see FIG. 6e.

Figure 6G:
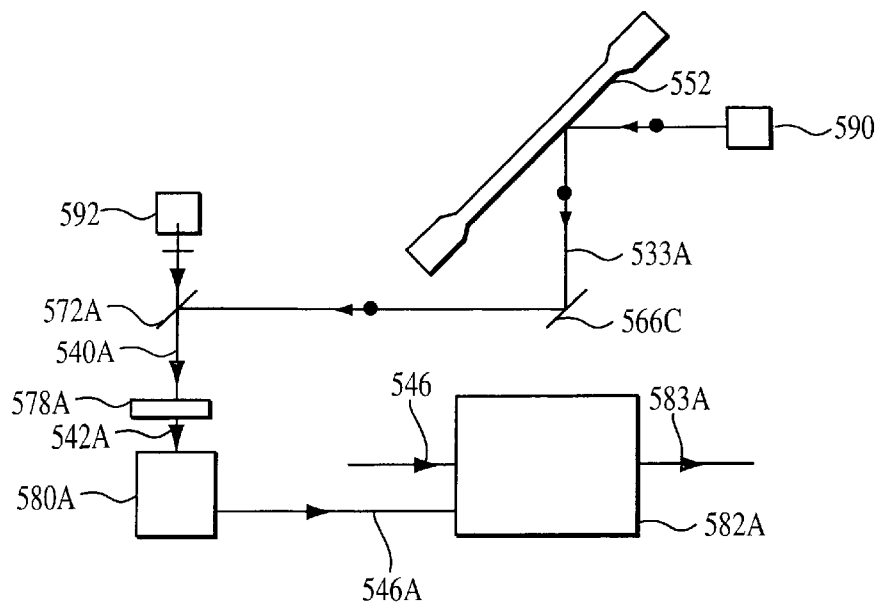

Third output beam 540A is transmitted by a polarizer 578A as a mixed output beam 542A (see FIG. 6g). The second interferometer of the second combination of two interferometers and measurement object mirror 562 introduce a phase shift $\phi_9$ between the measurement and reference beam components of the third output beam 540A and mixed output beam 542A. A detector 580A measures the intensity of mixed output beam 542A, e.g., preferably by photoelectric detection, to produce electrical interference signal or electrical heterodyne signal $s_9$. Heterodyne signal $s_9$ is transmitted as electronic signal 546A, preferably in digital format, to electronic processor and computer 582A. Electronic processor and computer 582A extracts the phase of heterodyne signal $s_9$, determines $\phi_9$ from the extracted phase, and transmits phase $\phi_9$ as signal 583A preferably in digital format to processor 584.

Phase $\phi_7$ is transmitted as signal 583 to processor 584 and processor 584 determines from phases $\phi_7$ and $\phi_9$ the phase difference $\phi_9-\phi_7$, an orientation angle $\theta_{7A}$ by the same procedures and equations corresponding equations as used by electronic processor and computer 582 with parameter a replaced by parameter b to determine from phases $\phi_7$ and $\phi_8$ an orientation angle $\theta_7$. Orientation angle $\theta_{7A}$ indicates the orientation of the measurement object mirror 562 in a plane defined by the plane of measurement beam 531 and the measurement beam reflected by reflecting surface 590B.

The beam-steering assembly of the variant of the sixth embodiment is configured with transducers and a supporting arrangement for the beam-steering mirror of the beam-steering assembly appropriated for servo control of the orientation of the beam-steering mirror in two orthogonal planes.

The remaining description of the variant of the sixth embodiment is the same as corresponding portions of the description given for the variant of the fifth embodiment and the sixth embodiment of the present invention.

Figures 7A, 7B:
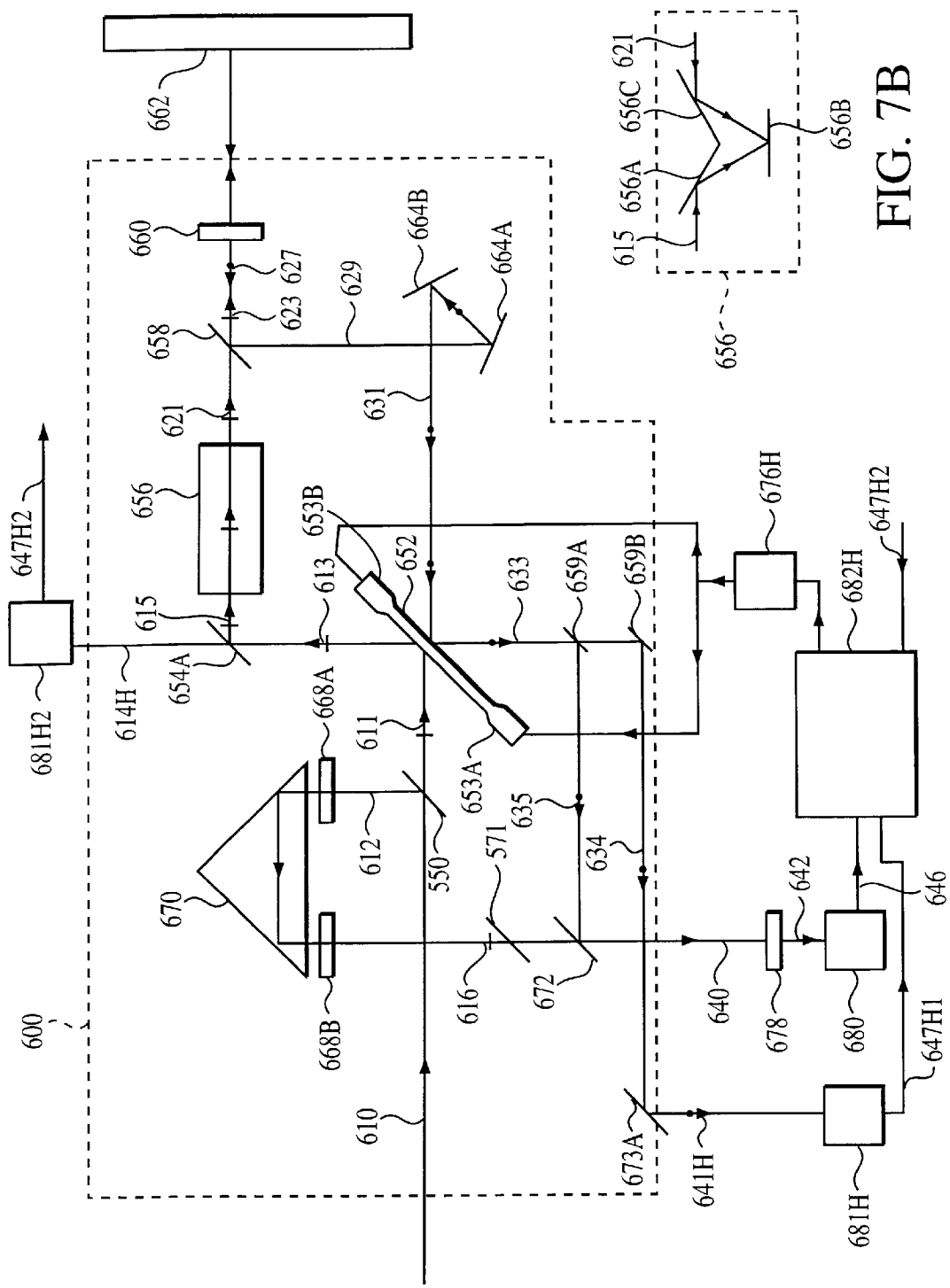
FIGS. 7a–b are schematic drawings of a seventh embodiment of the interferometry system and FIGS. 7c–d are schematic drawings of a variant of the seventh embodiment.

A seventh embodiment of the present invention is shown schematically in FIGS. 7a and 7b comprising an interferometer system and a dynamic beam-steering assembly for a linear displacement and an orientation measurement of an object, e.g., a stage mirror. The seventh embodiment is from the second set of embodiments. The interferometer system comprises a linear displacement interferometer and two angular displacement interferometers with the beam-steering assembly redirecting the measurement beams of the linear and angular displacement interferometers. A first interferometer of the two angular displacement interferometers operates in a null or differential mode and a second interferometer of the two angular displacement interferometers operates in non-null or displacement mode.

The seventh embodiment is of the second system type, the same system type as the second and sixth embodiments of the present invention. The interferometer system comprises the linear displacement and the two angular displacement measuring interferometers wherein the three interferometers together measure a change in a distance to a position on the surface of the object and a change in orientation of the object about the same position. The detected change in orientation is in a plane defined by the properties of the angular displacement interferometers.

A number of the elements of the seventh embodiment perform like functions as elements of the sixth embodiment of the present invention. Element numbers of elements in interferometer system 600 shown in FIGS. 7a and 7b performing like functions in the seventh embodiment are 100 more than the element numbers of the corresponding elements of the sixth embodiment except for the location of elements 659A and 659B and properties of beam 634. FIG. 7b is in a plane orthogonal to that of FIG. 7a.

The description of input beam 610 in FIG. 7a is the same as the description of input beam 14 of the first embodiment of the present invention. Description of measurement beams 611 and 613 is the same as corresponding portions of the description given for measurement beams 511 and 513 of the sixth embodiment. Description of measurement beams 615 through measurement beam 631 is the same as corresponding portions of the description given for measurement beams 511 through measurement beam 531 of the sixth embodiment. Measurement beam 631 is reflected by beam-steering mirror 652 as measurement beam 633. A first portion of measurement beam 633 is reflected by non-polarizing beam splitter 659A as a first measurement beam 635. First measurement beam 635 is reflected by polarizing beam splitter 672 as a measurement beam component of first output beam 640.

A second portion of measurement beam 633 is transmitted by non-polarizing beam splitter 659A and then reflected by mirror 659B as a measurement beam 634. Measurement beam 634 is reflected by mirror 673A as a second output beam 641H.

A first portion of measurement beam 613 is transmitted by non-polarizing beam splitter 654A as a third output beam 614H. A second portion of beam 613 is reflected by non-polarizing beam splitter 654A as measurement beam 615.

A portion of reference beam 616, as shown in FIG. 7a, is transmitted by polarizing beam splitter 672 as a reference beam component of first output beam 640. Output beam 640 is transmitter by analyzer 678 as mixed output beam 642, the polarization states of the reference beam component and the measurement beam component of the mixed output beam 642 being the same.

Interferometer system 600 and measurement object mirror 662 introduces phase shift $\phi_{10}$ between the measurement and reference beam components of mixed output beam 642. Detector 680 measures the intensity of mixed output beam 642, e.g., preferably by photoelectric detection, to produce electrical interference signal or heterodyne signal $s_{10}$. Heterodyne signal $s_{10}$ is transmitted to electronic processor and computer 682H as signal 646, in either digital or analog format, preferably in digital format. As described further below in the description of the eleventh embodiment of the present invention, phase $\phi_{10}$ can be analyzed to calculate changes in distance to measurement object mirror 662.

Second output beam 641H is incident on interferometer 681H1. The description of interferometer 681H1 is the same as the corresponding portion of the description given for the third angular displacement interferometer of the angular displacement interferometers subsequently described herein. Interferometer 681H1 generates electrical error signal $s_{11A}$, preferably in a digital format, that is transmitted to electronic processor and computer 682H as signal 647H1. Third output beam 614H is incident on interferometer 681H2. The description of interferometer 681H2 is the same as the corresponding portions of the description given for the third angular displacement interferometer of the angular displacement interferometers subsequently described herein. Interferometer 681H2 generates signal $s_{11B}$, preferably in a digital format, that is transmitted to electronic processor and computer 682H as signal 647H2. The change in orientation of measurement object mirror 662 in the plane of FIG. 7a is determined by electronic processor and computer 682H as twice the net change in angles indicated by error signal 647H1 and signal 647H2 minus the effects of spatial gradients in the index of refraction of the gas in the measurement path. The effects of spatial gradients in the index of refraction of the gas in the measurement path are equal to the integration of $(\partial n_M/\partial s)$ along the optical path of the measurement beam comprising the gas where $(\partial n_M/\partial s)$ is the partial derivative of the refractive index of the optical path comprising the gas at a respective point along the measurement path with respect to a vector orthogonal to the optical path of the measurement beam and parallel to the plane of FIG. 7a.

Signal processor and computer 682H transmits an error signal to servo controller 676H, based on the measured error signal $s_{11A}$, and server controller 676H sends servo control signal 644H to translators 653A and 653B. The description of the servo control operation is the same as corresponding portions of the description given for the first embodiment. Alternatively, in other embodiments, the angle measurement system includes calibration data for beam-steering mirror 652 that correlates the servo control signal 644H to transducers 653A and 653B with a corresponding change in angular orientation of the beam-steering mirror 652, which is directly related to the change in angular orientation of measurement object mirror 662 as described above. In other alternative embodiments, interferometers 781H1 and 781H2 may be based on one or more of the first, second, or fourth, possibly in combination with the third, of the angular displacement interferometers subsequently described herein.

The remaining description of the seventh embodiment is the same as corresponding portions of description given for the first, second, fourth, fifth, and sixth embodiments of the present invention.

The seventh embodiment reorients the beam-steering mirror based on interferometric signal $s_{11A}$, in contrast to, for example, measuring the spatial separations or differences in propagation directions between exit beams as in the sixth embodiment shown in FIG. 6a.

Figures 7C, 7D:
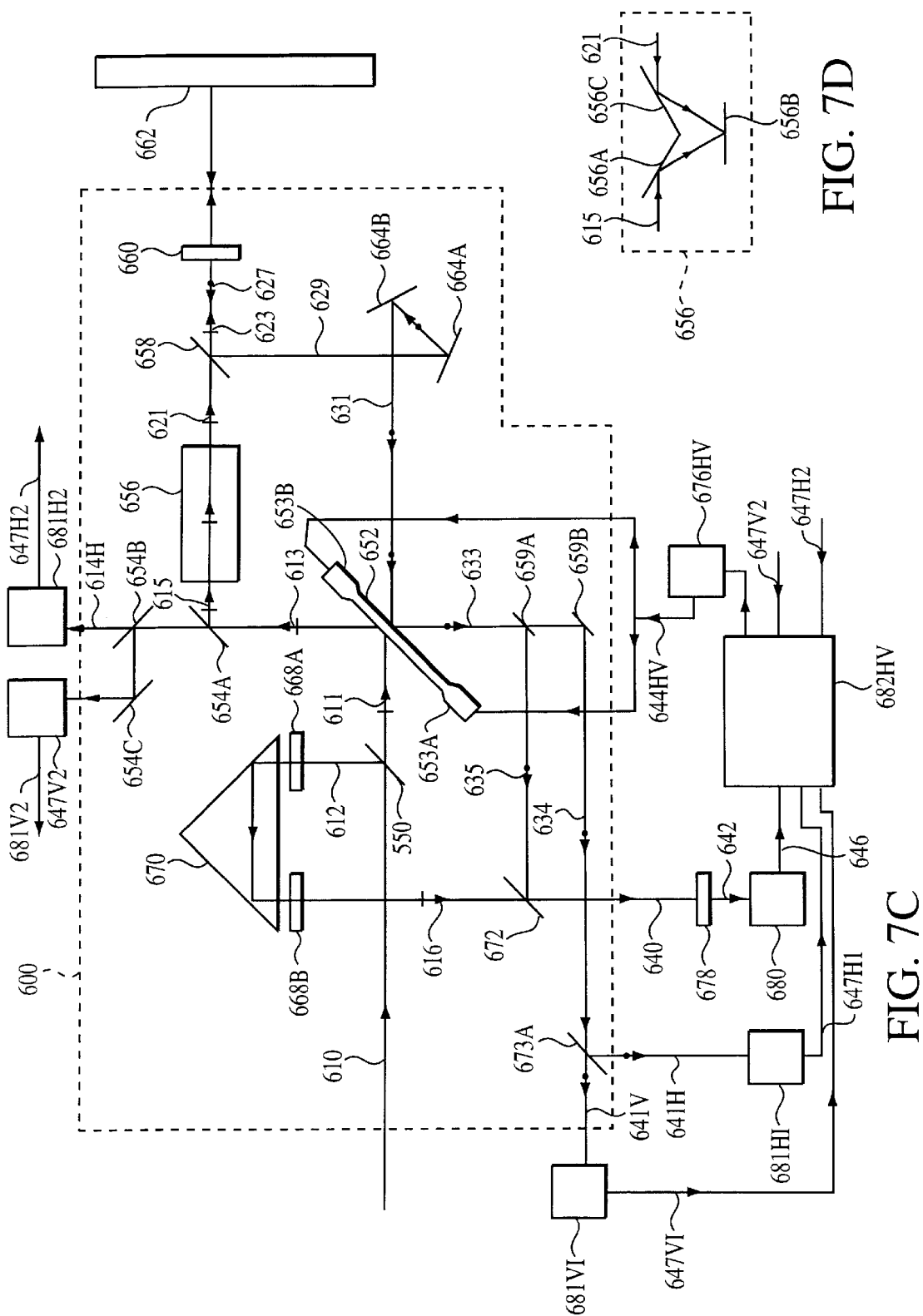

A variant of the seventh embodiment of the present invention is shown schematically in FIGS. 7c–7d comprising an interferometer system and a dynamic beam-steering assembly for linear displacement measurement and orientation measurements in two orthogonal planes of an object, e.g., a stage mirror. The plane of FIG. 7d is orthogonal to the plane of FIG. 7c. The interferometer system comprises five interferometers. One interferometer measures a linear displacement of measurement object mirror 662, a second and third interferometers of the five interferometers measure changes in orientation of a measurement beam and of measurement object mirror 662 in the plane of FIG. 7c, and a fourth and fifth interferometers of the five interferometers measure changes in orientation of a measurement beam and of measurement object mirror 662 in a plane parallel to beam 631 and orthogonal to the plane of FIG. 7c.

Description of the first interferometer of the five interferometers is the same as corresponding portions given for the description of the interferometer of the seventh embodiment that measures phase $\phi_{10}$. Description of the second and third interferometers of the five interferometers is the same the corresponding portions of the description given for the second and third interferometers of the seventh embodiment that measures in orientation of measurement object mirror 662 with mirror 673A replaced by non-polarizing beam splitter 673B.

Description of the fourth and fifth interferometers of the five interferometers is the same as corresponding portions of the description given for the second and third interferometers of the five interferometers up through beam 634 and the generation of output beam 614H. A portion of beam 634 is transmitted by non-polarizing beam splitter 673A as beam 641V shown schematically in FIG. 7c. As shown in FIG. 7c, beam 641V is incident on interferometer 681V. A portion of beam 613 is transmitted by non-polarizing beam splitter 654B as beam 614. A first portion of beam 614 is transmitted as output beam 614H and a second portion of beam 614 is reflected by beam splitter 654B and subsequently reflected by mirror 654C as output beam 614V. Output beams 614H and 614V are incident on interferometers 681H2 and 681V2, respectively.

Output beam 641V is incident on interferometer 681V1. The description of interferometer 681V1 is the same as the corresponding portion of the description given for interferometer 681H1 of the seventh embodiment. Interferomter 681H1 generates electrical error signal $s_{12A}$, preferably in a digital format, that is transmitted to electronic processor and computer 682HV as signal 647V1.

Fifth output beam 614V is incident on interferometer 681V2. Description of interferometer 681V2 is the same as the corresponding portions of the description given for the third interferometer of the seventh embodiment. Interferometer 681V2 generates signal $s_{12B}$, preferably in a digital format, that is transmitted to electronic processor and computer 682HV as signal 647V2.

The change in orientation of object mirror 662 in a plane orthogonal to the plane of FIG. 7a is determined by electronic processor and computer 682HV as twice the net change in angles indicated by error signal 647V1 and signal 647V2 minus the effects of spatial gradients in the index of refraction of the gas in the measurement path. The effects of spatial gradients in the index of refraction of the gas in the measurement path are equal to the integration of $(\delta n_M/\delta s)$ along the optical path of the measurement beam comprising the gas where $(\delta n_X/\delta s)$ is the partial derivative of the refractive index of the optical path comprising the gas at a respective point along the measurement path with respect to a vector orthogonal to the optical path of the measurement beam and orthogonal to the plane of FIG. 7c.

Signal processor and computer 682HV transmits an error signal to servo controller 676HV, based on the measured errors as indicated by $s_{11A}$ and $s_{12A}$, and server controller 676HV sends servocontrol signal 644HV to the translators, translators 653A, 653B, and a third translator not shown in FIG. 7c. The description of the servo control operation is the same as corresponding portions of the description given for the first embodiment.

The remaining description of the variant of the seventh embodiment is the same as corresponding portions of the description given for the seventh embodiment of the present invention and for the variant of the sixth embodiment of the present invention.

Figure 8C:
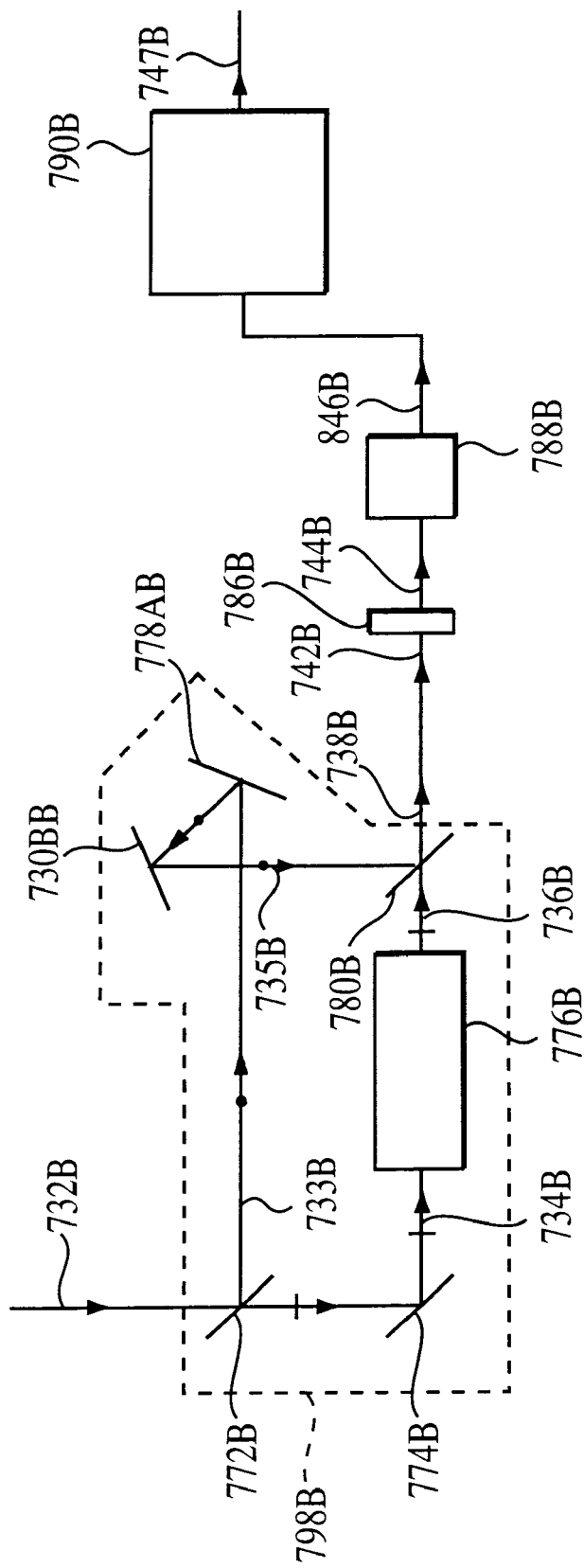

An eighth embodiment of the present invention is shown schematically in FIGS. 8a–8c comprising an interferometer system and a dynamic beam-steering assembly for an orientation measurement of an object, e.g., a stage mirror. The eighth embodiment is from the second set of embodiments comprising two linear displacement measuring interferometers, configured to measure an angular displacement, operating in non-null or displacement mode. In addition, a beam-steering assembly is separate from the interferomter system and redirects both an input beams to and output beams from the interferometer system and reference and measurement objects.

The eight embodiment is shown schematically in FIGS. 8a–8c. The eighth embodiment comprises an interferometer with a beam-steering assembly redirecting both input and output beams by a beam-redirecting element in a manner to not be sensitive in first order to a linear displacement of the beam-redirecting element. The redirection of both input and output beams of an interferomter by a beam-redirecting element, in the manner for angle measurements to not be sensitive in first order to a linear displacement of the beam-redirecting element, is feature of a fourth system type. The fourth system type further comprises the reflection of the measurement beams by the measurement object mirror where, at the measurement object mirror, the measurement beams are substantially parallel and coextensive.

The description of input beam 710 in FIG. 8a is the same as the description of input beam 14 of the first embodiment of the present invention. As shown in FIG. 8a, beam 710 is reflected by a surface of beam steering mirror 750 as beam 712. Beam steering mirror 750 and orientation transducers 751A and 751B comprise a beam steering assembly that redirects the input beam 710. Beam 712 is reflected by mirrors 752A and 752B to form beam 714. Mirrors 752A and 752B together produce a constant deviation between beams 712 and 714 in the plane of FIG. 8a, the same as a penta prism.

Continuing with FIG. 8a, beam 714 impinges on polarizing beam splitter 754A with a portion of beam 714 transmitted as measurement beam 715 polarized in the plane of FIG. 8a and a second portion of beam 714 reflected as reference beam 716 orthogonally polarized to the plane of FIG. 8a.

Beam 715 is transmitted by polarizing beam splitter 756 as beam 717. Beam 717, polarized in the plane of FIG. 8a, is transmitted by a quarter wave phase retardation plate 758 as a circularly polarized beam, reflected by measurement object mirror 760, comprised of a single reflecting surface, as a beam with opposite-handed circular polarization, and subsequently transmitted by quarter wave phase retardation plate 758 as beam 719 linearly polarized orthogonal to the plane of FIG. 8a. Beam 719 is reflected by polarizing beam splitter 756 as beam 721. Beam 721 is reflected by mirror 762 as beam 723.

A portion of measurement beam 723 is transmitted by non-polarizing beam splitter 768A, reflected by polarizing beam splitter 768B, and then reflected by mirror 770A as a measurement beam component of output beam 730A of the first interferometer. A second portion of measurement beam 723 is reflected by non-polarizing beam splitter 768A, reflected by mirror 770A, reflected by polarizing beam splitter 770B, and then reflected by mirror 770A as a measurement beam component of output beam 730B of the second interferometer. The separation of the portion of measurement beam 723 transmitted by non-polarizing beam splitter 768A and the second portion of measurement beam 723 reflected by non-polarizing beam splitter 768A and reflected by mirror 770A is shown on FIG. 8a as separation α.

Reference beam 716 is transmitted by half-wave phase retardation plate 764 as beam 718 linearly polarized in the plane of FIG. 8a. Beam 718 is retroreflected by retroreflector 766 as beam 720.

A portion of reference beam 720 is transmitted by non-polarizing beam splitter 768C, transmitted by polarizing beam splitter 768B, and then reflected by mirror 770A as a reference beam component of output beam 730A of the first interferometer. A second portion of reference beam 720 is reflected by non-polarizing beam splitter 768C, reflected by mirror 768D, transmitted by polarizing beam splitter 770B, and then reflected by mirror 770A as a reference beam component of output beam 730B of the second interferometer.

Beams 730A and 730B are reflected by a second surface of beam steering mirror 750 as output beams 732A and 732B, respectively.

Output beam 732A enters optical system 798A and exits as beam 738A. The reference beam component of output beam 732A has experienced image inversions about two orthogonal axes and the measurement beam component of output beam 732A has experienced an image inversion about one of the orthogonal axes. Optical system 798A in FIG. 8a introduces an additional image inversion in the measure beam component of beam 732A relative to the reference beam component of beam 732A so that reference beam component of beam 738A has experienced the same number of image inversions about for each of two orthogonal axes modulo two as number of image inversions experienced by the measurement beam component of beam 738A.

The reference beam component of beam 732A is transmitted by polarizing beam splitter 772A and reflected by mirror 774A as beam 734A. Beam 734A enters image inverter 776A. As shown in FIG. 8b, image inverter 776A is comprised of three mirrors 776AA, 776BA, and 776CA. The plane of FIG. 8b is orthogonal to the plane of FIG. 8a. Beam 734A is reflected by each of the three mirrors 776AA, 776BA, and 776CA and exists image inverter 776A as beam 736A.

The measurement beam component of beam 732A is reflected by polarizing beam splitter 772A as beam 733A. Beam 733A is reflected by mirrors 778AA and 778BA to form beam 735A. Mirrors 778AA and 778BA together produce a constant deviation between beams 733A and 735A in the plane of FIG. 8a, the same as a penta prism.

Beam 736A is transmitted by polarizing beam splitter 780A as one component of output beam 738A. Beam 735A is reflected by polarizing beam splitter 780A as a second component of output beam 738A.

A portion of beam 738A is reflected by nonpolarizing beam splitter 782A as beam 740A. Beam 740A impinges on detector 784A to produce an electrical signal 748A related to any difference in the directions of propagation of measurement and reference beam components in beam 740A.

In alternative embodiments, detector 784A may comprise an interferometer based on one of the four angular displacement interferometers subsequently described herein. The displacement of detector 784A in the alternative embodiments is the same as corresponding portions of the description given for the seventh embodiment, and alternatives therein. It will evident to those skilled in the art that a portion of beam 738B could be split off by a non-polarizing beam splitter (not shown in a figure) to produce an error signal for the servo control of beam-steering mirror 750 in a manner the same as the portion of beam 738A is split off by a non-polarizing beam splitter 782A for the purpose of producing signal 748A for the servo control of beam-steering mirror 750.

A second portion of output beam 738A is transmitted by nonpolarizing beam splitter 782A as beam 742A. Beam 742A is transmitted by a polarizer 786A orientated to produce a mixed optical beam 744A. Beam 744A impinges on detector 788A to generate electrical signal 746A related to the difference in phase of the measurement and reference beam components of mixed beam 744A. Electrical signal 746A is transmitted to electronic processor and computer 790 for subsequent processing for information about the difference in phase of the measurement and reference beam components of mixed beam 744A.

Similarly, referring to FIG. 8c, output beam 732B enters optical system 798B, exits as beam 738B, and passes through polarizer 786B to become third output beam 744B. The description of a generation of a third output beam 744B from output beam 730B of the second interferometer is the same as corresponding portions of the description given for the generation of output beam 744A from output beam 730A of the first interferometer, certain other elements of the second interferometer performing like functions of elements of the first embodiment. Alphanumeric numbers of the certain other elements are the same as the alphanumeric numbers of elements performing the like functions in the first interferometer except for the change of suffixes A to suffixes B. In the second interferometer, there is no element corresponding to non-polarizing beam splitter 782A.

The first and second interferometers and measurement object mirror 760 introduce a phase shifts $\phi_{13}$ and $\phi_{14}$, respectively, between the measurement and reference beam components of mixed second and third output beams 746A and 746B, respectively. Detectors 788A and 788B measure the intensities of mixed second and third output beams 746A and 746B, respectively, e.g., preferably by photoelectric detection, to produce electrical interference signals or electrical heterodyne signals $s_{13}$ and $s_{14}$, respectively. Heterodyne signals $s_{13}$ and $s_{14}$ are transmitted to electronic processor and computers 790A and 790B, respectively, as signals 746A and 746B, respectively, in either digital or analog format, preferably in digital format. Electronic processor and computers 790A and 790B extract phases $\phi_{13}$ and $\phi_{14}$, respectively, of heterodyne signals $s_{13}$ and $s_{14}$, respectively. Phases $\phi_{13}$ and $\phi_{14}$ are transmitted as signals 747A and 747B, respectively to processor 790. Processor 790 determines from phases $\phi_{13}$ and $\phi_{14}$ a phase difference $\phi_{14}-\phi_{13}$ and from phase difference $\phi_{14}-\phi_{13}$, determines a angle $\theta_{13}$ of an orientation of measurement object mirror 760. Angle $\theta_{13}$ is an orientation of a normal to the reflecting surface of measurement object mirror 760 in the plane of FIG. 8a and is computed using the formula $$\theta_{13} = 2\arctan\left[\frac{\eta_{13}}{1+\eta_{13}}\right] - \int\left(\frac{\partial n_M}{\partial r}\right)ds \qquad (19)$$

where $$\eta_{13} = \left[\frac{(\varphi_{14}-\varphi_{13})}{2n_M ka}\right] \qquad (20)$$

the integration is along the optical path of the measurement beam comprising the gas and $(\delta n_x/\delta s)$ is the partial derivative of the refractive index of the optical path comprising the gas at a respective point along the measurement path with respect to a vector orthogonal to the optical path of the measurement beam and parallel to the plane of FIG. 8a. In embodiments where the interferometric measurement is made at only one wavelength, such as in the presently described embodiment, the integral term in Eq. 19 can be ignored, and an approximate value for $\theta_{13}$ is measured by the system based only on the first term in Eq. 19. A method for correcting the measured angle $\theta_{13}$ for the integral term in Eq. 19 is described further below and involves measuring the angle at multiple wavelengths.

The remaining description of the eighth embodiment is the same as corresponding portions of the description given for the sixth and seventh embodiments of the present invention.

A variant of the eight embodiment is described comprising an interferometer system and a dynamic beam-steering assembly for a measurement of the orientation of an object, e.g., a stage mirror in two orthogonal planes. The interferometer system of the variant of the eighth embodiment comprises an interferometer system the same as the interferometer system of the eighth embodiment and the addition of a third interferometer to the interferometer system of the eighth embodiment in a manner the same as the manner as the second interferometer of the sixth embodiment is added to the first interferometer of the sixth embodiment. The remaining description of the variant of the eight embodiment is the same as corresponding portions given for the description of the sixth embodiment, the variant of the sixth embodiment, the seventh embodiment, the variant of the seventh embodiment, and eighth embodiment of the present invention.

A ninth embodiment of the present invention is shown schematically in FIGS. 11a–11e comprising an interferomter system and a dynamic beam-steering assembly for a linear displacement and an orientation measurement of an object, e.g., a stage mirror. The ninth embodiment is from the second set of embodiments comprising a linear displacement interferometer and two angular displacement interferometers, one angular displacement interferometer operating in a null or differential mode and a second angular displacement interferometer operating in a non-null or angular displacement mode, with the beam-steering assembly redirecting the measurement beams of the linear and angular displacement interferometers.

The ninth embodiment is of the same system type, the second system type, as the second, , sixth, and seventh embodiments of the present invention. The interferometer system comprises a linear displacement and two angular displacement measuring interferometers wherein the three interferometers measure a distance to a position on the surface of the object and a change in orientation of the object about the same position. The detected change in orientation is in a plane defined by the properties of the angular displacement interferometers.

The ninth embodiment of the present invention relates to polarization preserving optical systems and their use as components in linear and angular displacement measuring interferometers. Each polarization preserving optical system incorporated in the ninth embodiment comprises two properties. The first property is that for such an optical system, there exists a set of orientations of planes of linear polarization of an input beam to the optical system for which the polarization state of the input beam at each reflecting and refracting surface of the optical system and a corresponding output beam are all linear. The set of planes of linear polarization orientations hereinafter will be referred to as eigenmodes. Thus, the optical system "preserve", for an input beam to the system having an eigenmode state of linear polarization, the linear state of polarization of the input beam at each reflecting and refracting surface of the optical system and the corresponding output beam.

A set of the optical systems that exhibit such eigenmodes comprise reflecting and refracting surfaces such that the plane of polarization of an eigenmode at each of any reflecting or refracting surface in the optical system is either parallel to or orthogonal to the plane of incidence at the surface. The propagation direction of an incident ray and its linear polarization define the plane of polarization. The normal to a given surface and the propagation direction of the incident ray define the plane of incidence for that surface and ray. A corner cube retroreflector is an example of an optical system that does not preserve exhibit such eigenmodes because any incident, linearly polarized ray will contact at least one surface of the corner cube such that the plane of polarization is neither orthogonal or parallel to the plane of incidence. Thus, linearly polarized beams emerge from corner cube retroreflectors with at least some polarization ellipticity.

In part because of the absence of a corner cube retroreflector, this first property (polarization preservation) is also present in the first, second, third, fourth, and fifth embodiments described previously.

The second property is that apparatus of the ninth embodiment further comprises optical systems having a certain set of transformation properties. The set of transformation properties describe a specific relationship between changes in the direction of propagation of an output beam from an optical system that results from changes in the directions of propagation an input beam wherein the directions of propagation of the input and output beams may or may not be parallel. A corner cube retroreflector is an example of an optical system exhibiting the set of transformation properties. The set of transformation properties will hereinafter be referred to as a transformation type $T_{Ret}$. The set of transformation properties are opposite to the set of transformation properties of a plane mirror. For example, as the angle of incidence on a plane mirror increase, the angle of reflection from the plane mirror increases, but in an opposite direction. In contrast, when the incident angle of an input ray into a corner cube retroreflector changes, the angle of the output ray changes in the same direction so as to maintain the input and output rays parallel to one another. Along with other interferometers utilizing polarization preserving optical systems, the interferometer system and a dynamic beam-steering assembly of the ninth embodiment is further described with respect to properties of polarization preserving optical systems and transformations of type $T_{Ret}$ in copending, commonly owned U.S. patent application with Ser. No. 09/384,855, filed Aug. 27, 1999, and entitled "Interferometers Utilizing Polarization Preserving Optical Systems" by Henry A. Hill and Peter J. de Groot, the contents of the copending application being incorporated herein by reference.

Figure 11A:
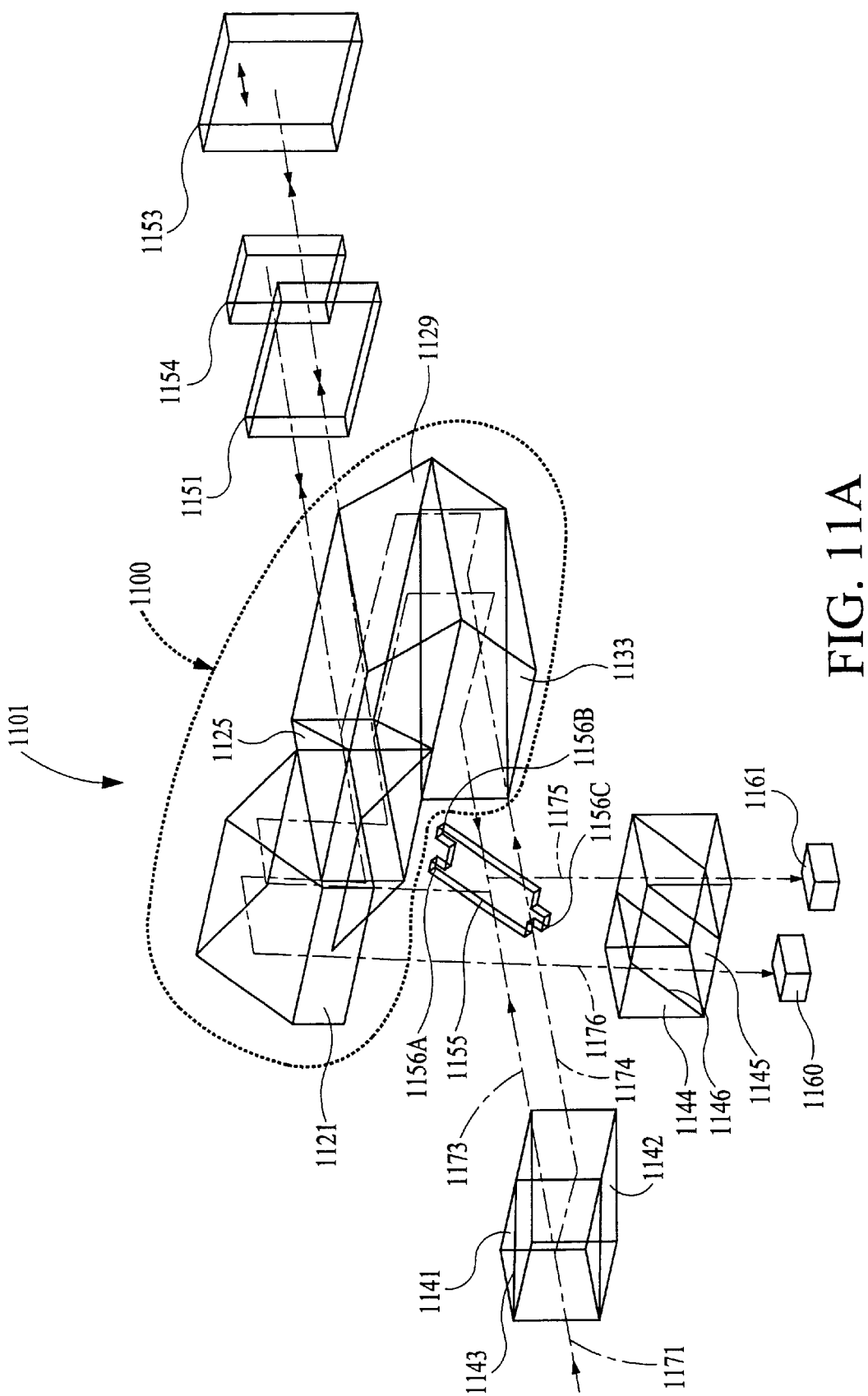
Figure 11B:
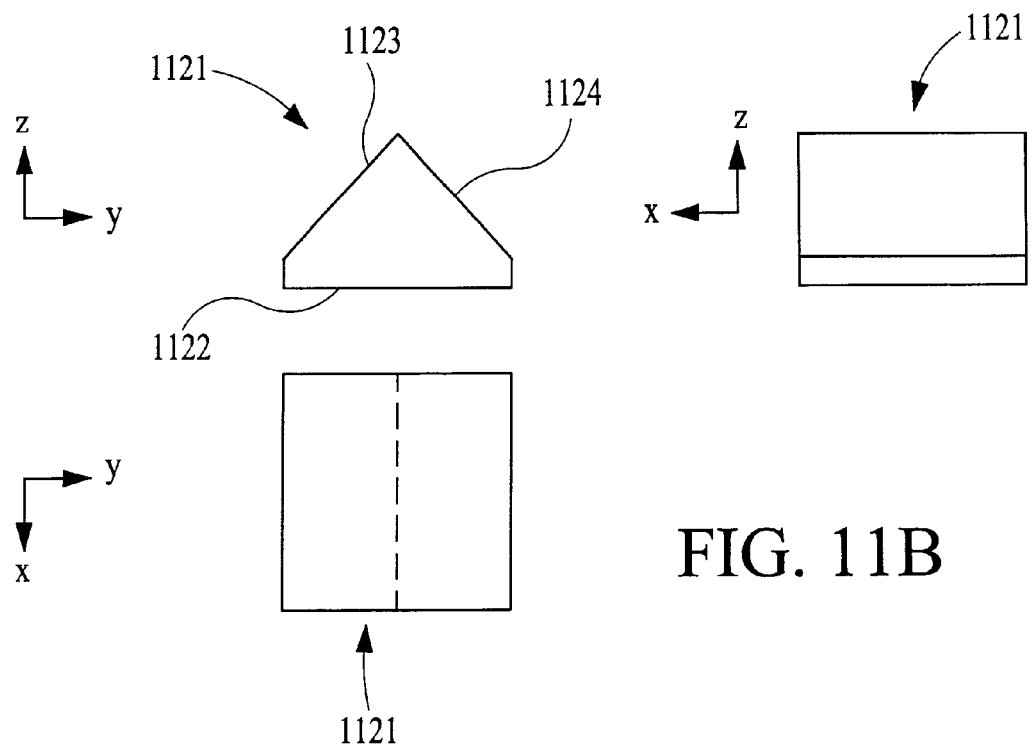
Figure 11C:
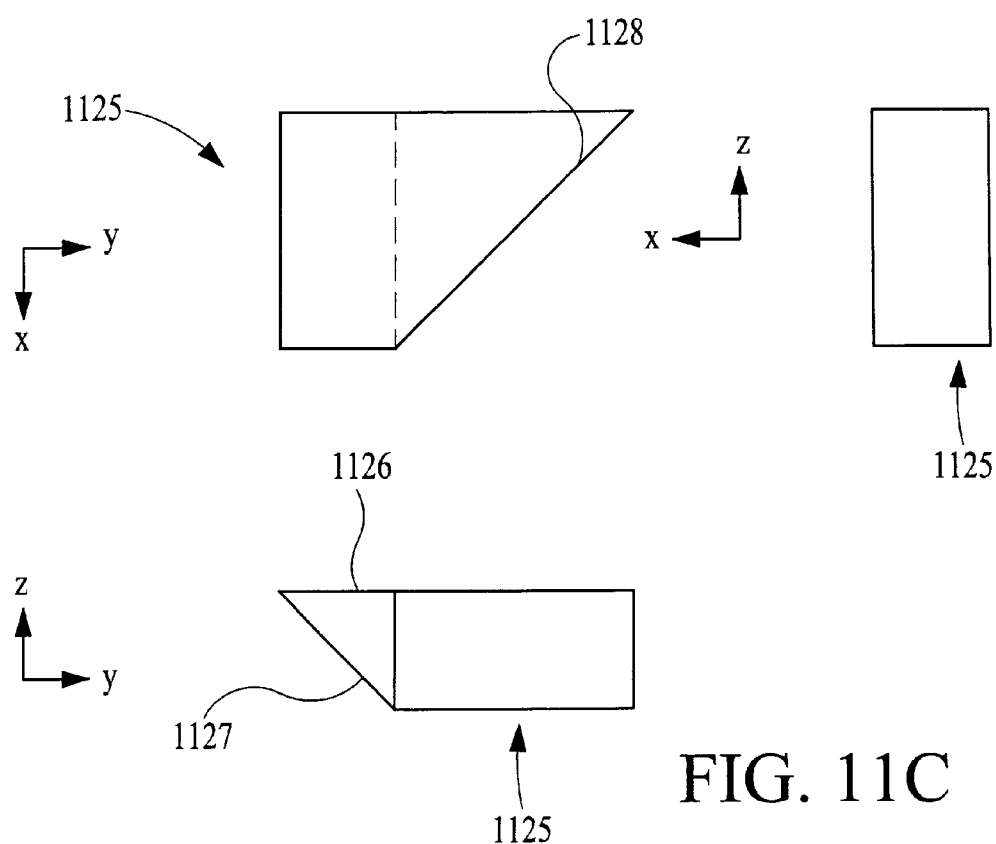

The ninth embodiment comprises a differential plane mirror interferometer 1101 with a dynamic element 1155 as shown in diagrammatic perspective view in FIG. 11a. The orientation of dynamic element 1155 is serviced to maintain the measurement beam perpendicular to an object mirror 1153.

The description of input beam 1171 is the same as the corresponding portion of the description given for the source of input beam 14 of the first embodiment of the present invention. Input beam 1171 comprises two orthogonally polarized components having frequencies different one for the other. Input beam 1171 enters a first beam splitter comprising a right angle prism 1141 and a rhomboidal prism 1142 with a polarizing interface 1143. A first portion of input beam 1171 incident on polarizing interface 1143 is transmitted as a measurement beam 1173. A second portion of input beam 1171 incident on polarizing interface 1143 is reflected and exits the first beam splitter, after an internal reflection, as a reference beam 1174. Measurement beam 1173 then reflects from dynamic mirror 1155 to optical subsystem 1100, where as reference beam 1174 propagates directly to optical subsystem 1100. The orientation of dynamic mirror 1155 is controlled by transducers 1156A, 1156B, and 1156C. Propagation of these beams through optical subsystems 1100 is illustrated in FIG. 11a, and the details of optical subsystem 1100 will be described further below.

Measurement beam 1173 and reference beam 1174 exit subsystem 1100 as output measurement and reference beams 1175 and 1176, respectively. Output measurement and reference beams 1175 and 1176 are combined into a mixed output beam and a second output beam by a second beam splitter comprising right angle prisms 1144 and 1147, rhomboidal prism 1145, and beam splitting interfaces 1146 and 1148. The mixed and second output beams are received by detector and signal processors 1160 and 1161, respectively, that operate to provide information about linear and angular displacements of object mirror 1153 and information relating to the alignment of beams, e.g., such as detection of changes in direction of propagation of the second output beam, used for the servo control of dynamic mirror 1155.

The following coordinate system is defined for FIG. 11a, the y-axis is parallel to beams 1171, 1173, and 1174, the z-axis is parallel to beams 1175 and 1176, and the x-axis is perpendicular to the y- and t-axes. Upon exiting prism 1141, measurement beam 1173 is linearly polarized along the x-axis, and upon exiting rhomboidal prism 1142 reference beam 1174 is linearly polarized along the z-axis.

Optical subsystem 1100, quarter-wave phase retardation plate 1151, and reference mirror 1154 exhibit, as a first optical system, polarization preserving eigenmodes and the type $T_{Ret}$ transformation properties for input reference beam 1174. Also, optical subsystem 1100, quarter-wave phase retardation plate 1151, object mirror 1153, and dynamic element 1155 for a fixed orientation exhibit, as a second optical system, polarization preserving eigenmodes and the type $T_{Ret}$ transformation properties for input measurement beam 1174.

Optical subsystem 1100 comprises a modified Porro prism 1121 and prisms 1125, 1129, and 1133 shown schematically in FIGS. 11b, 11c, 11d, and 11e, respectively. FIGS. 11b, 11c, 11d, and 11e shows views of Porro prism 1121 and prisms 1125, 1129, and 1133, respectively, from each of the x–y, x–z, and y–z planes, with the particular plane specified by the coordinate axes to the left of the view. An interface comprising surfaces 1128 and 1130 is a polarizing beam splitter interface.

There are two polarization preserving eigenmodes of the first optical system wherein the input polarization states of the two eigenmodes are orthogonal and parallel, respectively, to the plane of incidence at surface 1136 of prism 1133. The corresponding output polarization states of the two polarization preserving eigenmodes are orthogonal and parallel to the plane of incidence at surface 1123 of prism 1121. The eigenmodes are polarization preserving since the polarization states of the eigenmodes are either parallel to or orthogonal to the respective planes of incidence for each reflection and refraction in the first optical system.

There are also two polarization preserving eigenmodes of the second optical system wherein the input polarization states of the two eigenmodes are orthogonal and parallel, respectively, to the plane of incidence at a first surface of dynamic element 1155. The plane of incidence at the first surface of dynamic element 1155 is parallel to the plane of incidence of beams of the eigenmodes at surface 1123 of Porro prism 1121. The corresponding output polarization states of the two polarization preserving eigenmodes are parallel and orthogonal, respectively, to the planes of incident of a surface of dynamic element 1155. The eigenmodes are polarization preserving since the polarizaiotn states of the eigenmodes are either parallel to or orthogonal to the respective planes of incidence for each reflection and refraction in the second optical system.

The polarization preserving property is also present in the first, second, third, fourth, and fifth embodiments described previously.

The transformation properties of the first and second optical system of the ninth embodiment with respect to changes in direction of propagation of output beams 1175 and 1176 that result from changes in direction of propagation of input beams 1173 and 1174, respectively, are the same as the properties of the type $T_{Ref}$ transformation. For example, if the angle of incidence of measurement beam 1173 on dynamic mirror 1155 increases, the angle of reflection of output beam 1175 from dynamic mirror 1155 decreases.

The description of the detection and processing of the mixed beam by component 1160 is the same as the corresponding portion of the description of the detection and processing of beam 640 by analyzer 678, detector 680, and electronic processor and computer 682H of the seventh embodiment (see FIG. 7a). The description of the detection and processing of the second output beam by component 1161 is the same as the corresponding portion of the description given for the detection and processing of beam 641H by detector 681H1, and electronic processor and computer 682H of the seventh embodiment (see FIG. 7a). The description of the control of transducers 1156A, 1156B, and 1156C of the ninth embodiment is the same as the corresponding portion of the description of the control of transducers 653A and 653B by servo controller 676 of the seventh embodiment (see FIG. 7a).

A third output beam (not shown in FIG. 11a) is generated by splitting off a portion of measurement beam 1173 reflected by dynamic mirror 1155. The description of the detection and processing of the third output beam by is the same as the corresponding portion of the description given for the detection and processing of beam 641H by detector 681H2, and electronic processor and computer 682H of the seventh embodiment (see FIG. 7a).

Alternatively, in another variant of the ninth embodiment, the processing can be similar to the sixth embodiment (see FIG. 6a). In particular, a beam splitting rhomb can be positioned before the measurement beam reflects from dynamic mirror 1155 to form output beam 1175, just as components 559A and 559B split beam 531 into two and direct them to dynamic mirror 552 in FIG. 6a. Thereafter, the processing of the two portions of the measurement beam that reflect from the dynamic mirror 1155 and of the reference output beam 1176 is identical to the processing of beams 533, 534, and 516, respectively, in the embodiment of FIG. 6a.

In a further variant of the ninth embodiment, the interferometry system only measures changes in distance to (and not changes in angular orientation of) object mirror 1153 based on an interferometric signal measured by component 1160. Component 1161 provides the servo information to reorient dynamic mirror 1155 based on a portion of measurement output beam 1175, which provides, e.g., spatial or interferometric information.

The remaining description of the ninth embodiment is the same as corresponding portions of description given for the first, second, fourth, fifth, sixth, and seventh embodiments of the present invention and the sixth embodiment in U.S. patent application having U.S. Ser. No. 09/157,131.

A variant of the ninth embodiment of the present invention is described that comprises an interferometer system and a dynamic beam-steering assembly for a measurement of an error in orientation of an object, e.g., a stage mirror, in two orthogonal planes. The description of the variant of the ninth embodiment is the same as the description of the ninth embodiment up through the detection and electronic processing of the second and third output beams. For the variant of the ninth embodiment, the description of the detection and processing of the fourth and fifth output beams is the same as corresponding portions of the description given for the detection and processing of output beams 641V and 614V by detectors 681V1 and 681V2, and electronic processor and computer 682HV of the variant of the seventh embodiment (see FIG. 7c). The description of the control of transducers 1156A, 1156B, and 1156C of the variant of the ninth embodiment is the same as the corresponding portion of the description given for the control of transducers 653A, 653B, and 653C (not shown) by servo controller 676HV of the variant of the seventh embodiment (see FIG. 7a).

The remaining description of the variant of the ninth embodiment is the same as corresponding portions of the description given for the ninth embodiment, the variant of the sixth embodiment, and the variant of the seventh embodiment of the present invention. The ninth embodiment and its variants provide a particularly compact arrangement for a dynamic distance and angle measuring interferometry system.

The first nine embodiments and variants thereof are based on variants of certain embodiments of the U.S. patent application having U.S. Ser. No. 09/157,131. It will be apparent to those skilled in the art that other of the embodiments in U.S. patent application having U.S. Ser. No. 09/157,131 can also be used in a modified form to measure angular displacement using the techniques and procedures used in the first nine embodiments and variants thereof of the present invention for the generation of an angular displacement interferometer without departing from the scope and spirit of the present invention.

Embodiments from the second set of embodiments of the present invention are nest described wherein each embodiment comprises at least one angular displacement interferometer and a linear displacement interferometer. The first of these embodiments, the tenth embodiment, comprises the interferometer system and beam-steering assembly of the second embodiment shown schematically in FIG. 2 except that detector and processor 180 performs additional functions. For the tenth embodiment, detector and processor 180 further computes the average phase, $(\phi_2+\phi_3)/2$, from phases $\phi_2$ and $\phi_3$, and calculates the difference in physical path length L between the measurement and reference pathes based on the average phase, i.e., $L=(\phi_2+\phi_3)/2$ nk, where k is the wavevector and n is the refractive index of the gas in the measurment path. For the tenth embodiment the measured value of L is sensitive to translations of beam-steering mirror 160 in a direction normal to its reflective surface.

A line of reference for the measurement beam of the tenth embodiment is defined by the direction of measurement beam 118, a defined zero orientation of beam-steering mirror 160, the measurement beam incident on measurement object mirror 166 at normal incidence, and the relationship between locations of polarizing beam splitter 142, beam splitter assembly 144, and mirror 148. For example, with beam-steering mirror 160 at the zero orientation, the measurement beam incident on measurement object mirror at normal incidence, and the corresponding path length of beam 122 equal to one half of the corresponding path length of beam 125, the corresponding path of beam 120 defines the line of reference.

A line of measurement is defined by the path of beam 120 which intersects measurement object mirror 166 at normal incidence. The linear displacement represented by average phase $(\phi_2+\phi_3)/2$ is a displacement measured along the line of measurement and is related to a displacement measured along the line of reference to measurement object mirror 166 by a cosine of the corresponding change in the orientation of measurement object mirror 166. In this context of no first order orientation dependence in the relationship, the line of measurement has a zero Abbé offset. Alternatively, a nonzero Abbé offset can be designed into the tenth embodiment of changing the location of polarizing beam splitter 142 relative the beam splitter assembly 144 and mirror 148. In this case, there will be a first order orientation dependence in the relationship.

The remaining description of the tenth embodiment is the same as corresponding portions of description given for the second embodiment. In other embodiments, similar distance calculations can be performed by detector and processor 180 based on only one of phases $\phi_2$ and $\phi_3$.

The second embodiment of the second set of embodiments the eleventh embodiment, comprises the interferometer system and beam-steering assembly of the sixth embodiment shown schematically in FIGS. 6a and 6b except that processor 582 performs additional functions. For the eleventh embodiment, processor 582 further calculates the difference in physical path length L between the measurement and reference paths based on $\phi_7$, i.e., $L=\phi_7/2$ nk, where k is the wavevector and n is the refractive index of the gas in the measurement path. For the eleventh embodiment the measured value of L is not sensitive to first order to translations of beam-steering mirror 552 in a direction normal to its reflective surface.

A line of reference for the measurement beam of the eleventh embodiment is defined by the direction of measurement beam 511, a defined zero orientation of beam-steering mirror 552, the measurement beam incident on measurement object mirror 562 at normal incidence, and the relationship between locations of polarizing beam splitter 558, mirror assembly 556, mirrors 554, 564A and 564B, and beam-steering mirror 552. For example, with beam-steering mirror 552 at the zero orientation, the measurement beam incident on measurement object mirror 562 at normal incidence, and the projection of a spot, formed by beam 511 on beam-steering mirror 552, onto the opposite surface of 552 coinciding with the spot formed by beam 533, the corresponding path of beam 521 defines a line of reference when using $\phi_7$ to determine the difference in physical path length.

The line of measurement if defined by the path of beam 521, when using $\phi_7$ to determine the difference in physical path length, which intersects measurement object mirror 562 at normal incidence. The linear displacement represented by phase $\phi_7$ is a displacement measured along the line of measurement and is related to a displacement measured along the line of reference to measurement object mirror 562 by a cosine of the corresponding change in the orientation of measurement object mirror 562. In this context of no first order orientation dependence in the relationship, the line of measurement has a zero Abbé offset.

Alternatively, phase $\phi_3$ can be used to determine a linear displacement. For this case, the corresponding line of reference is parallel to the $\phi_7$ line of reference but displaced by a distance $\alpha$. The $\phi_3$ line of measurement coincides with the path of beam 521 and the displacement measured along the line of measurement is related to a displacement measured along the line of reference to measurement object mirror 562 by a cosine of the corresponding change in the orientation of measurement object mirror 562 and a term proportional to the product of $\alpha$ and the corresponding change in the orientation of measurement object mirror 562. In the context of a first order orientation dependence in the relationship, the line of measurement has a nonzero Abbé offset $\alpha$. Similarly, in other embodiments, the average of phases $\phi_7$ and $\phi_3$ can be used to calculate displacement L with a corresponding nonzero Abbé offset of $\alpha/2$.

Abbé offsets other than $\alpha$ and $\alpha/2$ can be incorporated into the eleventh embodiment by introducing a lateral displacement in the path of the measurement beam impinging on object mirror 562. The lateral displacement represents a parallel translation of a beam and can be produced by a rhomb prism such as rhomb 41 of the first embodiment.

The third embodiment of the second set of embodiments, the twelfth embodiment, comprises the interferometer system and beam-steering assembly of the seventh embodiment shown schematically in FIGS. 7a and 7b except that processor 682H performs additional functions. For the twelfth embodiment, processor 682B further calculates the difference in physical path length L between the measurement and reference paths based on $\phi_{10}$, i.e., $L=\phi_{10}/2$nk, where k is the wavevector and n is the refractive index of the gas in the measurement path. For the twelfth embodiment the measured value of L is not sensitive in first order to translations of beam-steering mirror 652 in a direction normal to its reflective surface.

The line of reference for the measurement beam of the twelfth embodiment is defined by the direction of measurement beam 611, a defined zero orientation of beam-steering mirror 652, the measurement beam incident on measurement object mirror 662 at normal incidence, and the relationship between locations of polarizing beam splitter 658, mirror assembly 656, mirrors 654, 664A, and 664B, and beam-steering mirror 652. For example, with beam-steering mirror 652 at the zero orientation, the measurement beam incident on measurement object mirror 662 at normal incidence, and the projection of a spot, formed by beam 611 on beam-steering mirror 652, onto the opposite surface of 652 coinciding with the spot formed by beam 633, the corresponding path of beam 621 defines the line of reference when using $\phi_{10}$ to determine the difference in physical path length.

The line of measurement is defined by the path of beam 621, when using the $\phi_{10}$ line of reference, which intersects measurement object mirror 662 at normal incidence. The linear displacement represented by phase $\phi_{10}$ is a displacement measured along the line of measurement and is related to a displacement measured along the line of reference to measurement object mirror 662 by a cosine of the corresponding change in the orientation of measurement object mirror 662. In this context of no first order orientation dependence in the relationship, the line of measurement has a zero Abbé offset.

Abbé offsets can be incorporated into the twelfth embodiment by introducing a lateral displacement in the path of the measurement beam impinging on object mirror 662. The lateral displacement represents a parallel translation of a beam and can be produced by a rhomb prism such as rhomb 41 of the first embodiment.

In other embodiments similar to the tenth, eleventh, and twelfth embodiments described above, the interferometry system can measure angular displacements of the measurement object in two orthogonal planes and also measure a linear displacement of the measurement object. Three such embodiments respectively follow from the description of the variant of the second embodiment and the tenth embodiment described above, the description of the variant of the sixth embodiment (FIGS 6c–g) and the eleventh embodiment described above, and the description of the variant of the seventh embodiment (FIGS. 7c–d) and the twelfth embodiment described above.

The fourth embodiment of the second set of embodiments, the thirteenth embodiment, comprises the interferometer system and beam-steering assembly of the eighth embodiment shown schematically in FIGS. 8a–c except that processor 790 performs additional functions. For the thirteenth embodiment, processor 790 further calculates the difference in physical path length L between the measurement and reference paths based on $\phi_{13}$, i.e., L=$\phi_{13}$/2nk, where k is the wavevector and n is the refractive index of the gas in the measurement path. For the thirteenth embodiment the measured value L is not sensitive in first order to translations of beam-steering mirror 750 in a direction normal to its reflective surface. Alternatively, in other embodiments signal processor 790 calculates the linear displacement L from $\phi_{14}$ or the average of $\phi_{13}$ and $\phi_{14}$. Furthermore, in other embodiments, the interferometry system can also measure angles along two orthogonal planes. The displacement measured by the twelfth embodiment can include Abbé offsets similar to those described above. The description of the Abbé offsets is the same as corresponding portions of the descriptions given for the first, second, and third embodiments of the second set of embodiments.

The angle and linear displacement calculations in the embodiments in the first and second set of embodiments described above depend on the refractive index $n_M$ of the gas in the measurement path. Changes in the refractive index, caused for example by air turbulence along the measurement path, can therefore alter the angle and displacement measurements. To compensate for such effects any of the interferometry systems described above can involve measurement and reference beams that include at least two separate wavelength components, e.g., dispersion interferometry. The reference and measurement beam components at each wavelength are combined with one another to form an overlapping pair of exit beams. Interferometric signals, e.g., phases $\phi_i$, at each wavelength are then derived from the respective overlapping pair of exit beams. Configuring interferometry systems such as those described above for measurements at multiple wavelengths is described in U.S. patent application Ser. No. 09/305,876, filed May 5, 1999, and entitled "Single-Pass and Multi-Pass Interferometry Systems Having a Dynamic Beam-Steering Assembly For Measuring Distance, Angle, and dispersion" by Henry A. Hill and Peter de Groot, the contents of which are incorporated herein by reference.

In such embodiments, the processing systems and/or angle measuring systems in the embodiments described above will process respective phases $\phi_i$ at two or more wavelengths, in other words, the phases $\phi_i$ are now further indexed with respect to wavelength according to $\phi_{ij}=\phi_i(\lambda_j)$, where $\lambda_j$ specifies the wavelength of the particular component. Similarly, the terms $\eta_i$ defined above with respect to one or more phases $\phi_i$'s are now further indexed as $\eta_{ij}$ to specify the wavelength $\lambda_j$ of the phases $\phi_i$'s. The processing systems and/or angle measuring systems then calculate the refractive effects of the gas on the angular displacement measurements as described below.

The description of the embodiments described herein noted that the angular orientations measured for the measurement object need to be corrected for the refractive effects of gas in a respective measurement path. The correction $\Delta\theta_i$, as given in the equations for $\theta_i$ of the second, third, fifth, sixth, seventh, and eighth embodiments, is expressed as $$\Delta\theta_i = -\int_i \left(\frac{\partial n}{\partial r}\right) ds. \tag{21}$$

The correction $\Delta\theta_i$ can be rewritten to a good approximation in terms of a gradient of a dispersion and the reciprocal dispersive power $\Gamma$ of the gas. The reciprocal dispersive power $\Gamma$ is an intrinsic optical property of the gas and is defined as $$\Gamma = \frac{(n_1 - 1)}{n_q - n_u} \tag{22}$$

where l, q, and u are indices corresponding to wavelengths $\lambda_l$, $\lambda_q$, and $\lambda_u$, respectively, q±u, used in the dispersion interferometry. For a gas where there are not significant gradients in the composition of the gas in the measurement path, Eq. (21) and Eq. (22) can be combined to yield $$\Delta\theta_i = -\Gamma \int_i \left[\frac{\partial(n_q - n_u)}{\partial r}\right] ds \quad \text{or} \tag{23}$$

$$\Delta\theta_i = -\Gamma \left[\int_i \left(\frac{\partial n_q}{\partial r}\right) ds - \int_i \left(\frac{\partial n_u}{\partial r}\right) ds\right]. \tag{24}$$

The difference in the gradients of the refractivity are obtained from the difference in the measured $\theta_i$ at the respective wavelengths where the measured $\theta_i$ are uncorrected for refractive effects of the gas. In particular, the processing systems and/or angle measuring systems can calculate the correction according to Eq. 25)

$$\Delta\theta_i = -\Gamma\{\theta_{iq} - \theta_{iu}\}, \tag{25}$$

where $\theta_{iq}$ and $\theta_{iu}$ correspond to the measured angles for wavelengths $\lambda_q$ and $\lambda_u$, respectively, from the second, third, fifth, sixth, seventh, and eighth embodiments (the index i denoting the respective embodiment). The measured angles $\theta_{iq}$ and $\theta_{iu}$, of course, do not include the refractive index gradient correction otherwise shown in the equations shown above for $\theta_i$ of the second, third, fifth, sixth, seventh, and eighth embodiments. Note that corrections of the refractive effects of the gas on angular and linear displacement measurements both use the same intrinsic property of the gas, the reciprocal dispersive power Γ. Thus, the reciprocal dispersive power Γ can be used to correct interferometric measurements of angle for air turbulence and the like by making the interferometric angle measurement at two or more wavelengths and applying Eq. (25). Measurements and methods for determination of Γ are described in copending, commonly owned U.S. patent application Ser. No. 09/232, 515, filed Jan. 18, 1999, entitled "Apparatus And Methods for Measuring Intrinsic Optical Properties Of A Gas" by Henry A. Hill, the contents of which are incorporated herein by reference.

Four interferometric systems and variants thereof are described herein for measurement of changes in orientation of an optical beam. The apparatus and method of the interferometric systems for measuring and monitoring changes in the relative directions of propagation of optical beam components in a plane or in two orthogonal planes, for measuring and monitoring changes in the direction of propagation of an optical beam, and for establishing and/or measuring an angle between the directions of propagation of two beams. As described above, the interferometric systems for measurement of changes in orientation of an optical beam (also referred to as angular displacement interferometers) can be used in the angular measuring detectors of the previously described embodiments employing a dynamic beam steering element.

The first interferometric system and variant thereof measures and monitors changes in the relative directions of propagation of optical beam components in a plane or in two orthogonal planes. The second interferometric system measures changes in the direction of propagation of a beam component in one plane relative to a direction fixed by the apparatus of the second interferometric system. The third interferometric system and variant thereof measures changes in the direction of propagation of a beam in one plane relative to a direction fixed by the apparatus of the third interferometric system. The fourth interferometric system and variant thereof determines interferometrically when an angle between the directions of propagation of two beams in a given plane is the same as a predetermined value according to an end use application and/or measures in a given plane the angle between the directions of propagation of two beams.

Figure 12A:
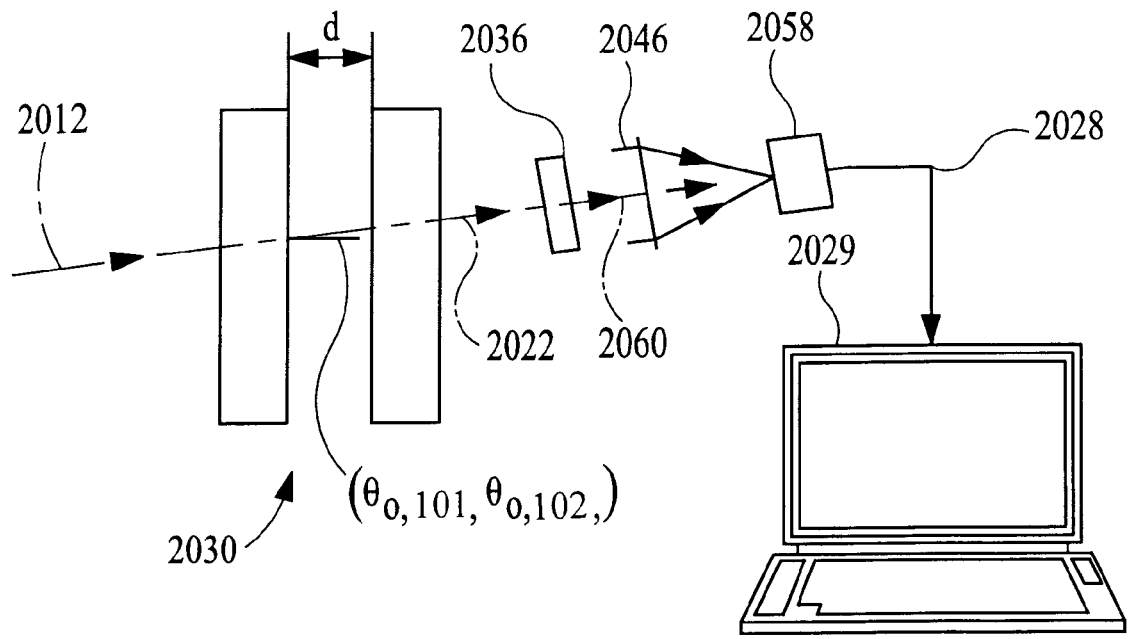
FIG. 12a is a diagrammatic elevational view, with parts in perspective, of a first interferometric system of four interferometric systems that measures changes in the angle between the directions of propagation of two beam components in one plane.

The first interferometric system is shown schematically in FIG. 12a. Input beam 2012 comprises two orthogonally polarized components having a difference in frequencies of $f_{101}$. The directions of propagation of the two components of input beam 2012 may be the same or different one from the other. Input beam 2012 impinges on an etalon generally indicated by element number 2030 with a gap d. The angles of incidence of the first and second components of input beam 12 at the interior faces of etalon 2030 are $\theta_{o.101}$ and $\theta_{o.102}$, respectively. Angles $\theta_{o.101}$ and $\theta_{o.102}$ are selected so that the transmission of the first and second components of input beam 2012 by etalon 2030 are each substantially at a maximum excluding the maximum in transmission possible at $\theta_{o.j}=0$ for j=101, 102. For the first interferometric system, the difference angle $(\theta_{o.102}-\theta_{o.101})<<$ than the angular width of the corresponding transmission peak.

The first and second components of input 2012 are transmitted as first and second orthogonally polarized beam components of output beam 2022. Output beam 2022 is transmitted by polarizer 2036 to form mixed beam 2026. Mixed beam 2026 is focused by lens 2046 to an image spot on detector 2058. The beam forming the image spot is detected, preferably by photoelectric detection, by detector 2058 as electrical interference signal 2028.

Signal 2028 is a heterodyne signal having a heterodyne frequency equal to $f_{101}$, for difference in frequencies of the first and second components of input beam 2012, and a heterodyne phase $\phi_{101,102}$. Signal 2028 may be processed by a suitably programmed general purpose computer such as that designated generally at 2029 or by customized electronic processors or their equivalent.

For a non-limiting example of a non-apodized square aperture at lens 2046, the intensity profile $I_{h.101}$, at the image spot in the plane of FIG. 12a for components of beam 2026 responsible for heterodyne signal 2028, is written to a good approximation as $$I_{h.101} = \frac{C_{h.101}(1-R_{101})^2}{[(1-R_{101})^2+4R\sin^2(\delta'_{101,102}/2)]} \times \qquad (26)$$

$$\operatorname{sinc}^2[kp_{101.102}(b/2)]\cos[\omega_{101}t+(\phi_{102}-\phi_{101})]$$

where $$\delta'_j = 2knd(p_j\tan\theta_{o,j}+\cos\theta_{o,j}), j=101,102, \qquad (27)$$

$$p_j = \sin\theta_{o,j}+\sin\theta_{u,j}, j=101,102, \qquad (28)$$

$$\tan\phi_j = \frac{R_{101}\sin\delta_j}{1-R_{101}\cos\delta_j}, \quad j=101,102, \qquad (29)$$

Figure 12B:
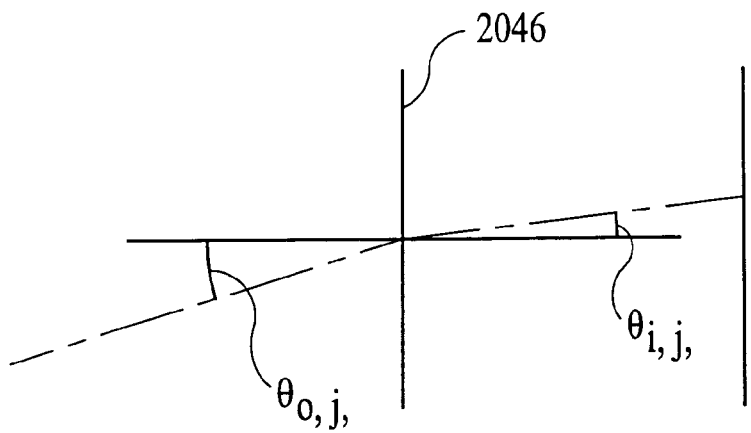
FIG. 12b shows the relationship between angles $\theta_{o,1}$ and $\theta_{o,2}$ that are useful in understanding the operation of the interferometric system.

$\delta'_{101,102}=(\delta'_{102}+\delta'_{101})/2$, $p_{101.102}=(p_{102}+p_{101})/2$, b is the width of the square aperture at lens 2046 in the plane of FIG. 12a, $C_{h.101}$ is a proportionally constant, $R_{101}$ is the intensity reflectivity of the interior surfaces of etalon 2030, $\omega_{101}=2\pi f_{101}$, and k and n are, respectively, the wavenumber of the input beam components and the index of refraction of a medium in the gap of etalon 30. Angles $\theta_{o.101}$ and $\theta_{o.102}$ are defined in FIG. 12b.

Heterodyne signal 2028 is proportional to the integral of $I_{h.101}$ over the image spot. At a transmission peak, i.e. $\delta'_j \cong 2q_j\pi$ where $q_j$ is an integer typically >>1 and $\phi_j \cong 2q'_j\pi$ where $q'_j$ is an integer, sensitivity of heterodyne phase $\phi_{1,2}$ to changes in $\theta_{o.101}$ and $\theta_{o.102}$ may be expressed as $$d\varphi_{101,102} = -\frac{R_{101}}{(1-R_{101})}2knd \times \qquad (30)$$

$$\left[\sin\left(\frac{\theta_{o.102}+\theta_{o.101}}{2}\right)\right](d\theta_{o.102}-d\theta_{o.101}).$$

In order to reduce complexity in the display of general properties of the invention without departing from the scope or spirit of the invention, higher order terms in Eq. (30) have been omitted.

Heterodyne phase, $\phi_{101.102}=\phi_{103}-\phi_{101}$, may be obtained through the use of time based phase analysis procedures such as with a Hilbert transform or the like.

For an etalon spacing of d=4 mm, $R_{101}=0.99$, $\lambda=633$ nm, n=1.000, and $[(\theta_{o.101}+\theta_{o.101})/2]=0.0129$ rad, sensitivity of phase $\phi_{101.102}$ to changes in $\theta_{o.101}$ and $\theta_{o.100}$ is $$d\phi_{101.102}=-1.01\times10^5(d\theta_{o.102}-d\theta_{o.101}) \qquad (31)$$

Or expressed in terms of sensitivity of inferred values for $(d\theta_{o.102}-d\theta_{o.101})$ from measured changes in phase $\phi_{101.102}$, $$(d\theta_{o.102}-d\theta_{o.101})=-0.99\times10^{-5}d\phi_{101.102} \qquad (32)$$

It is evident for the first interferometric system that the measurement of a difference in angle $(d\theta_{o.102}-d\theta_{o.101})$ is based on an optical differencing technique wherein the measured phase difference between a first and second beam components is not sensitive in first order to effects of a frequency shift common to both the first and second beam components.

Improved accuracy in measurements of relative changes in directions of propagation of input beam components can be obtained by operating at a low frequency split between the first and second beam components. The option to use a low frequency split in certain end use applications is a direct consequence of the absence of first order input beam frequency shift effects in the phase of heterodyne signal 2028 used to measure and monitor changes in relative directions of propagation of components of input beam 2012.

The phase of the electrical interference signal used to measure and monitor changes in direction of propagation of the input beam may be determined using either a heterodyne technique as described or a homodyne technique when frequency $f_{101} \cong 0$.

The first interferometric system can be used as a null detector without accurate knowledge of the coefficient of $d\phi_{101,102}$ in Eq. (32). With the calibration of the coefficient of $d\phi_{101,102}$ in Eq. (32), the first interferometric system can be used to measure relative changes in the direction of propagation of the first and second components of input beam 2012 that are less than the width of the corresponding transmission peak. For end use applications where there are relative changes in the direction of propagation of the first and second components of input beam 2012 that are of the order of or greater than the width of a corresponding transmission peak, subsequently described third interferometric system is a preferred interferometric system.

Figure 13:
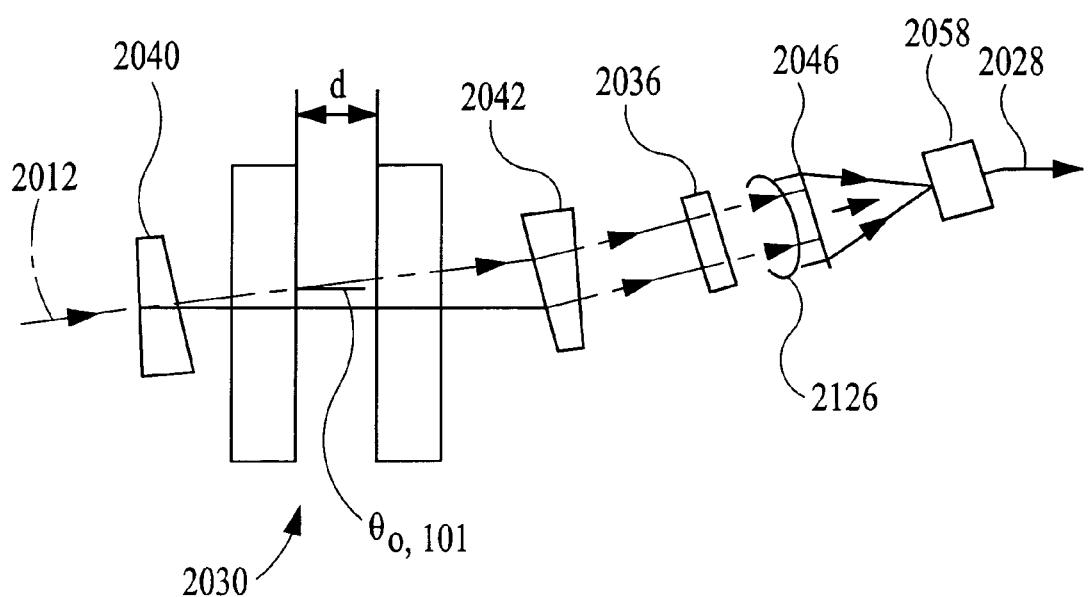
FIG. 13 is a diagrammatic elevational view of a second interferometric system of the four interferometric systems that measures changes in the direction of propagation of a beam component in one plane relative to a direction fixed by the apparatus of the second interferometric system.

The second interferometric system is shown schematically in FIG. 13. Apparatus of the second interferometric system comprises the same components as the apparatus of the first interferometric system and two birefringent prism 2040 and 2042. Birefringent prism 2040 introduces an angle between the first and second components of input beam 2012 such that $\theta_{o.101}$ and $\theta_{o.102}$ correspond to two different transmission peaks of etalon 2030. Birefringent prism 2042 recombines beams out of etalon 2030 so that first and second components of the output beam 2126 associated with the first and second components of input beam 2012, respectively, have substantially the same relative directions of propagation as that of the first and second components of input beam 2012. For example, if $\theta_{o.102}$ for the second interferometric system, then the sensitivity of phase $\phi_{101,102}$ to changes in $\theta_{o.101}$ is expressed by Eqs. (30) and (31) with $d\theta_{o.102}=0$. Likewise, sensitivity of inferred values for $d\theta_{o.101}$ from measured changes in phase $\phi_{101,102}$ is expressed by Eq. (32) with $d\theta_{o.102}=0$.

Thus, with the calibration of the coefficient of $d\phi_{101,102}$ in Eq. (32), the second interferometric system can be used to measure changes in the direction of propagation of the first component of the input beam 2012 with respect to an orientation of the apparatus of the second interferometric system. It will be evident to those skilled in the art that the second interferometric system can equally well be been configured to measure changes in the direction of propagation of the second component of input beam 2012 without departing from the scope or spirit of the invention of the interferometric systems.

The remaining description of the second interferometric system is the same as corresponding portions of the description given for the first interferometric system.

Figure 14A:
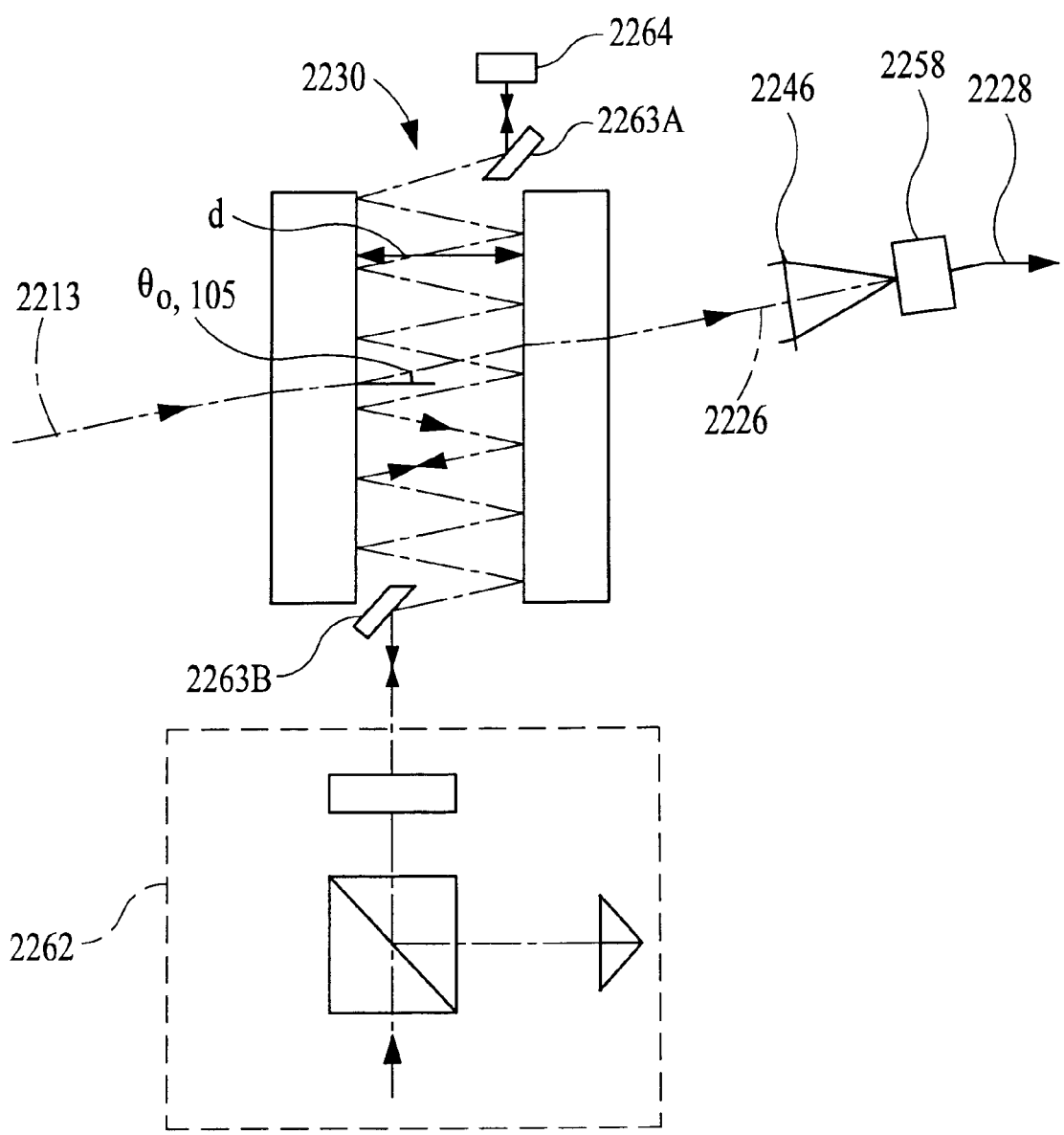
FIG. 14a is a diagrammatic elevational view of a third interferometric system of the four interferometric systems that measures changes in the direction of propagation of a beam in one plane relative to a direction fixed by the apparatus of the third embodiment.

The third interferometric system is shown schematically in FIG. 14a. The third interferometric system measures changes in the direction of propagation of a beam in one plane relative to a direction fixed by the apparatus of the third interferometric system. In the third interferometric system, a change in the direction of the beam is first converted to information contained in a change in an optical path length and then the information contained in the change in the optical path length is measured interferometrically. The measured change in the optical path is subsequently used to determine the corresponding change in the direction of the beam.

The apparatus of the third interferometric system shown in FIG. 14a comprises many components that are the same as components of the first interferometric system. Elements of the third interferometric system performing the same functions as elements of the first interferometric system have element numbers that are the same as element numbers of corresponding elements of the first interferometric system incremented by 200. Input beam 2213 is a single frequency optical beam. Apparatus of the third interferometric system further comprises a differential plane mirror interferometer 2262 with measurement object formed by mirrors 2263A, 2263B, and 2264 and the reflecting surfaces of etalon 2230.

The intensity profile, at the image spot in the plane of FIG. 14a for the beam responsible for signal $s_{105}$ indicated as element 2228 in FIG. 3a, is written to a good approximation as $$I_{h.101} = \frac{C_{105}(1-R_{105})^2}{[(1-R_{105})^2 + 4R_{105}\sin^2(\delta'_{105}/2)]}\sin^2[kp_{105}(b/2)] \quad (33)$$

where $$\delta'_{106} = 2knd(p_{105}\tan\theta_{o.105} - \cos\theta_{o.105}), \quad (34)$$

$$p_{105} = \sin\theta_{o.105} + \sin\theta_{i.105}, \quad (35)$$

$C_{105}$ is a proportionality constant, and $R_{105}$ is the intensity reflectivity for the reflecting surfaces of etalon 2230.

For a high finesse etalon system, $I_{h.105}$ given by Eq. (33) reduces to $$I_{h.105} = C_{105}\sin^2[kp_{105}(b/2)] \quad (36)$$

with $\delta'_{105} = 2q_{105}\pi$ where $q_{105}$ is an integer, $I_{h.105}$ expressed by Eq. (36) may be written in a Taylor series about a value $(p_{105})_0$ of $p_{105}$ as $$I_{h.5} = C_5 \left\{ \begin{array}{l} \sin^2[k(p_5)_0(b/2)] - \\ \frac{1}{6}\sin c[k(p_5)_0(b/2)](kb)^2(p_5)_0[p_5 - (p_5)_0] + K \end{array} \right\}. \quad (37)$$

From Eq. (34), we obtain the relationship $$[p_{105} - (p_{105})_0] = -\frac{[(nd)-(nd)_0]\cos\theta_{o.105}}{(nd)_0\tan\theta_{o.105}}. \quad (38)$$

Higher order terms have been omitted in Eq. (38) for the purpose of displaying the important features of the invention without departing for the scope or spirit of the invention of the interferometric systems.

In the operation of the third interferometric system, the quantity (nd) is modulated at an angular frequency $\omega_{105}$ with an amplitude $\Delta(nd)$ or written as a formula $$(nd) = (nd)_0 + \Delta(nd)\cos\omega_{105}t. \quad (39)$$

With the use in Eq. (37) expressions for $p_{105}$ and (nd) given by Eqs. (38) and (39), we obtain the equation for $I_{h.105}$ $$I_{h.101} = C_5 \left\{ \begin{array}{c} \text{sinc}^2\left[\frac{k(p_{105})_0 b}{2}\right] - \\ \frac{1}{6}\text{sinc}\left[\frac{k(p_{105})_0 b}{2}\right]\left(\frac{\cos\theta_{o.105}}{\tan\theta_{o.105}}\right)\left(\frac{\Delta(nd)}{nd}\right) \times \\ (kb)^2(p_{105})_0 \cos\omega_{105}t + K. \end{array} \right\} \quad (40)$$

The amplitude of the Fourier component of $I_{h.105}$ at angular frequency $\omega_{105}$ is proportional to a non-zero value of $(p_{105})_0$. In the third interferometric system, measured values of the Fourier component can be used as the error signal in a servo control system to servo control $(p_{106})_0$ such that $(_{106})_0=0$. It will be appreciated that if $(p_{106}(_0=0$, optical beam 2213 is passing through a place in image space where there is a maximum for the transfer function of etalon 2230.

The control of $(_{106})_0$ in the third interferometric system is by modifying the spacing d of etalon 2230 by piezoelectric transducers (not shown in FIG. 14a). The signal to the piezoelectric transducers is derived from signal 2228.

Note that the amplitude of the Fourier component exhibits a high sensitivity to an error or non-zero value in $(p_{105})_0$ because of the presence of factor $(kb)^2/(2\tan\theta_{o.105})$. The value for the factor $(kb)^2/(6\tan\theta_{o.105})$ is $1.9\times10^{10}$ for b=4 mm, n=1.000, $\lambda$=633 nm, and $\theta_{o.105}$=0.014 rad. At an error in $(p_{105})_0$ of $10^{-8}$ rad and a $[\Delta(nd)/(nd)]=10^{-5}$, the amplitude of the signal at $\omega_5$ relative to signal component with amplitude $C_{105}$ is 0.0019.

Figure 16:
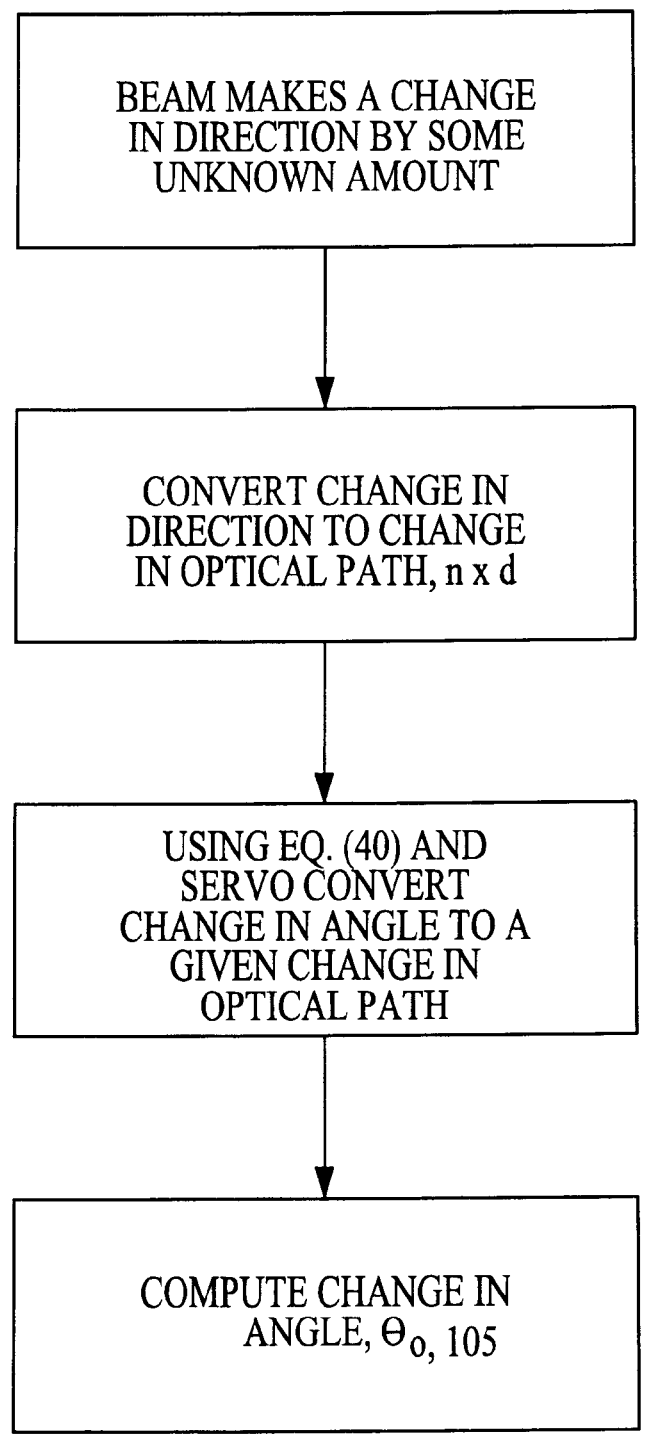
FIG. 16 is a flow chart indicating various steps that may be carried out to practice the fourth interferometric system of the four interferometric system and variants thereof.

The control if $(p_{105})_0$ so that $(p_{105})_0=0$ converts a change in the direction of propagation of input beam 2213 to information contained in a change in an optical path length. Next the information contained in the change in the optical path length (nd) is used to determine the corresponding change in the direction of propagation of input beam 2213. The changes in optical path length (nd) are measured interferometrically in the third interferometric system by the second interferometer, differential plane mirror interferometer 2262. Changes in $\theta_{h.105}$ are then obtained from the measured changes in optical path length(nd) using Eq. (34) noting that $\delta_{105}=2q_{106}\pi$ and $(p_{106})=0$. The flow chart for this procedure is given in FIG. 16. The measurement beam of interferometer 2262 is arranged to make multiple reflections at the high reflectivity surfaces of etalon 2230 so as to increase sensitivity of the second interferometer 2262 to changes in optical path length (nd).

For end use applications where beam 2213 is a beam derived from a displacement measuring interferometer operating in a heterodyne mode, the source of the input beam for the second interferometer 2262 is a portion of two frequency input beam to the displacement measuring interferometer so that the second interferometer 2262 also operates in a heterodyne mode.

The remaining description of the third interferometric system is the same as corresponding portions of the description given for the description of the first interferometric system.

Figure 14B:
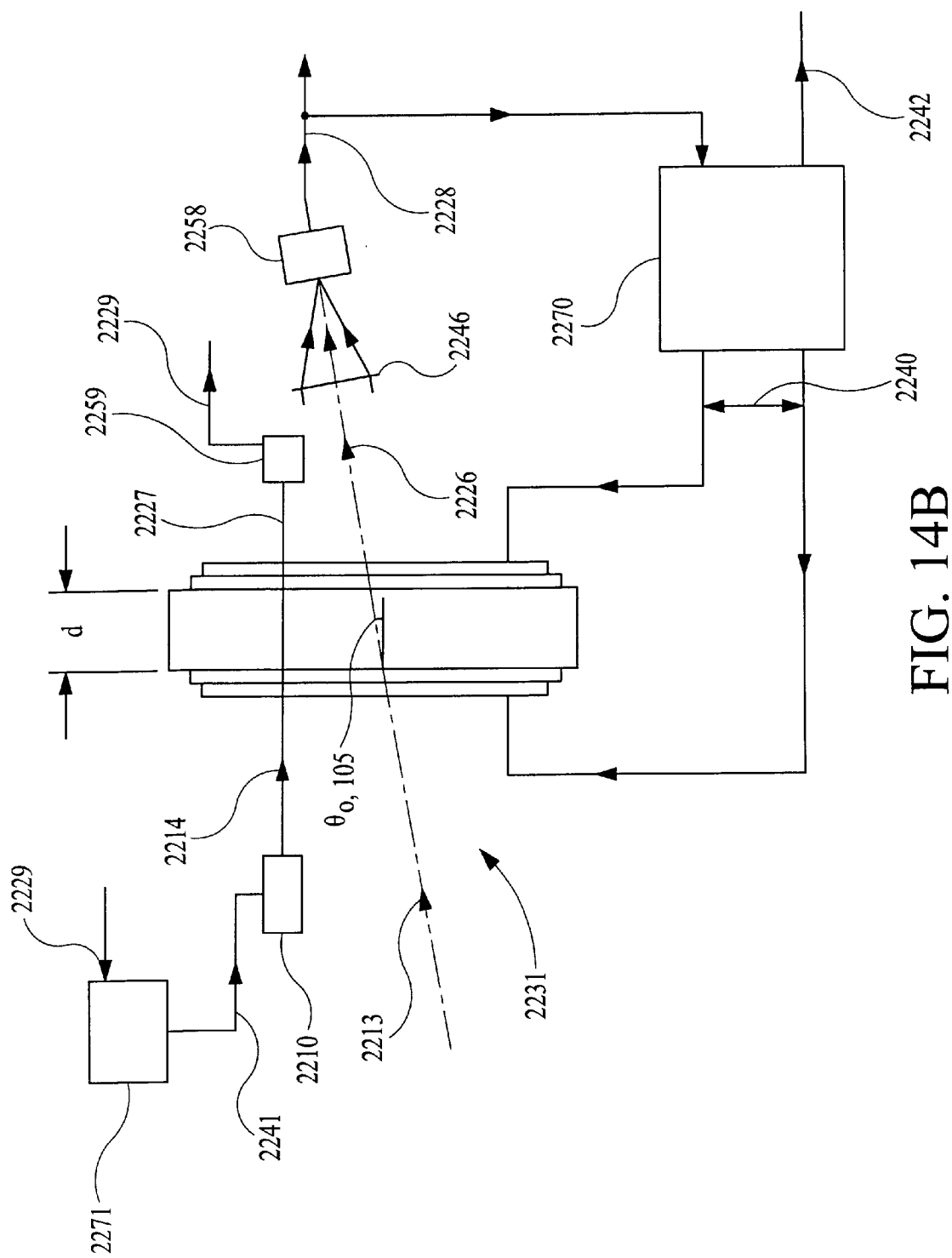
FIG. 14b is a diagrammatic elevational view of a variant of the third interferometric system of the four interferometric systems that measures changes in the direction of propagation of a beam in one plane relative to a direction fixed by the apparatus of the third interferometric system.

A variant of the third interferometric system is schematically in FIG. 14b. Apparatus of the variant of the third interferometric system comprises elements of the apparatus of the third interferometric system having the same element numbers and an etalon generally indicated as element 2231 in FIG. 14b.

Etalon 2231 comprises high finesse cavity surfaces with an electro-optic crystal as the medium. For the variant of the third interferometric system, optical path length (nd) is controlled by applying an electric field to the electro-optical crystal. The electric field is created by electrical signal 2240 applied to the transparent electrodes of etalon 2231. A component of electric signal 2240 is generated as a servo control signal by electronic processor 270 based on heterodyne signal 2228. Electrical signal 2240 also comprises a component modulated at angular frequency $\omega_{105}$. The servo signal component of electrical signal 240 controls the electric field so as to control $(p_{106})_0$ such that $(p_{105})_0=0$.

The control of $(p_{106})_0$ such that $(p_{106})_0=0$ converts a change in the direction of propagation of input beam 2213 to information contained in a change in an optical path length (nd). For certain end use applications, changes in optical path length (nd) can be derived by electronic processor 2270 directly from the servo control signal component of electrical signal 2240 as output signal 2242 and knowledge of the relationship between n and an applied electrical signal.

For certain other end use applications, changes in optical path length (nd) are measured by a second optical system comprising optical source 2210, input beam 2214, output beam 2227, detector 2259, electrical signal 2229, electronic processor 2271, and servo control signal 2241. The direction of propagation of input beam 2214 is orthogonal to the high reflectivity surfaces of etalon 2231.

Source 2210 comprises a source of a single frequency beam such as a single mode laser diode. The wavenumber $k_{106}$ of source 2210 is modulated at an angular frequency $\omega_{106}$ by modulation of an injection current to the laser diode. The component of output beam 2229 at angular frequency $\omega_{106}$ is used by electronic processor 2271 to generate servo control signal 2241. Servo control signal 2241 is transmitted to source 2210 to control the wavenumber $k_{106}$ such that $2k_{106}nd=2\pi q_{106}$ where $q_{106}$ is an integer. Under the condition $2k_{106}nd=2\pi q_{106}$, a change in the direction of propagation of input beam 2213 has been converted to information contained in a change in wavenumber $k_{106}$.

Changes in $k_{106}$ are measured using know techniques. One known technique measures the beat frequency between a portion of beam 2214 and a reference beam of fixed frequency. A second known technique measures interferometrically the change in an optical path of fixed physical length. For certain end use applications, knowledge of the relationship between the injection current to the diode laser and wavenumber $k_{106}$ may be used to monitor changes in $k_{106}$. Changes in $\theta_{o.106}$ are then obtained from the measured changes in wavenumber $k_{106}$ using Eq. (34) noting that $\delta'_{105}=2q_{105}\pi$, $(p_{105})=0$, and $2k_{106}nd=2\pi q_{106}$.

The remaining description of the variant of the third interferometric system is the same as corresponding portions of the description given for the third interferometric system.

Figure 15:
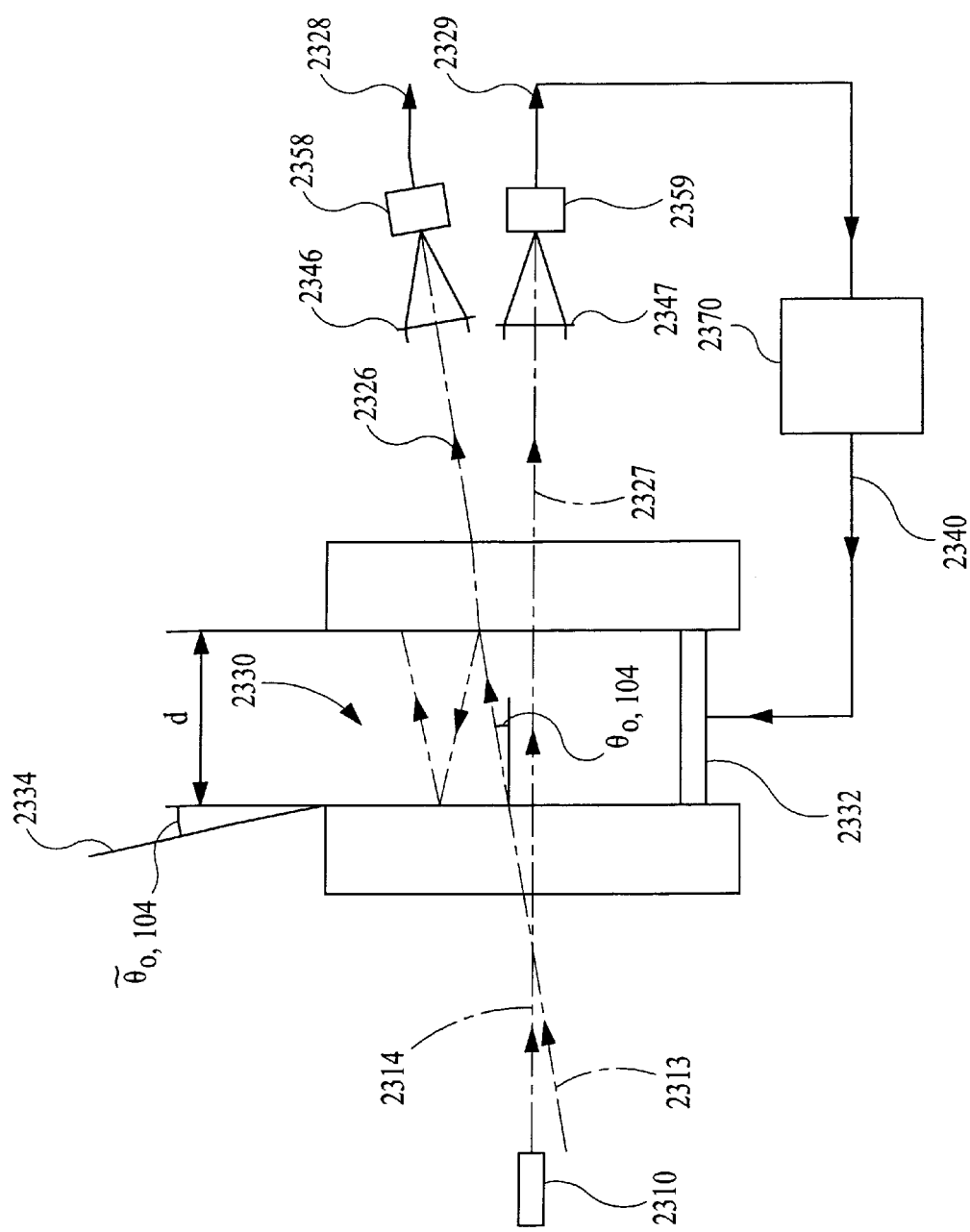
FIG. 15 is a diagrammatic elevational view of a fourth interferometric system of the four interferometric systems that determines interferometrically when an angle between the directions of propagation of two beams in a given plane is the same as a predetermined value according to an end use application and/or measures in a given plane the angle between the directions of propagation of two beams.

The fourth interferometric system is shown schematically in FIG. 15. The fourth interferometric system determines interferometrically the degree to which an angle between the directions of propagation of two beams in a given plane is the same as a predetermined value according to an end use application. The variant of the fourth interferometric system measures interferometrically in a plane the angle between the directions of propagation of two beams.

The apparatus of the fourth interferometric system shown in FIG. 15 comprises many components that are the same as components of the first interferometric system. Except for properties of etalon 2330, generally indicated in FIG. 15 as element 2330, elements of the fourth interferometric system performing the same functions as elements of the first interferometric system have element numbers that are the same as element numbers of corresponding elements of the first interferometric system incremented by 300.

Apparatus of the fourth interferometric system comprises two interferometric subsystems. A first interferometric subsystem produces a electrical signal 2328 that indicates an error in the direction of propagation of input beam 2313. Input beam 2313 is a single frequency optical beam. The error is a change the angle $\theta_{107}$ from a predetermined value $\theta_{o,107}$ wherein angle $\theta_{107}$ is the angle between the direction of propagation of input beam 2313 in the plane of FIG. 15 relative to a normal to the two surfaces defining the cavity of etalon 2330 (see FIG. 15). A second interferometric subsystem generates control signal 2340 for control of the spacing $d_{107}$ of etalon 2330 to a predetermined value. Spacing $d_{107}$ is determined by transducer 2332 comprising a set of piezoelectric transducers (one shown).

The first interferometric subsystem generates an electrical signal $s_{107}$ indicated as element 2328 in FIG. 15. Electrical signal $s_{107}$ has the same general properties of signal $s_{105}$ of the third interferometric system given by Eq. (40) and may be written as $$s_7 = C_7 \left\{ \begin{array}{l} \text{sinc}^2\left[\frac{k(p_7)_0 b}{2}\right] - \\ \frac{1}{6}\text{sinc}\left[\frac{k(p_7)_0 b}{2}\right]\left(\frac{\cos\theta_{o,7}}{\tan\theta_{o,7}}\right)\left(\frac{\Delta(nd)}{nd}\right) \\ (kb)^2 (p_7)_0 \cos\omega_7 t + K \end{array} \right\}. \tag{41}$$

The heterodyne component of $s_7$ has an angular frequency $\omega_7$.

The remaining description of the operation of the first interferometric subsystem is the same as corresponding portions of the description given for the third interferometric system.

A second interferometric subsystem generates an electrical signal $s_9$ indicated as element 2329 in FIG. 15. Electrical signal $s_8$ may be written as $$s_{108} = C_{108} \left\{ \begin{array}{l} \text{sinc}^2\left[\frac{k(p_{108})_0 b}{2}\right] - \\ \frac{8R_{107}}{(1-R_{107})^2}(kb\cos\theta_{o,108})^2 \times \\ \left(\frac{\Delta(nd)}{nd}\right)\Delta(nd)_0 \cos\omega_{107} t + K. \end{array} \right\} \tag{42}$$

The heterodyne component of $s_{108}$ has an angular frequency $\omega_{107}$. The heterodyne component of $s_{108}$ is used by electronic processor 2370 to generate servo control signal 2340 for the control of (nd) such that $$2k_{107}(nd)_{107} = 2\pi q_{107}, \quad q_{107} = 1.2 \text{ K} \tag{43}$$

It should be evident that the foregoing arrangements are particularly suitable for use in high frequency applications. The remaining description of the fourth interferometric system is the same as corresponding portions of the description given for the first and third interferometric system.

It will be evident to those skilled in the art that the apparatus of the fourth interferometric system may be used to measure the angle between two lines with the resolution of the phase redundancy represented by $q_{107}$ and $q_{108}$. The phase redundancy can be resolved by known techniques. The two lines may comprise normals to one or more surfaces and/or directions of propagation optical beams.

Returning to interferometry systems that employ a dynamic beam-steering element to measure distance changes to, and/or angular orientation changes of, a measurement object, additional embodiments can position the dynamic beam-steering element to direct the measurement beam only after the measurement beam reflects from the measurement object. For example, referring to FIG. 17, input beam 1710 is directed into an interferometer 1720. For the purposes of the present description, interferometer 1720 is a single-pass Michelson-type interferometer, but in other embodiments the interferometer can be of a different type. The interferometer includes polarizing beam splitter 1730, quarter-wave plates 1732 and 1734, reference mirror 1736, and measurement object 1740. Interferometer 1720 produces intermediate beam 1750 including a measurement component reflected from measurement object 1740 and a reference component reflected from reference mirror 1736, the measurement and reference components being orthogonally polarized to one another.

Changes in the angular orientation of the measurement object can cause an angular deviation between the measurement and reference components of intermediate beam 1750 that can degrade subsequent interference measurements. Thus, polarizing beam splitter 1760 separates intermediate beam 1750 into reference beam 1762 and measurement beam 1764, which is directed to a first surface of beam steering mirror 1766. Beam steering mirror 1766 and orientation transducers 1767A and 1767B comprise a beam steering assembly, which redirects beam 1764 to mirror 1770 and sequentially onto mirror 1772, mirror assembly 1774, and mirror 1776, which directs the beam to a second surface of beam steering mirror 1766. Mirror assembly 1774 is an image inverter about an axis in the plane of FIG. 17a and orthogonal to the direction of propagation of the entering it. Mirror assembly 1774 can be identical to those describe previously in any of FIGS. 4b, 5b, 5d, 6b, 6d, 7b, 7e, and 8b.

The second surface of beam steering mirror 1766 then directs measurements beam 1764 to polarizing beam splitter 1780. Reference beam 1762 is redirected by mirror 1782 to polarizing beam splitter 1780, which recombines the measurement and reference beams to form output beam 1790.

A nonpolarizing beamsplitter 1786 sends a first portion 1792 of output beam 1790 to an angle measurement detector 1702 and a second portion 1794 of output beam 1790 to a distance measurement detector 1704. Angle measurement detector 1702 can be any of the one described previously for producing a control signal 1706 causing transducers 1767A and 1767B to reorient beam steering mirror 1766. For example, in the presently described embodiment, angle measurement detector 1702 operates in the null mode to cause the beam steering mirror to reorient in response to changes in the angular orientation of the measurement object to cause the measurement and reference components of output beam 1790 to propagate parallel with one another. Although there may be some lateral shear between the reference and measurement beam components of output beam 1790, the lateral shear can be made relatively small because the measurement beam makes only a single pass to the measurement object, rather than two or more passes as in conventional high stability distance measuring interferometers. Detector 1708 monitors the reorientation of the beam steering mirror to determine the change in angular orientation of the measurement object as described previously.

As also described previously, distance measurement detector 1704 can include a polarizer to mix the polarizations of the measurement and reference components of second portion 1794 of output beam 1790, a detector to measure the intensity of the optical interference produced by mixing the polarizations of the measurement and reference components, and a processor determine changes in distance to the measurement object based on the phase of the interference intensity.

Figure 17:
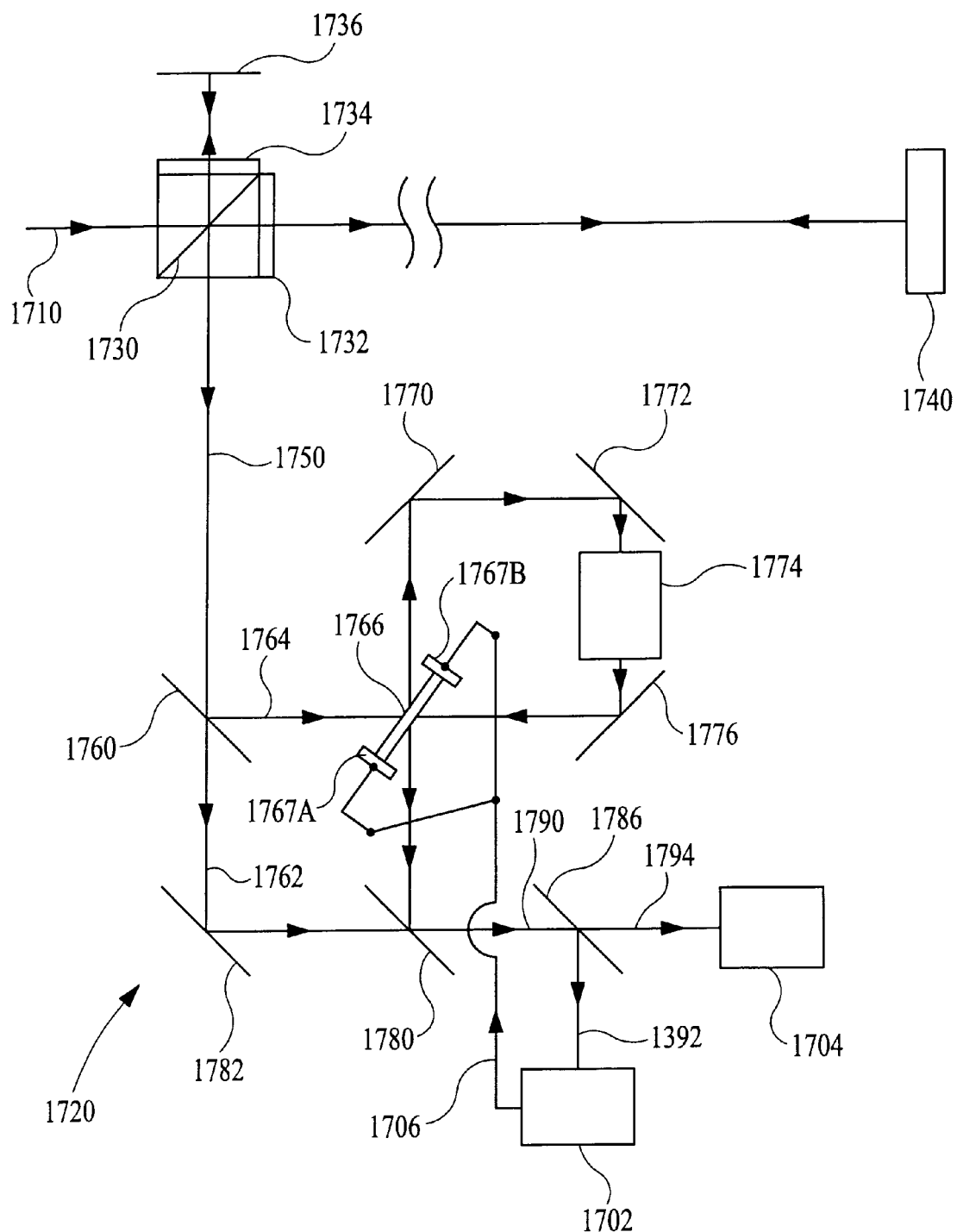
FIG. 17 is a schematic diagram of another embodiment of the interferometry system, in which the dynamic beam steering element redirects the measurement beam only after it is reflected from the measurement object.

In other embodiments similar to that shown in FIGS. 17, a portion of intermediate beam 1750 is sent to one of the angular displacement interferometers described with reference to FIGS. 12a, 12b, 13, 14a, 14b, 15, and 16 to measure directly the angular displacement between the measurement and reference components of the intermediate beam, from which the change in angular orientation of the measurement object can be determined. Furthermore, in such embodiments, instead of using angle measurement detector 1702 operating in the null mode to produce control signal 1706 causing the reorientation of beam steering element 1766, the control signal may be based on the measurement by the angular displacement interferometer.

The interferometry systems of the embodiments described above can be especially useful in lithography applications that fabricate large-scale integrated circuits such as computer chips and the like. Lithography is the key technology driver for the semiconductor manufacturing industry. Overlay improvement is one of the five most difficult challenges down to and below 100 nm line widths (design rules), see for example the Semiconductor Industry Roadmap, p82 (1997). Overlay depends directly on the performance, i.e. accuracy and precision, of the distance measuring interferometers used to position the wafer and reticle (or mask) stages. Since a lithography tool may produce $50–100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at the location (exposure).

To properly position the wafer, the wafer includes alignment marks on the wafer that can be measured by dedicated sensors. The measured positions of the alignment marks define the location of the wafer within the tool.

This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

The interferometry systems described above are important components of the positioning mechanisms that control the position of the wafer and reticle, and register the reticle image on the wafer.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

The interferometry systems described above can be used to precisely measure the positions (e.g., distances and/or angular orientations) of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, the interferometry system can be used to measure the position of any one component of the exposure system relative to any other component of the exposure system, in which the interferometry system is attached to, or supported by, one of the components and the measurement object is attached, or is supported by the other of the components.

Figure 9A:
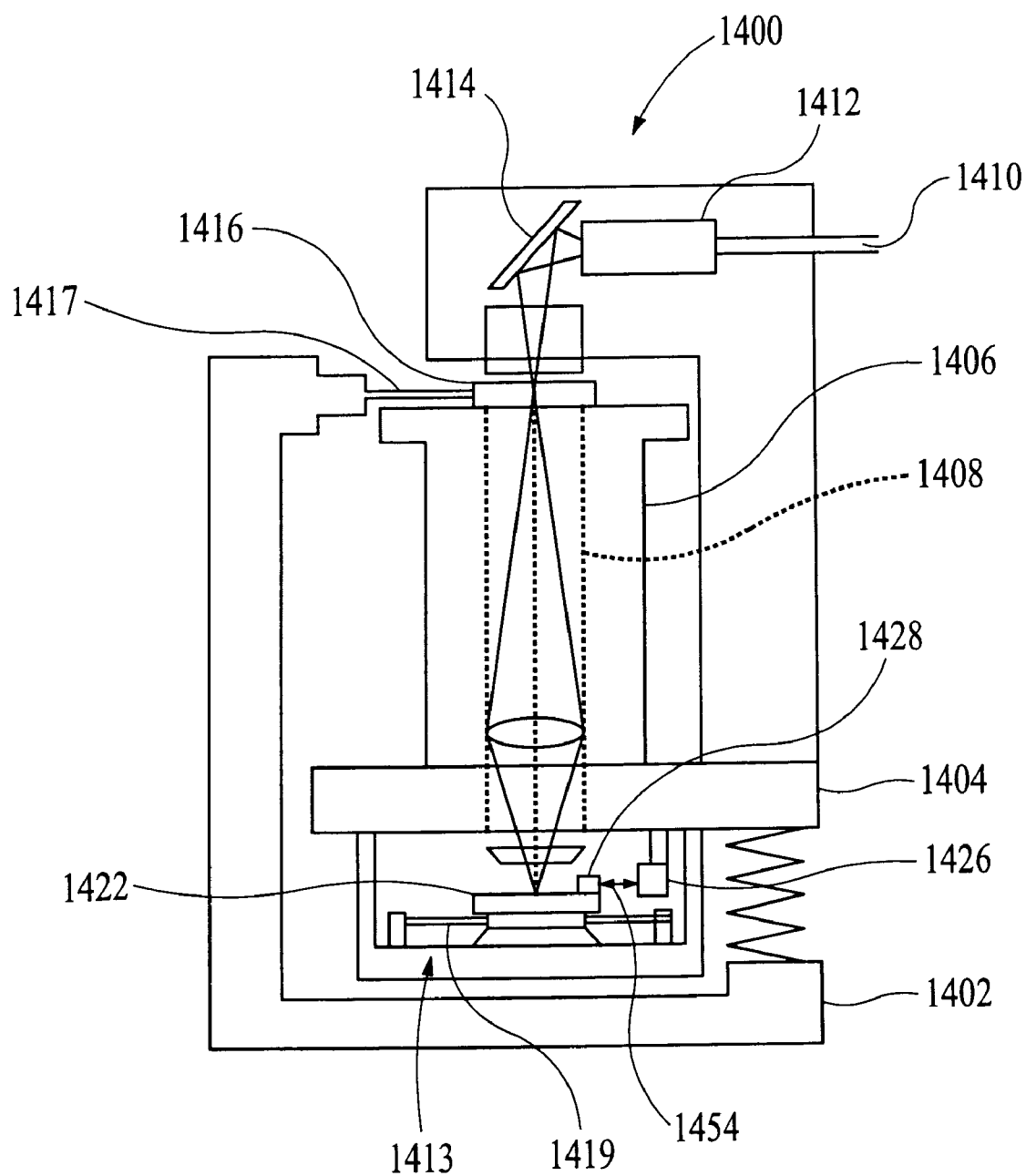
FIGS. 9a–c relate to lithography and its application to manufacturing integrated circuits.

An example of a lithography scanner 1400 using an interferometry system 1426 is shown in FIG. 9a. The interferometry system is used to precisely measure the position of a wafer within an exposure system. Here, stage 1422 is used to position the wafer relative to an exposure station. Scanner 1400 comprises a frame 1402, which carriers other support structures and various components carried on those structures. An exposure base 1404 has mounted on top of it a lens housing 1406 atop of which is mounted a reticle or mask stage 1416, which is used to support a reticle or mask. A positioning system for positioning the mask relative to the exposure station is indicated schematically by element 1417. Positioning system 1417 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1404 is a support base 1413 that carries wafer stage 1422. Stage 1422 includes a plane mirror 1428 for reflecting at least one measurement beam 1454 directed to the stage by interferometry system 1426. A positioning system for positioning stage 1422 relative to interferometry system 1426 is indicated schematically by element 1419. Positioning system 1419 can include, e.g., piezoelectric transducer elements and corresponding control electronics. The measurement beam(s) reflects back to the interferometry system, which is mounted on exposure base 1404. The interferometry system can be any of the embodiments described previously.

During operation, a radiation beam 1410, e.g., an ultraviolet (UV) beam from a UV laser (not shown), passes through a beam shaping optics assembly 1412 and travels downward after reflecting from mirror 1414. Thereafter, the radiation beam passes through a mask (not shown) carried by mask stage 1416. The mask (not shown) is imaged onto a wafer (not shown) on wafer stage 1422 via a lens assembly 1408 carried in a lens housing 1406. Base 1404 and the various components supported by it are isolated from environmental vibrations by a damping system depicted by spring 1420.

In other embodiments of the lithography scanner, one or more of the interferometry systems described previously can be used to measure angles and/or distances along multiple axes associated for example with, but not limited to, the wafer and reticle or mask) stage. Also, rather than a UV laser beam, other beams can be used to expose the wafer including, e.g., x-ray beams, electron beams, ion beams, and visible optical beams.

In addition, the lithographic scanner can include a column reference in which interferometry system 1426 directs the reference beam to lens housing 1406 or some other structure that directs the radiation beam rather than a reference path internal to the interferometry system. The interference signal produce by interferometry system 1426 when combining measurement beam 1454 reflected from stage 1422 and the reference beam reflected from lens housing 1406 indicates changes in the position of the stage relative to the radiation beam. Furthermore, in other embodiments the interferometry system 1426 can be positioned to measure changes in the position of reticle (or mask) stage 1416 or other movable components of the scanner system. Also, in other embodiments, the positions of interferometry system 1426 and plane mirror 1428 can be reversed, with the interferometry system on the movable stage and the plane mirror fixed to support structure. Finally, the interferometry systems can be used in a similar fashion with lithography systems involving steppers, in addition to, or rather than, scanners.

Figure 9B:
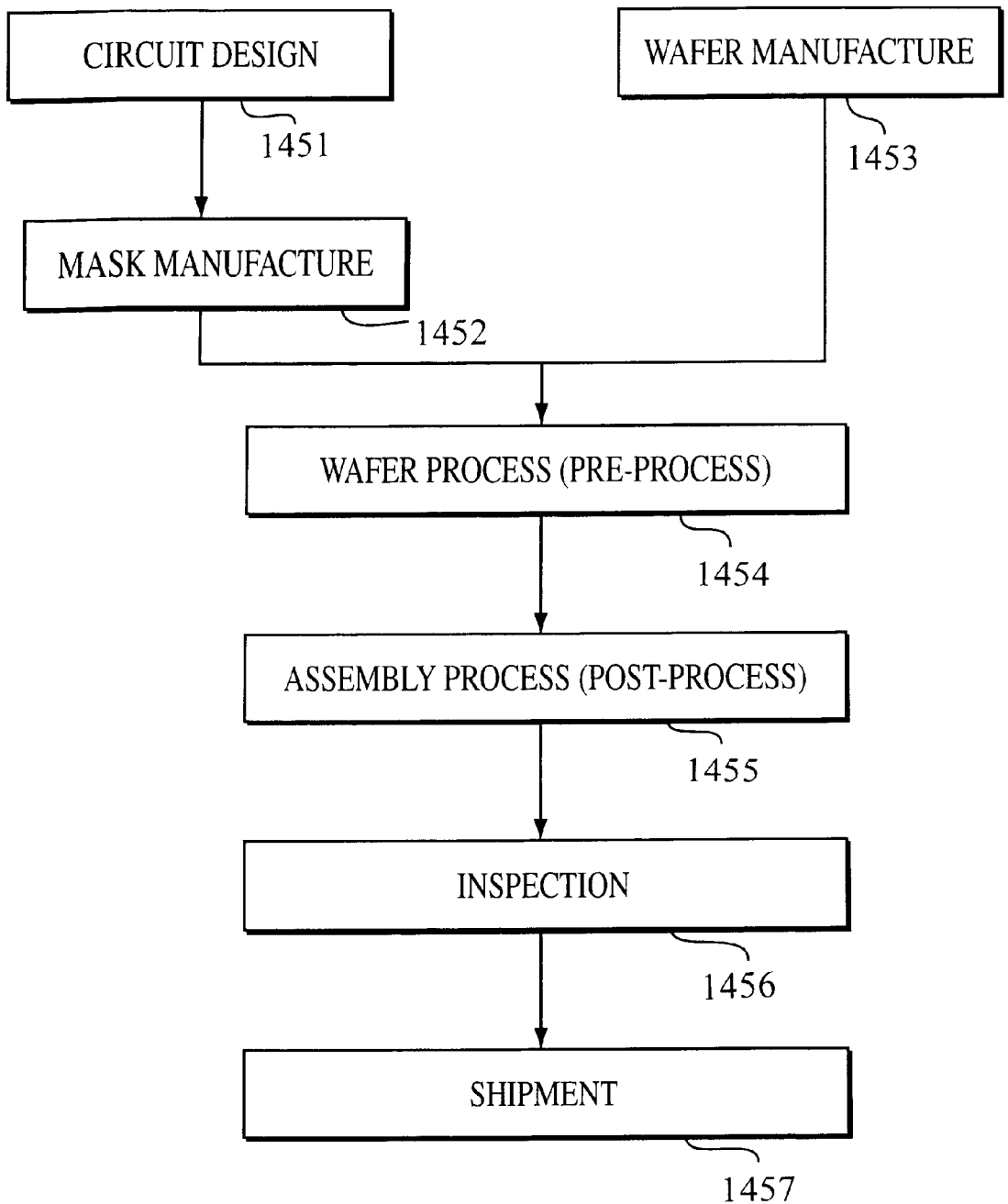

As is well known in the art, lithography is a critical part of manufacturing methods for making semiconducting devices. For example, U.S. Pat. No. 5,483,343 outlines steps for such manufacturing methods. These steps are described below with reference to FIGS. 9b and 9c. FIG. 9b is a flow chart of the sequence of manufacturing a semiconductor device such as a semiconductor chip (e.g. IC or LSI), a liquid crystal panel or a CCD. Step 1451 is a design process for designing the circuit of a semiconductor device. Step 1452 is a process for manufacturing a mask on the basis of the circuit pattern design. Step 1453 is a process for manufacturing a wafer by using a material such as silicon.

Step 1454 is a wafer process which is called a pre-process wherein, by using the sc prepared mask and wafer, circuits are formed on the wafer through lithography. Step 1455 is an assembling step, which is called a post-process wherein the wafer processed by step 1454 is formed into semiconductor chips. This step includes assembling (dicing and bonding) and packaging (chip sealing). Step 1456 is an inspection step wherein operability check, durability check and so on of the semiconductor devices produced by step 1455 are carried out. With these processes, semiconductor devices are finished and they are shipped (step 1457).

Figure 9C:
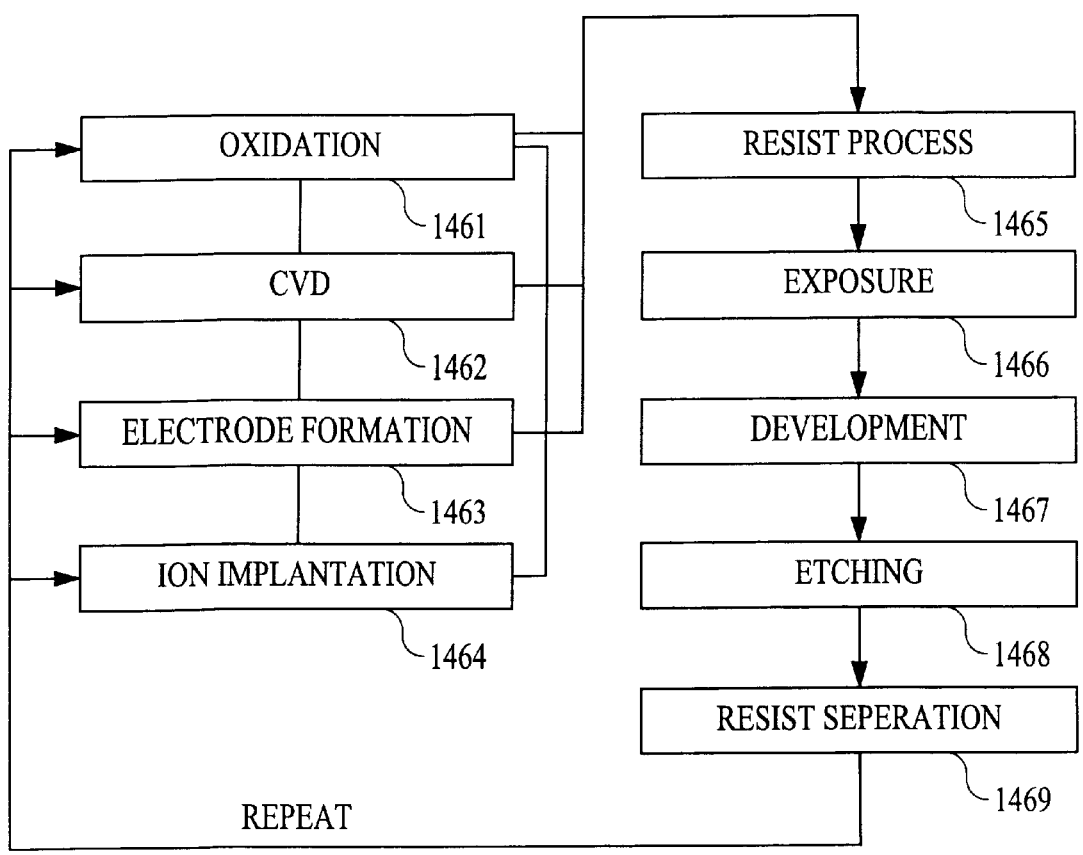

FIG. 9c is a flow chart showing details of the wafer process. Step 1461 is an oxidation process for oxidizing the surface of a wafer. Step 1462 is a CVD process for forming an insulating film on the wafer surface. Step 1463 is an electrode forming process for forming electrodes on the wafer by vapor deposition. Step 1464 is an ion implanting process for implanting ions to the wafer. Step 1465 is a resist process for applying a resist (photosensitive material) to the wafer. Step 1466 is an exposure process for printing, by exposure, the circuit pattern of the mask on the wafer through the exposure apparatus described above. Step 1467 is a developing process for developing the exposed wafer. Step 1468 is an etching process for removing portions other than the developed resist image. Step 1469 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 10:
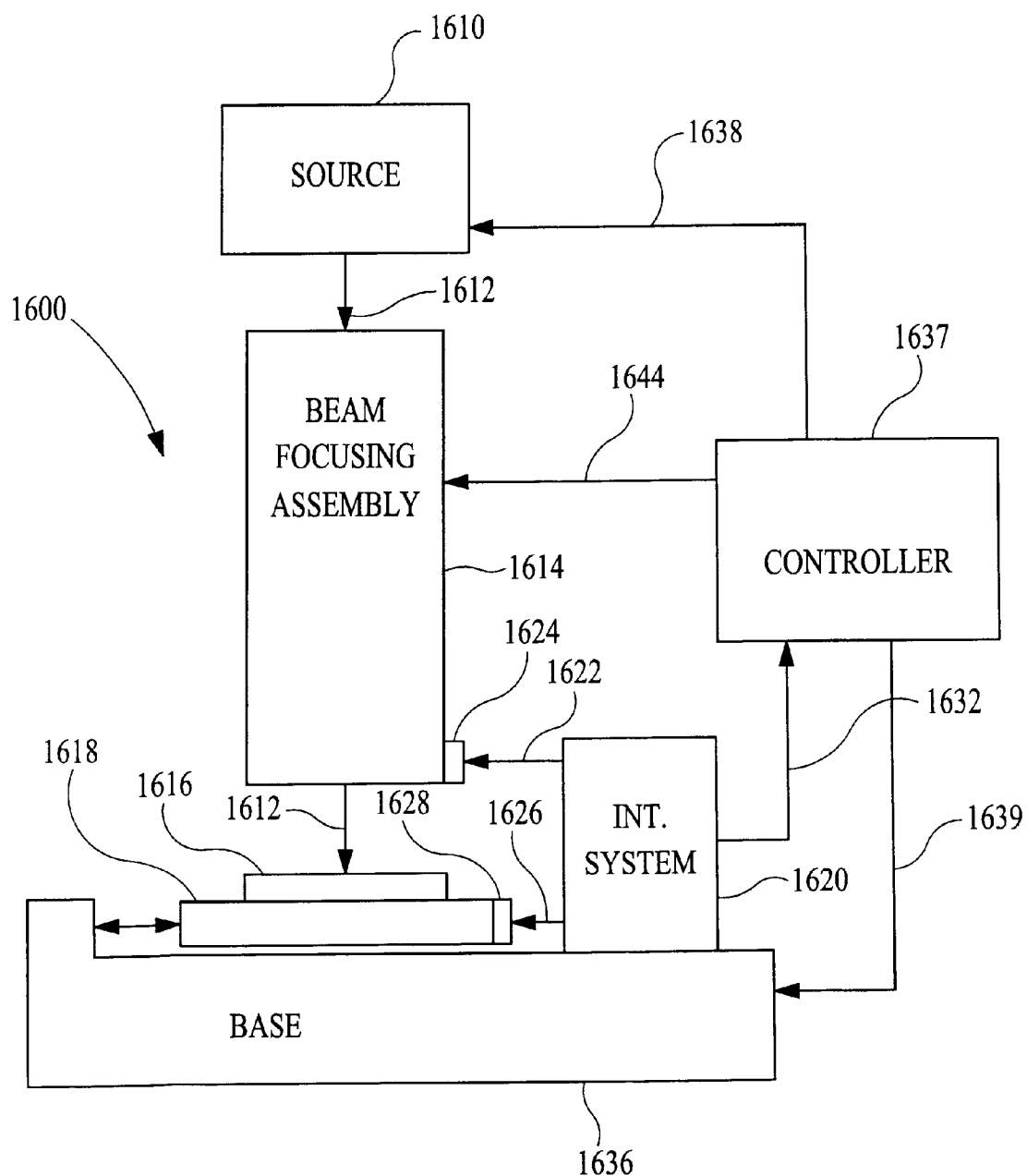
FIG. 10 is a schematic of a beam writing system employing the interferometry system.

As an example, a schematic of a beam writing system 1600 is shown in FIG. 10. A source 1610 generates a write beam 1612, and a beam focusing assembly 1614 directs the radiation beam to a substrate 1616 supported by a movable stage 1618. To determine the relative position of the stage, an interferometry system 1620 directs a reference beam 1622 to a mirror 1624 mounted on beam focusing assembly 1614 and a measurement beam 1626 to a mirror 1628 mounted on stage 1618. Interferometry system 1620 can be any of the interferometry systems described previously. Changes in the position measured by the interferometry system correspond to changes in the relative position of write beam 1612 on substrate 1616. Interferometry system 1620 sends a measurement signal 1632 to controller 1630 that is indicative of the relative position of write beam 1612 on substrate 1616. Controller 1630 sends an output signal 1634 to a base 1636 that supports and positions stage 1618. In addition, controller 1630 sends a signal 1638 to source 1610 to vary the intensity of, or block, write beam 1612 so that the write beam contacts the substrate with an intensity sufficient to cause photophysical or photochemical change only at selected positions of the substrate. Furthermore, in some embodiments, controller 1630 can cause beam focusing assembly 1614 to scan the write beam over a region of the substrate, e.g., using signal 1644. As a result, controller 1630 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrupole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

Other aspects, advantages, and modifications are within the scope of the following claims.

What is claimed is:

1. A method for correcting an angle $\theta_l$ indicative of a relative angular orientation of a measurement object for the effects of dispersion caused by gas along a measurement path contacting the measurement object, wherein the angle $\theta_l$ is measured interferometrically at a wavelength $\lambda_l$, the method comprising:

interferometrically measuring the angular orientation at a first wavelength $\lambda_q$ to give a first angle $\theta_q$ indicative of the angular orientation;

interferometrically measuring the angular orientation at a second wavelength $\lambda_u$ not equal to the first wavelength $\lambda_q$ to give a second angle $\theta_u$ indicative of the angular orientation;

correcting the angle $\theta_l$ by an additive factor $\Delta\theta_l = -\lceil(\theta_q - \theta_u)$, where $\lceil = (n_l-1)/(n_q-n_u)$ is the reciprocal dispersive power of the gas and $n_l$, $n_q$, and $n_u$ are the indices of refraction of the gas at wavelengths $\lambda_l$, $\lambda_q$, and $\lambda_u$, respectively.

2. The method of claim 1, wherein the angle $\theta_l$ is the first measured angle $\theta_q$ and $\lambda_l = \lambda_q$.

3. The method of claim 1, wherein the angle $\theta_l$ is the second measured angle $\theta_u$ and $\lambda_l = \lambda_u$.

4. The method of claim 1, wherein the angle $\theta_l$ is different from either the first measured angle $\theta_q$ or the second measured angle $\theta_u$, $\lambda_l \neq \lambda_q$, and $\lambda_l \neq \lambda_u$.

5. An inteferometry system for correcting an angle $\theta_l$ indicative of a relative angular orientation of a measurement object for the effects of dispersion caused by gas between the system and the object, the system comprising:

an interferometer which during operation directs at least one measurement beam at a first wavelength $\lambda_q$ to contact the measurement object to interferometrically determine a first angle $\theta_q$ indicative of the angular orientation and at least one measurement beam at a second wavelength $\lambda_u$ not equal to the first wavelength $\lambda_q$ to contact the measurement object to interferometrically determine a second angle $\theta_u$ indicative of the angular orientation; and a electronic processor for correcting the dispersion effects, wherein during operation processor corrects the angle $\theta_l$ by an additive factor $\Delta\theta_l = -\lceil(\theta_q - \theta_u)$, where $\lceil = (n_l-1)/(n_q-n_u)$ is the reciprocal dispersive power of the gas and $n_l$, $n_q$, and $n_u$ are the indices of refraction of the gas at wavelength $\lambda_l$, $\lambda_q$, and $\lambda_u$, respectively.

6. The system of claim 5, wherein the angle $\theta_l$ is the first measured angle $\theta_q$ and $\lambda_l = \lambda_q$.

7. The system of claim 5, wherein the angle $\theta_l$ is the second measured angle $\theta_u$ and $\lambda_l = \lambda_u$.

8. The system of claim 5, wherein the angle $\theta_l$ is different from either the first measured angle $\theta_q$ or the second measured angle $\theta_u$, $\lambda_l \neq \lambda_q$, and $\lambda_l \neq \lambda_u$.

9. A lithography system for use in fabricating integrated circuits on a wafer, the system comprising:

a stage for supporting the wafer;

an illumination system for imaging spatially patterned radiation onto the wafer;

a positioning system for adjusting the position of the stage relative to the image radiation; and the interferometry system of claim 5 for monitoring the position of the wafer relative to the imaged radiation.

10. A lithography system for use in fabricating integrated circuits on a wafer, the system comprising:

a stage for supporting the wafer; and an illumination system including a radiation source, a mask, a positioning system, a lens assembly, and the interferometry system of claim 5, wherein during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source.

11. A beam writing system for use in fabricating a lithography mask, the system comprising:

a source providing a write beam to pattern a substrate;

a stage supporting the substrate;

a beam directing assembly for delivering the write beam to the substrate;

a positioning system for positioning the stage and beam directing assembly relative one another; and the inteferometry system of claim 5 for monitoring the position of the stage relative to the beam directing assembly.

* * * * *

UNITED STATES PATENT AND TRADEMARK OFFICE
CERTIFICATE OF CORRECTION

PATENT NO. : 6,512,588 B1
DATED : January 28, 2003
INVENTOR(S) : Henry A. Hill

It is certified that error appears in the above-identified patent and that said Letters Patent is hereby corrected as shown below:

Title page,
Item [62], replace "Division of application No. 10/009,012,
filed as application No. PCT/US00/12097 on May 5, 2000" with -- Division of application No. 10/009,012, filed March 19, 2002, which is a national phase application of U.S. Serial No. PCT/US00/12097 on May 5, 2000, which claims priority from U.S. Serial No. 09/305,828, filed May 5, 1999 and U.S. Serial No. 09/384,851 filed August 27, 1999, now U.S. Patent No. 6,271,923. --

Item [57], ABSTRACT, before "(ii)" insert -- ; --.

Column 1,
Line 54, replace "Zvp/$\lambda$," with --2vp/$\lambda$ --.

Column 8,
Line 5, replace "object" with -- aspect --.
Line 49, after "=" delete -- ( --.
Line 56, replace "="with -- $\neq$ --.

Column 11,
Line 13, replace "comparing" with -- comprising --.
Line 32, replace "and" with -- are --.

Column 12,
Line 24, replace "interforometric" with -- interferometric --.

Column 13,
Line 38, replace "$\phi$" with -- $\varphi$ --.
Line 44, replace "$\phi$" with -- $\varphi$ -- (both occurrences).

Column 14,
Line 5, replace "$r$" with -- R --.
Line 22, replace "$S_2$" with -- $S_1$ -- (both occurrences).
Lines 27, 39, 48 and 60, replace "$\phi$" with -- $\varphi$ --.
Line 32, replace "$\phi_1$" with -- $\alpha_1$ --.
Line 54, replace the equation with $$--\varphi_1 = 2ka \frac{\tan\delta\theta_1}{1+\tan\delta\theta_1} \quad --$$

UNITED STATES PATENT AND TRADEMARK OFFICE
CERTIFICATE OF CORRECTION

PATENT NO. : 6,512,588 B1
DATED : January 28, 2003
INVENTOR(S) : Henry A. Hill

It is certified that error appears in the above-identified patent and that said Letters Patent is hereby corrected as shown below:

Column 16,
Line 7, replace "ϕ" with -- φ --.

Column 18,
Line 27, replace "is" with -- as --.

Column 19,
Lines 37 and 45, replace "ϕ" with -- φ -- (both occurrences).
Lines 43 and 44, replace "ϕ" with -- φ --.

Column 20,
Lines 20, 25, 40, 43, 46, 47, 48, 49 51 and 54, replace "ϕ" with -- φ -- (both occurrences).
Line 33, replace "A" with -- Λ --.
Line 37, replace "s" with -- as --.
Lines 52 and 53, replace "ϕ" with -- φ --.

Column 22,
Lines 35, 42 and 44, replace "ϕ" with -- φ --.
Line 43, replace "ϕ" with -- θ --.

Column 25,
Lines 9, 18 and 20, replace "ϕ" with -- φ --.

Column 26,
Lines 53, 62 and 63, replace "ϕ" with -- φ --.

Column 27,
Line 29, replace "ϕ" with -- φ --.

Column 28,
Lines 30, 39 and 41, replace "ϕ" with -- φ --.

Column 29,
Lines 53, 65 and 66, replace "ϕ" with -- φ -- (both occurrences).

UNITED STATES PATENT AND TRADEMARK OFFICE
CERTIFICATE OF CORRECTION

PATENT NO. : 6,512,588 B1
DATED : January 28, 2003
INVENTOR(S) : Henry A. Hill

It is certified that error appears in the above-identified patent and that said Letters Patent is hereby corrected as shown below:

Column 30,
Line 31, replace "ϕ" with -- φ -- (both occurrences).

Column 31,
Lines 43, 44 and 47, replace "ϕ" with -- φ -- (both occurrences).
Lines 30, 39, 40 and 42, replace "ϕ" with -- φ --.

Column 32,
Line 61, replace "ϕ" with -- φ --.

Column 33,
Line 3, replace "ϕ" with -- φ --.

Column 34,
Line 13, replace "ϕ" with -- φ --.
Lines 56 and 58, replace "δ" with -- ∂ -- (both occurrences).

Column 37,
Line 1, replace "displacement" with -- description --.
Line 3, replace "embodiment," with -- embodiment --.
Lines 41, 55, 57 and 58, replace "ϕ" with -- φ -- (both occurrences).
Lines 53 and 54, replace "ϕ" with -- φ --.

Column 38,
Line 7, replace replace "δ" with -- ∂ -- (both occurrences).
Line 35, replace "eight" with -- eighth --.
Line 42, replace "interferomter" with -- interferometer --.

Column 40,
Line 2, replace "serviced" with -- servoed --.
Line 43, "t-axes" with -- z-axes --.

Column 41,
Line 22, replace "polarizaiotn" with -- polarization --.

Column 42,
Line 61, replace "nest" with -- next --.

UNITED STATES PATENT AND TRADEMARK OFFICE
CERTIFICATE OF CORRECTION

PATENT NO.    : 6,512,588 B1
DATED         : January 28, 2003
INVENTOR(S)   : Henry A. Hill It is certified that error appears in the above-identified patent and that said Letters Patent is hereby corrected as shown below:

Column 43,
Lines 2, 3, 5, 26, 42 and 50, replace "ϕ" with -- φ -- (both occurrences).
Line 4, replace "pathes" with -- paths --.
Lines 44-45, after "embodiments" insert -- , --.

Column 44,
Lines 3, 6, 9, 16, 18, 19, 65 and 67, replace "ϕ" with -- φ --.
Line 15, "Abbe" with -- Abbé --.
Line 29 and 45, replace "ϕ" with -- φ -- (both occurrences).
Line 32, replace "Abbéoffsets with -- Abbé offsets --.
Line 43, replace "682B" with -- 682H --.

Column 45,
Lines 2 and 63, replace "ϕ" with -- φ --.
Line 9, replace "Abbéoffsets with -- Abbé offsets --.
Line 24, replace "FIGS" with -- FIGS. --.
Line 35, replace "ϕ" with -- φ -- (both occurrences).
Line 43, replace "ϕ" with -- φ -- (all occurrences).

Column 46,
Lines 8, 9, 13 and 14, replace "ϕ" with -- φ --.
Line 10, replace "ϕ" with -- φ -- (both occurrences).
Line 40, replace "q±u" with -- q≠u --.
Line 56, replace "25)" with -- (25) --.

Column 47,
Lines 54 and 60, replace "$o.101$" with -- $o$, 101 --.
Lines 55 and 60, replace "$o.102$" with -- $o$, 102 --.
Line 55, replace "$o.101$" with -- $o$, 101 -- (both occurrences).

UNITED STATES PATENT AND TRADEMARK OFFICE
CERTIFICATE OF CORRECTION

PATENT NO. : 6,512,588 B1
DATED : January 28, 2003
INVENTOR(S) : Henry A. Hill

It is certified that error appears in the above-identified patent and that said Letters Patent is hereby corrected as shown below:

Column 48,
Line 6, replace "ϕ" with -- φ --.
Lines 11 and 17, replace "$h.101$" with -- $h$, 101 --.
Lines 18, 19, 30, 54, 60 and 64, replace "101.102" with -- 101, 102 --.
Lines 32 and 39, replace "$h.101$" with -- $h$, 101 --.
Line 36, 42, 60, 62, 64 and 67, replace "$o.101$" with -- $o$, 101--.
Lines 36, 42, 60, 62, 64 and 67, replace "$o.102$" with -- $o$, 102 --.
Line 41, 59, 60, 62 and 64, replace "ϕ" with -- φ --.
Line 47, replace "$o.102$" with -- $o$, 102 -- (both occurrences).
Line 47, replace "$o.101$" with -- $o$, 101 -- (both occurrences).
Line 54, replace "103" with -- 102 --.
Line 58, replace "101" with -- 102 --.
Line 59, replace "100" with -- 102 --.

Column 49,
Lines 22, 23, 47, 50 and 52, replace "ϕ" with -- φ --.
Lines 22, 23, 47, 50 and 52, replace "101.102" with -- 101, 102 --.
Line 36, replace "prism" with -- prisms --.
Lines 48 and 49, replace "$o.101$" with -- $o$, 101 --.
Lines 49 and 51, replace "$o.102$" with -- $o$, 102 --

Column 50,
Line 28, replace "$h.101$" with -- $h$, 101 --.
Line 34, replace "$o.105$" with -- $o$, 105 -- (both occurrences).
Line 35, 53 and 54, replace "$o.105$" with -- $o$, 105--.
Line 35, replace "÷" with -- + --.
Line 35, replace "$i.105$" with -- $i$, 105 --.
Lines 38, 41 and 43, replace "$h.105$" with -- $h$, 105--.
Line 43, replace "integer" replace "," with -- . --.

UNITED STATES PATENT AND TRADEMARK OFFICE
CERTIFICATE OF CORRECTION

PATENT NO.    : 6,512,588 B1
DATED         : January 28, 2003
INVENTOR(S)   : Henry A. Hill It is certified that error appears in the above-identified patent and that said Letters Patent is hereby corrected as shown below:

Column 51,
Line 5, replace "$I_{h.101}$" with -- "$I_{h, 105}$ --.
Line 10, replace "$I_{h.105}$" with -- "$I_{h, 105}$ --.
Line 14, replace" $(p_{106})_0$" with -- $(p_{105})_0$ -- (both occurrences).
Line 15, replace" $(p_{106})_0 = 0$" with -- $(p_{105})_0 = 0$ --.
Line 18, replace" $(_{106})_0$" with -- $(p_{106})_0$ --.
Line 23, before "tan" replace "2" with -- 6 --.
Lines 23, 24 and 25, replace "$o.105$" with -- $o, 105$ --.
Line 38, replace "$h.105$" with -- $o, 105$ --.
Line 29, replace "if" with -- of --.
Line 40, replace "106" with -- 105 -- (both occurrences).
Line 66, replace "optical" with -- optic --.

Column 52,
Line 7, replace "106" with -- 105 --.
Line 8, replace "106" with -- 105 -- (both occurrences).
Line 25, 26, 28 and 43, replace "106" with -- 105 --.
Line 35, replace "know" with -- known --.
Line 45, replace "$(P_{105})=0$" with -- "$(P_{105})_0=0$ --.

Column 53,
Line 33, replace "$S_9$" with -- $S_8$ --.
Line 49, replace "=1.2K" with -- 1,2,K --.

Column 56,
Line 32, replace "system" with -- systems --.

Column 57,
Line 58, replace "sc" with -- so --.

Column 59,
Lines 23-24, replace the equation with -- $\Delta\theta_l = -\Gamma(\theta_q - \theta_u)$, --.
Line 23, replace "⌈" with -- $\Gamma$ --.
Line 34, replace "=" with -- $\neq$ -- (both occurrences).

UNITED STATES PATENT AND TRADEMARK OFFICE
CERTIFICATE OF CORRECTION

PATENT NO.    : 6,512,588 B1
DATED         : January 28, 2003
INVENTOR(S)   : Henry A. Hill It is certified that error appears in the above-identified patent and that said Letters Patent is hereby corrected as shown below:

Column 60,
Lines 1 and 2, replace "⌈" with -- Γ --.

Line 4, replace "wavelength" with -- wavelengths --.
Line 20, replace "image" with -- imaged --.

Signed and Sealed this

Nineteenth Day of August, 2003

JAMES E. ROGAN
*Director of the United States Patent and Trademark Office*